United States Patent
Park et al.

(10) Patent No.: US 12,538,702 B2
(45) Date of Patent: Jan. 27, 2026

(54) CONDENSED CYCLIC COMPOUND AND ORGANIC ELECTROLUMINESCENCE DEVICE INCLUDING THE SAME

(71) Applicant: Samsung Display Co., Ltd., Yongin-si (KR)

(72) Inventors: Junha Park, Gwacheon-si (KR); Mun-ki Sim, Seoul (KR); Hyoyoung Lee, Suwon-si (KR); Eunjae Jeong, Hwaseong-si (KR); Youngkook Kim, Suwon-si (KR); Seokhwan Hwang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 731 days.

(21) Appl. No.: 15/840,986

(22) Filed: Dec. 13, 2017

(65) Prior Publication Data

US 2018/0166639 A1    Jun. 14, 2018

(30) Foreign Application Priority Data

Dec. 13, 2016   (KR) .......................... 10-2016-0169778

(51) Int. Cl.
*H10K 85/60* (2023.01)
*C07F 9/572* (2006.01)
(Continued)

(52) U.S. Cl.
CPC ......... *H10K 85/654* (2023.02); *C07F 9/5728* (2013.01); *C07F 9/5765* (2013.01);
(Continued)

(58) Field of Classification Search
CPC ........... C07F 9/5325; C09K 2211/1014; H01L 51/0058; H01L 51/0056; H01L 51/0052;
(Continued)

(56) References Cited

U.S. PATENT DOCUMENTS

| 5,645,948 A | 7/1997 | Shi et al. |
| 2004/0053069 A1 | 3/2004 | Sotoyama et al. |

(Continued)

FOREIGN PATENT DOCUMENTS

| CN | 1922929 | 2/2007 |
| CN | 107090003 | * 8/2017 |

(Continued)

OTHER PUBLICATIONS

Machine Translation of WO2017116156 (Year: 2017).*

(Continued)

*Primary Examiner* — Jenna N Chandhok
(74) *Attorney, Agent, or Firm* — Lerner David LLP

(57) ABSTRACT

A condensed cyclic compound which improves emission life and efficiency and an organic electroluminescence device is provided. The condensed cyclic compound according to the inventive concept is represented by the following

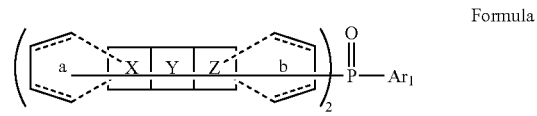

Formula where each of X, Y and Z is independently a substituted or unsubstituted pentagonal hydrocarbon ring, a substituted or unsubstituted hexagonal hydrocarbon ring, a substituted or unsubstituted pentagonal heterocycle, or a substituted or unsubstituted hexagonal heterocycle, the pentagonal heterocycle and the hexagonal heterocycle each independently includes one heteroatom, each of a and b is independently 0 or 1, and $Ar_1$ is a (Continued)

substituted or unsubstituted aryl group having 6 to 30 carbon atoms for forming a ring.

12 Claims, 1 Drawing Sheet

(51) Int. Cl.

| | | |
|---|---|---|
| *C07F 9/576* | (2006.01) | |
| *C07F 9/58* | (2006.01) | |
| *C07F 9/655* | (2006.01) | |
| *H10K 50/12* | (2023.01) | |
| *H10K 50/15* | (2023.01) | |
| *H10K 50/16* | (2023.01) | |
| *H10K 50/17* | (2023.01) | |
| *H10K 50/18* | (2023.01) | |

(52) U.S. Cl.
CPC ............ *C07F 9/58* (2013.01); *C07F 9/65517* (2013.01); *H10K 85/626* (2023.02); *H10K 85/6572* (2023.02); *H10K 85/6574* (2023.02); *H10K 50/12* (2023.02); *H10K 50/15* (2023.02); *H10K 50/16* (2023.02); *H10K 50/171* (2023.02); *H10K 50/18* (2023.02)

(58) Field of Classification Search
CPC ............. H10K 85/6574; H10K 85/626; H10K 85/654; H10K 85/6572; H10K 85/615; H10K 85/624; H10K 85/6576
See application file for complete search history.

(56) References Cited

U.S. PATENT DOCUMENTS

| | | | | |
|---|---|---|---|---|
| 2007/0164273 | A1 | 7/2007 | Gerhard et al. | |
| 2007/0170419 | A1* | 7/2007 | Gerhard | H01L 51/0058 257/40 |
| 2012/0068168 | A1* | 3/2012 | Lee | H10K 85/6572 548/414 |
| 2015/0034927 | A1 | 2/2015 | Nakano et al. | |
| 2015/0221874 | A1* | 8/2015 | Kim | H01L 51/0072 257/40 |
| 2016/0013427 | A1 | 1/2016 | Kim et al. | |
| 2016/0087224 | A1* | 3/2016 | Kim | H10K 85/6572 257/40 |
| 2016/0343950 | A1* | 11/2016 | Kawamura | C07F 9/5325 |
| 2017/0012209 | A1* | 1/2017 | Kawamura | H01L 51/0054 |
| 2018/0053900 | A1* | 2/2018 | Eum | C07D 239/26 |
| 2018/0170914 | A1* | 6/2018 | Miyata | C07D 265/38 |
| 2018/0375032 | A1* | 12/2018 | Watanabe | C07F 9/6521 |

FOREIGN PATENT DOCUMENTS

| | | | | |
|---|---|---|---|---|
| DE | 102004008304 | A1 | 9/2005 | |
| JP | 3755196 | B2 | 3/2006 | |
| JP | 3834954 | B2 | 10/2006 | |
| JP | 4060669 | B2 | 3/2008 | |
| JP | 4876333 | B2 | 2/2012 | |
| KR | 10-0525408 | B1 | 10/2005 | |
| KR | 10-1027582 | B1 | 3/2011 | |
| KR | 10-2011-0105664 | A | 9/2011 | |
| KR | 10-2016-0007967 | A | 1/2016 | |
| KR | 1020160053048 | A | 5/2016 | |
| KR | 10-2016-0124623 | A | 10/2016 | |
| KR | 20160124623 | A * | 10/2016 | ........... C07D 401/10 |
| WO | WO-2009069442 | A1 * | 6/2009 | ........... C07D 213/53 |
| WO | 2015/115532 | A1 | 8/2015 | |
| WO | WO-2017116156 | A1 * | 7/2017 | ............... C07F 9/28 |

OTHER PUBLICATIONS

Kim, Munggon et al. "Synthesis of 2- and 4-Substituted Carbazole Derivatives and Correlation of Substitution Position with Photophysical Properties and Device Performance of Host Materials." Organic Electronics. 14 (2013): 67-73. (Year: 2013).*

Cui, Lin-Song et al. "Bipolar Host Materials for High Efficiency Phosphorescent Organic Light Emitting Diodes: Tuning the HOMO/LUMO Levels Without Reducign the Triplet Energy in a Linear System." Journal of Materials Chemistry C. 1 (2013): 8177-8185 (Year: 2013).*

Machine Translation of CN107090003 (Year: 2017).*

Machine Translation of WO2009069442 (Year: 2009).*

Jeong, Sook Hee et al. "Dibenzofuran Derivative as High Triplet Energy Host Material for High Efficiency In Deep Blue Phosphorescent Organic Light-Emitting Diodes." Organic Electronics. 13 (2012): 1141-1145. (Year: 2012).*

Machine Translation of KR20160124623A (Year: 2016).*

CW Tang, "Organic Electroluminescent Diodes", Applied Physics Letters vol. 51 No. 12, Sep. 21, 1987, pp. 913-915, Research Laboratories, Corporate Research Group, Eastman Kodak Company, Rochester New York.

Chihaya Adachi, "Confinement of Charge Carriers and Molecular Excitons within 5-nm-thick Emitter Layer in Organic Electroluminescent Devices with a Double Heterostructure", Applied Physics Letters vol. 57 No. 6, Aug. 6, 1990. pp. 913-915.

Youichi Sakamoto, "Synthesis, Characterization, and Electron-Transport Property of Perfluorinated Phenylene Dendrimers", Journal of American Chemical Society vol. 122 No. 8, Feb. 15, 2000, pp. 1832-1833, American Chemical Society Web.

Y.T. Tao, "Sharp green electroluminescence from 1H-pyrazolo[3,4-b]quinoline-based light-emitting diodes", Applied Physics Letters vol. 77 No. 11, Sep. 11, 2000, pp. 1575-1577, 2000 American Institute of Physics.

Nicklas Johansson, "Solid-State Amplified Spontaneous Emission in Some Spiro-Type Molecules: A New Concept for the Design of Solid-State Lasing Molecules", Advanced Materials vol. 10 No. 14, May 20, 1998, pp. 1136-1141, Wiley-VCH Verlag GmbH, D-69469 Weinheim 1998.

Shigehiro Yamaguchi, "Diphenylamino-Substituted 2.5-Diarylsiloles for Single-Layer Organic Electroluminescent Devices", Chemistry Letters 2001, Nov. 10, 2000, pp. 98-99, The Chemical Society of Japan 2001.

Sook Hee Jeong, "Dibenzofuran derivative as high triplet energy host material for high efficiency in deep blue phosphorescent organic light-emitting diodes", Organic Electronics 13 (2012), www.elsevier.com/locate/orgel, Apr. 6, 2012, pp. 1141-1145, 2012 Elsevier B.V.

Mounggon Kim, "Synthesis of 2- and 4-substituted carbazole derivatives and correlation of substitution position with photophysical properties and device performances of host materials", Organic Electronics 14 (2013), www.elsevier.com/locate/orgel, Nov. 1, 2012, pp. 67-73, 2012 Elsevier B.V.

* cited by examiner

CONDENSED CYCLIC COMPOUND AND ORGANIC ELECTROLUMINESCENCE DEVICE INCLUDING THE SAME

CROSS-REFERENCE TO RELATED APPLICATIONS

This U.S. non-provisional patent application claims priority under 35 U.S.C. § 119 of Korean Patent Application No. 10-2016-0169778, filed on Dec. 13, 2016, the entire content of which are hereby incorporated by reference.

BACKGROUND

The present disclosure herein relates to a condensed cyclic compound and an organic electroluminescence device including the same.

Recently, the development of an organic electroluminescence display device as an image display device is being actively conducted. Different from a liquid crystal display device, the organic electroluminescence display device is so-called a self-luminescent display device in which holes and electrons injected from a first electrode and a second electrode recombine in an emission layer, and a luminescent material including an organic compound in the emission layer emits light to attain display.

As an organic electroluminescence device, an organic electroluminescence device including, for example, a first electrode, a hole transport layer disposed on the first electrode, an emission layer disposed on the hole transport layer, an electron transport layer disposed on the emission layer, and a second electrode disposed on the electron transport layer is known. Holes are injected from the first electrode, and the injected holes move via the hole transport layer and are injected to the emission layer. Meanwhile, electrons are injected from the second electrode, and the injected electrons move via the electron transport layer and are injected to the emission layer. The holes and electrons injected to the emission layer recombine to generate excitons in the emission layer. The organic electroluminescence device emits light using light generated by the radiation deactivation of the excitons. In addition, the organic electroluminescence device is not limited to the above-described configuration, but various modifications may be possible.

In the application of an organic electroluminescence device to a display device, it is desirable to decrease the driving voltage and increase the emission efficiency and shelf life of the organic electroluminescence device. Thus, continuous effort is made to develop materials for an organic electroluminescence device capable of attaining these desired qualities.

SUMMARY

The present disclosure provides a condensed cyclic compound for an organic electroluminescence device having long life and high efficiency.

The present disclosure also provides an organic electroluminescence device having long life and high efficiency.

An embodiment of the inventive concept provides a condensed cyclic compound represented by the following Formula 1.

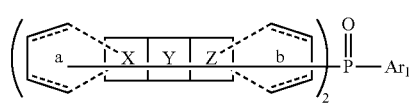

[Formula 1]

where X, Y and Z are each independently a substituted or unsubstituted pentagonal hydrocarbon ring, a substituted or unsubstituted hexagonal hydrocarbon ring, a substituted or unsubstituted pentagonal heterocycle, or a substituted or unsubstituted hexagonal heterocycle, the pentagonal heterocycle and the hexagonal heterocycle each independently includes one heteroatom, a and b are each independently 0 or 1, and $Ar_1$ is a substituted or unsubstituted aryl group having 6 to 30 carbon atoms for forming a ring.

In an embodiment, Y may be the substituted or unsubstituted pentagonal hydrocarbon ring, or the substituted or unsubstituted pentagonal heterocycle.

In an embodiment, Formula 1 may be represented by the following Formula 2.

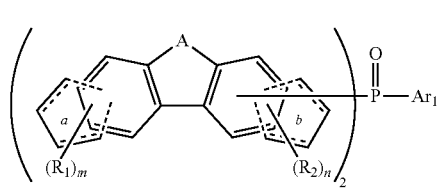

[Formula 2]

where A is one of CRR', NR", O or S, R, R' and R" are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or combine with an adjacent group to form a ring, $R_1$ and $R_2$ are each independently a hydrogen atom, a deuterium atom, a halogen atom, a nitro group, a cyano group, a substituted or unsubstituted silyl group, a substituted or unsubstituted boron group, a substituted or unsubstituted alkyl group having 1 to 50 carbon atoms, a substituted or unsubstituted alkenyl group having 2 to 20 carbon atoms, a substituted or unsubstituted arylamine group, a substituted or unsubstituted aryl group having 6 to 40 carbon atoms for forming a ring, a substituted or unsubstituted heterocycle having 3 to 40 carbon atoms for forming a ring, or a substituted or unsubstituted condensed polycyclic group having 6 to 60 carbon atoms for forming a ring, m and n are each independently an integer of 0 to 4, and a, b and $Ar_1$ are the same as defined in Formula 1.

In an embodiment, Formula 2 may be represented by the following Formula 3.

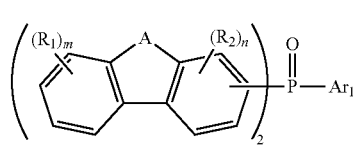

[Formula 3]

where A, $R_1$, $R_2$, m, n and $Ar_1$ are the same as defined in Formula 1 and Formula 2.

In an embodiment, Formula 3 may be represented by the following Formula 3-1.

[Formula 3-1]

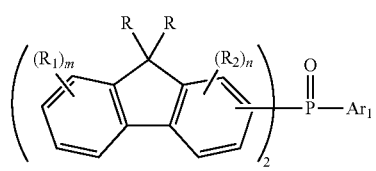

where R, R', $R_1$, $R_2$, m, n and $Ar_1$ are the same as defined in Formula 1 and Formula 2.

In an embodiment, Formula 2 may be represented by the following Formula 4.

[Formula 4]

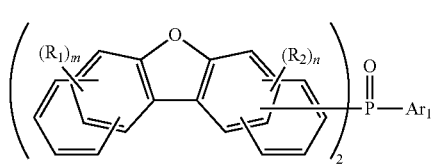

where $R_1$, $R_2$, m, n and $Ar_1$ are the same as defined in Formula 1 and Formula 2.

In an embodiment, Formula 4 may be represented by the following Formula 4-1 or Formula 4-2.

[Formula 4-1]

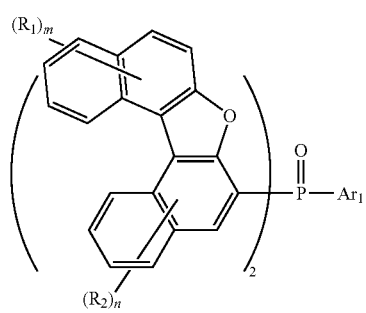

[Formula 4-2]

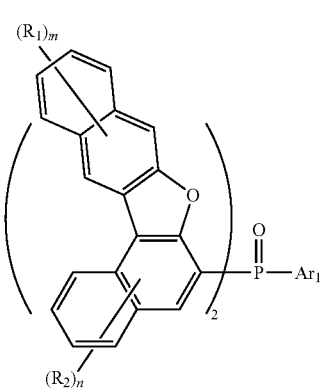

where $R_1$, $R_2$, m, n and $Ar_1$ are the same as defined in Formula 1 and Formula 2.

In an embodiment, the condensed cyclic compound represented by Formula 3 may be one selected from compounds represented in the following Compound Group 1.

[Compound Group 1]

1

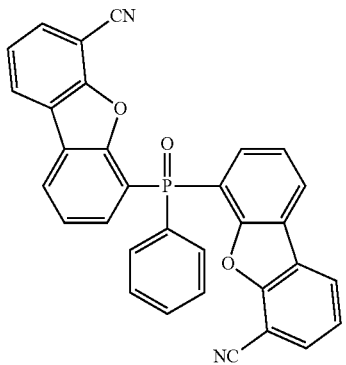

2

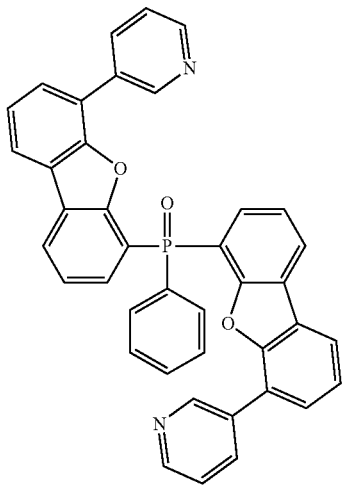

3

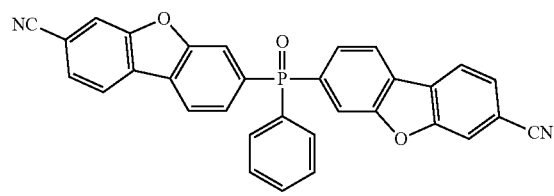

4

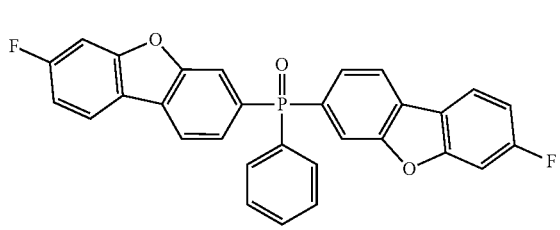

5

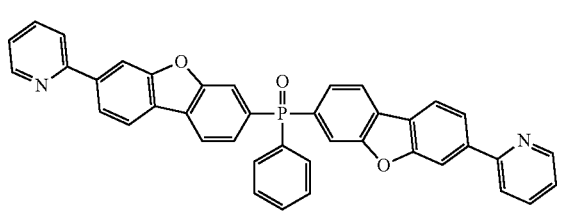

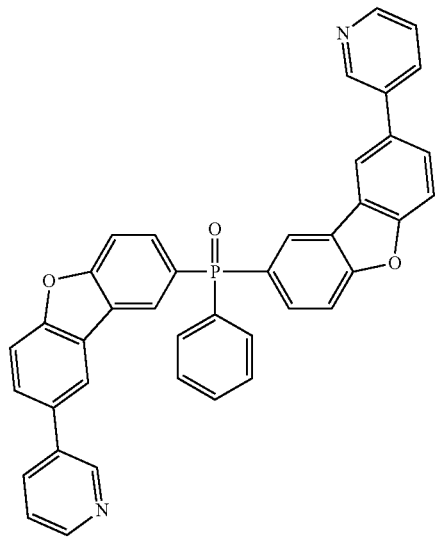
6
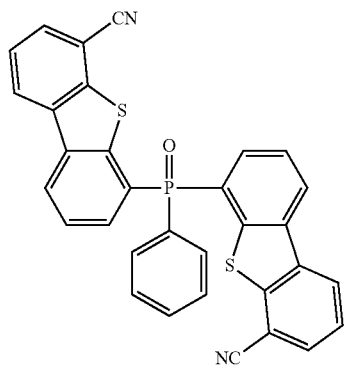
9
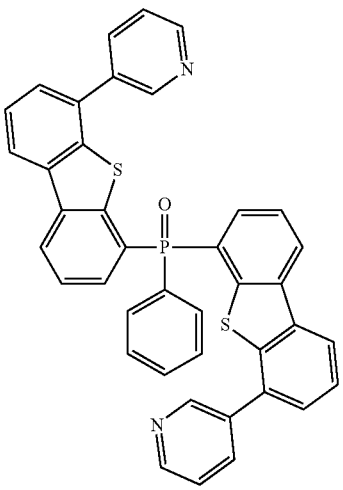
10
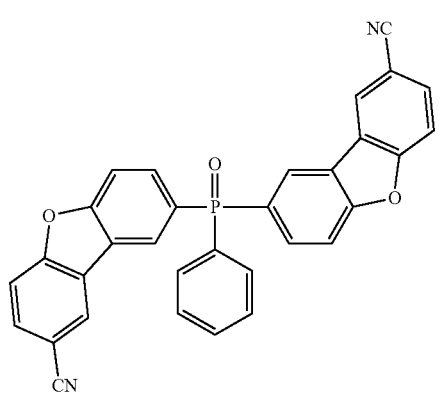
7
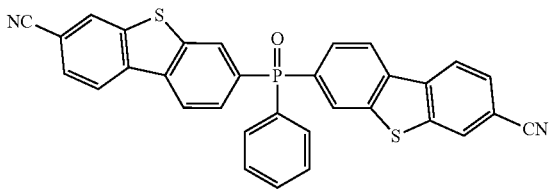
11
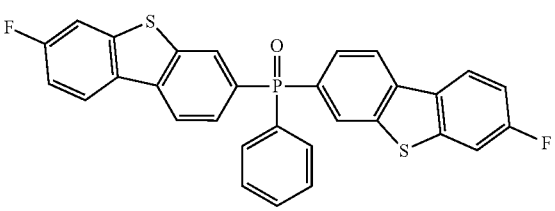
12
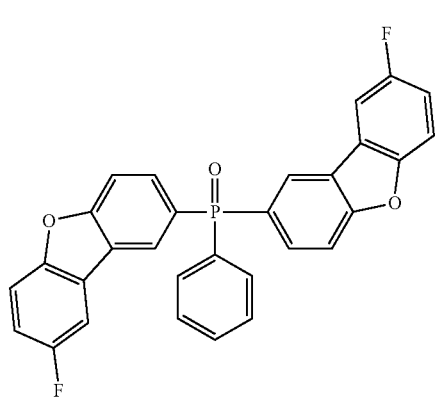
8
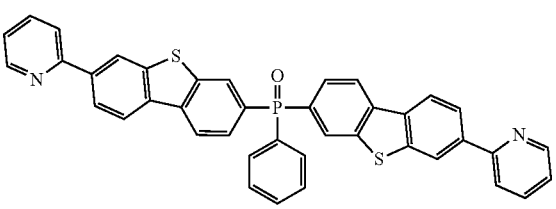
13

14
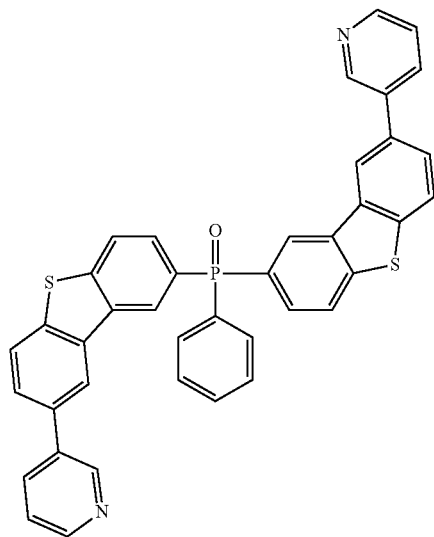
15
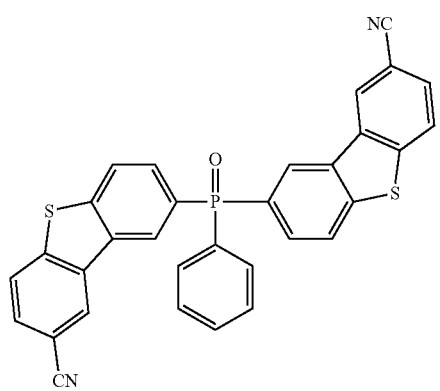
16
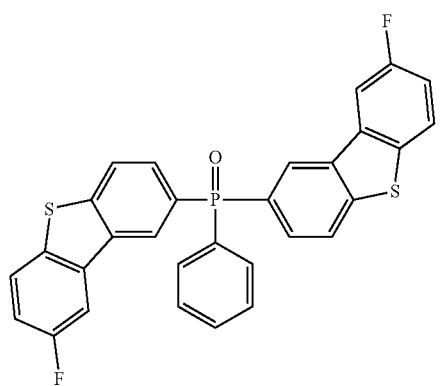
17
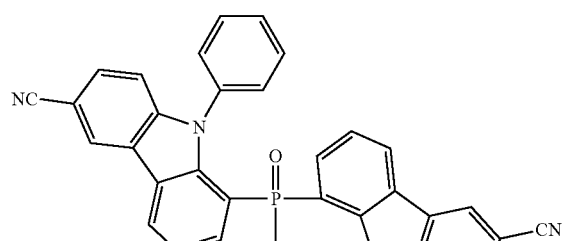
18
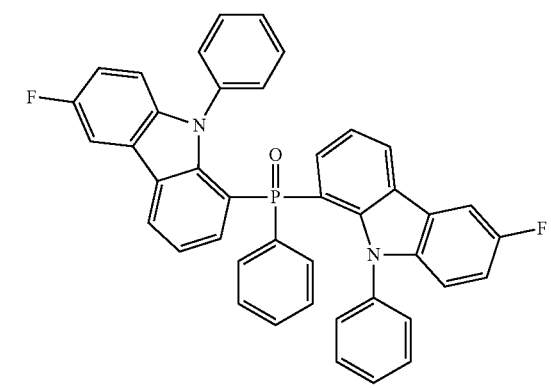
19
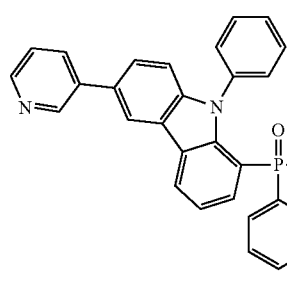
20
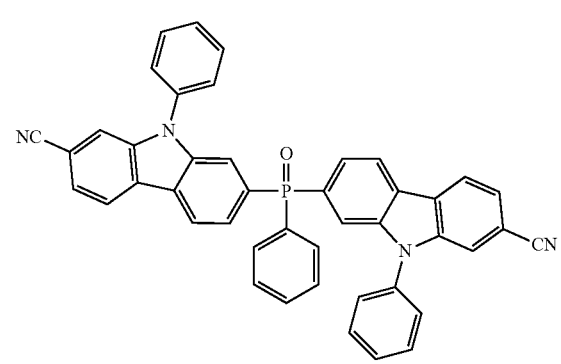

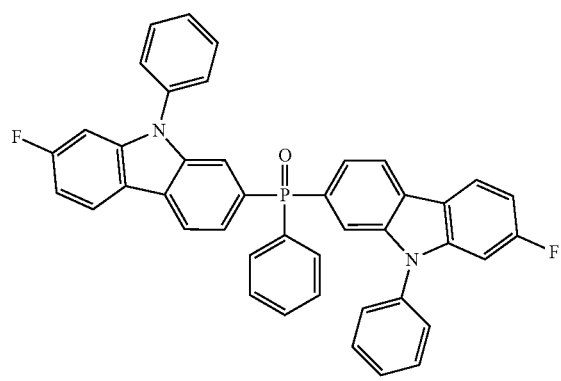
21
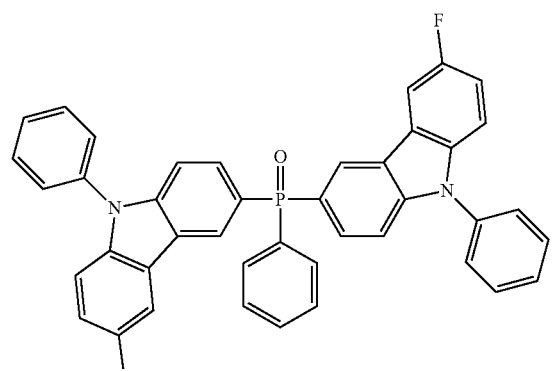
25
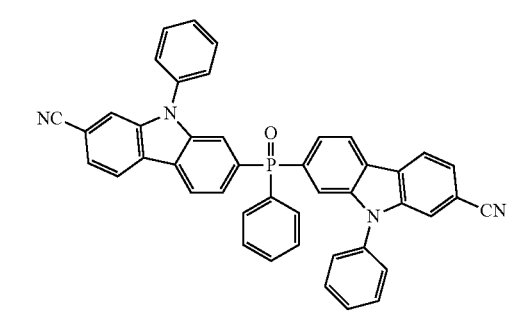
22
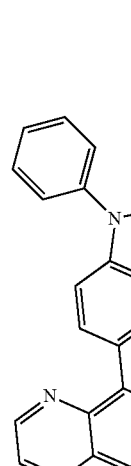
23
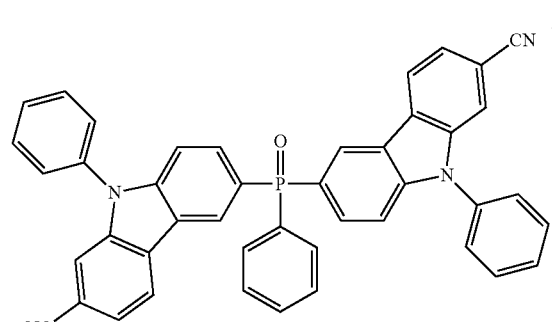
26
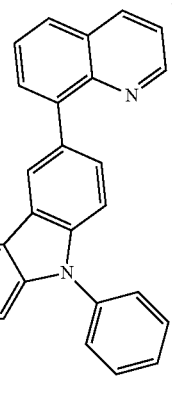
27
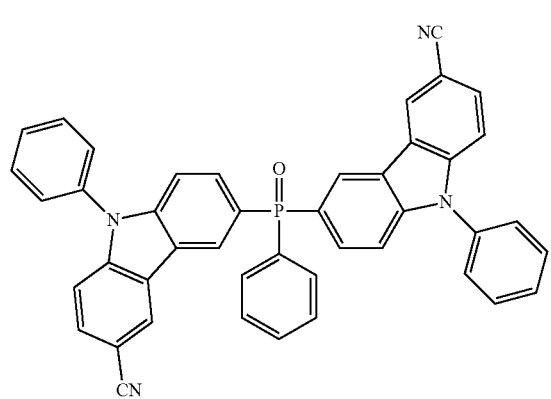
24
28

-continued
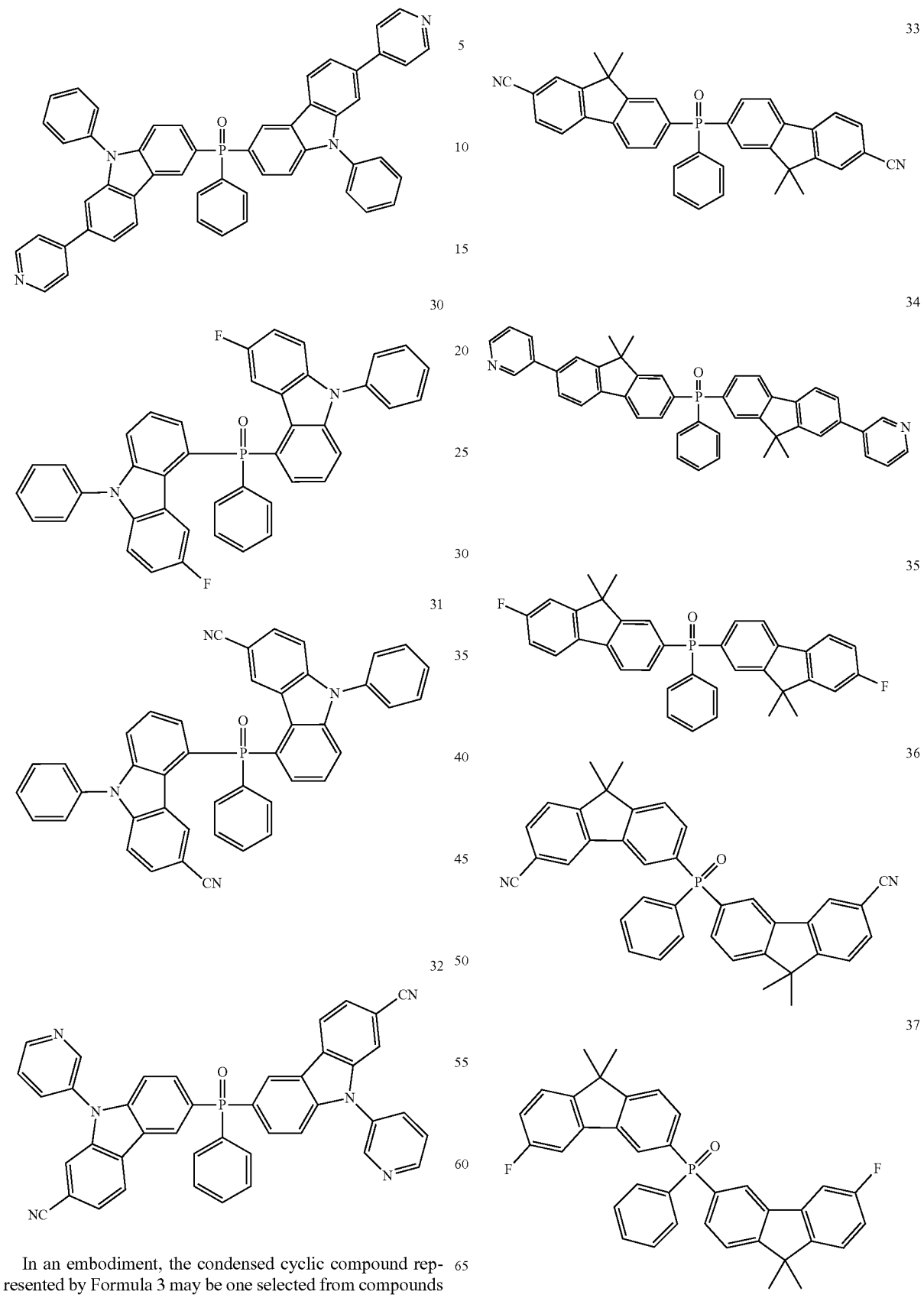
[Compound Group 2]
In an embodiment, the condensed cyclic compound represented by Formula 3 may be one selected from compounds represented in the following Compound Group 2.

38
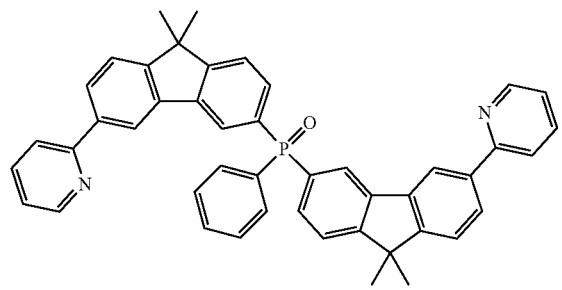
39
40
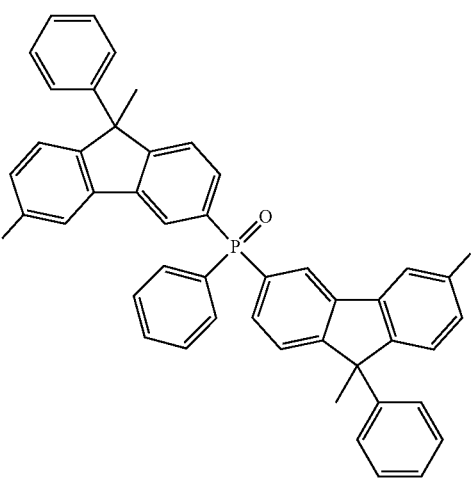
41
42
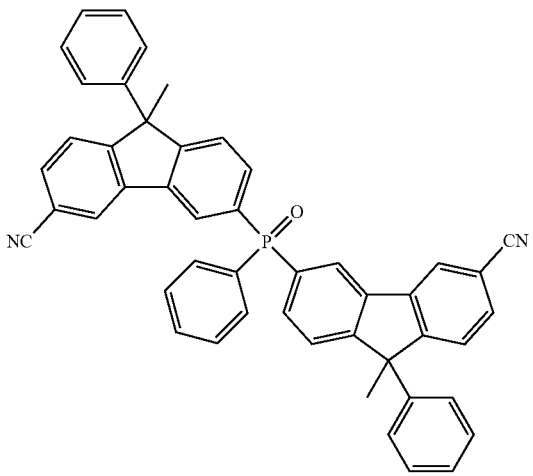
43
44
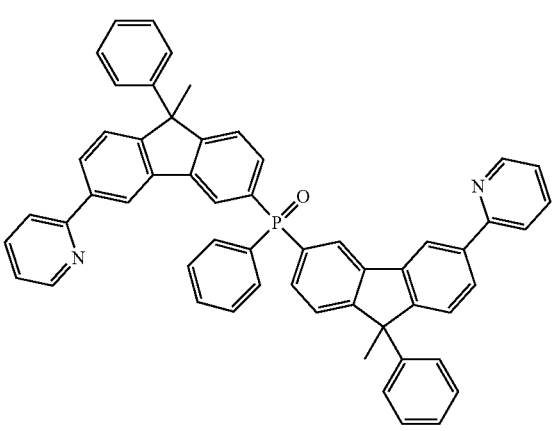

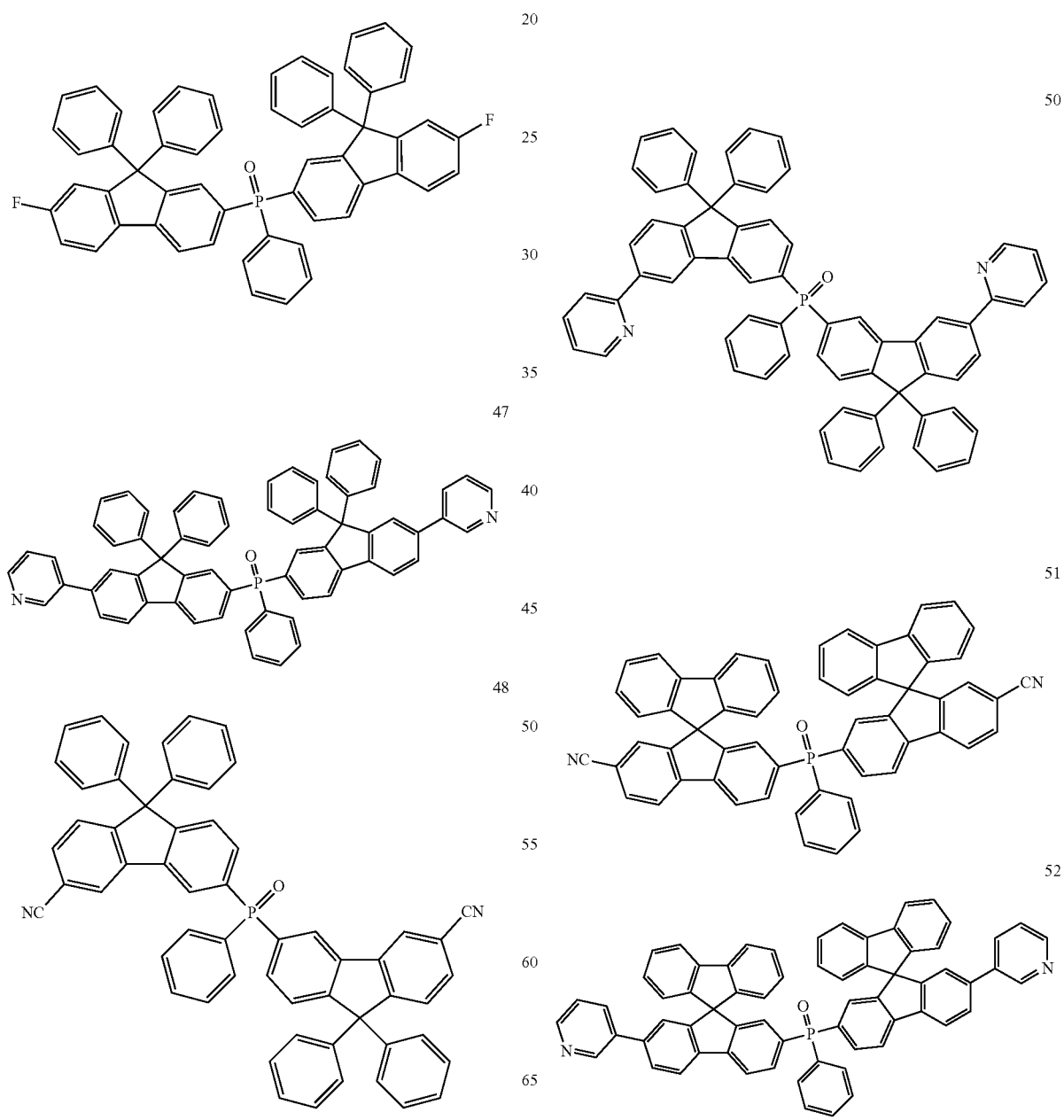

-continued
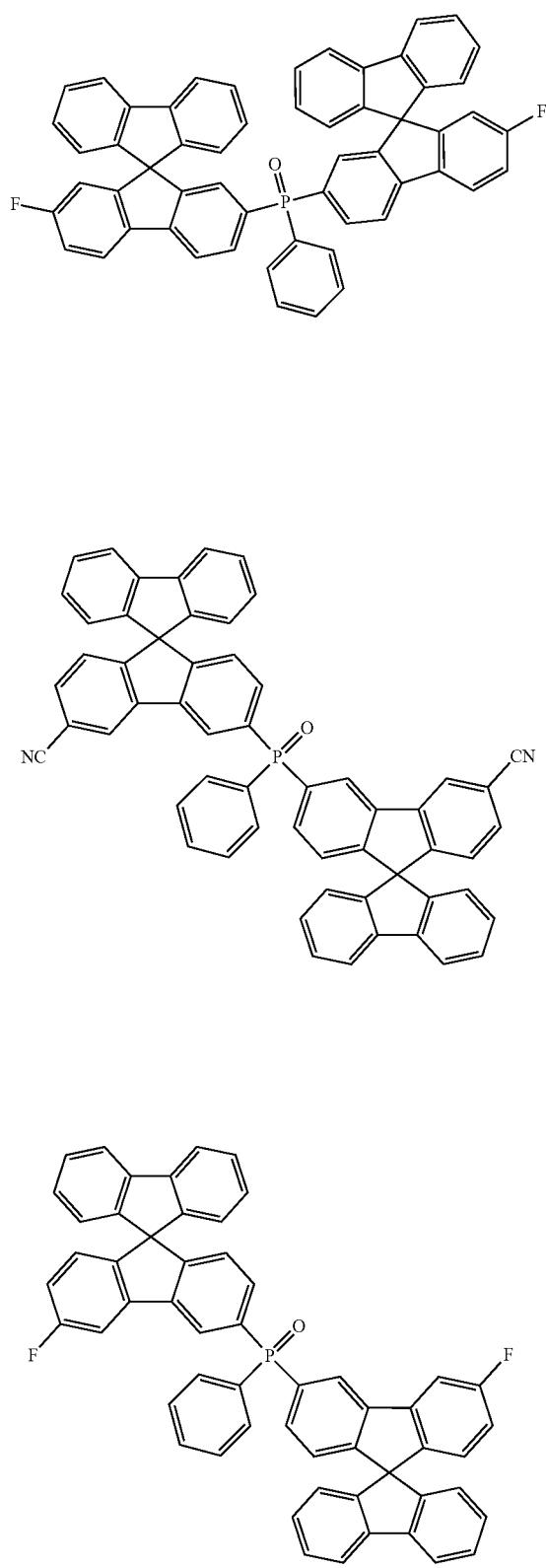
In an embodiment, the condensed cyclic compound represented by Formula 4 may be one selected from compounds represented in the following Compound Group 3.
[Compound Group 3]
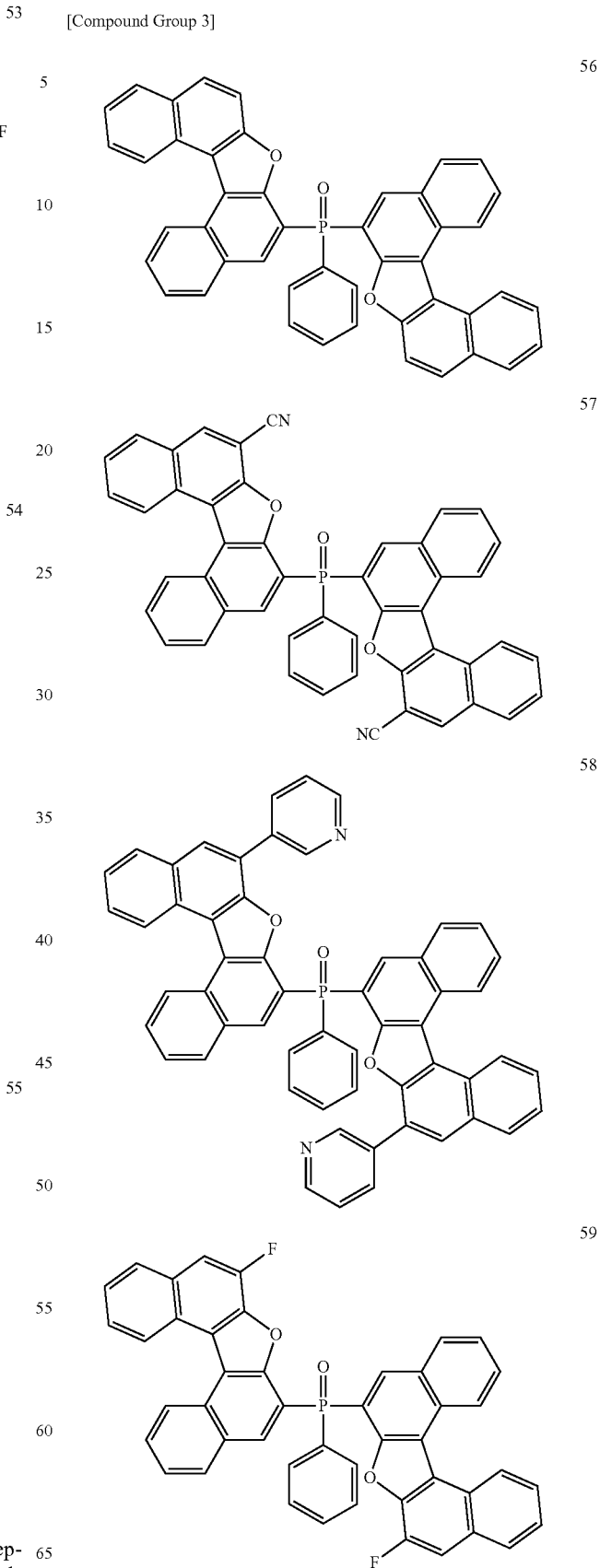

-continued

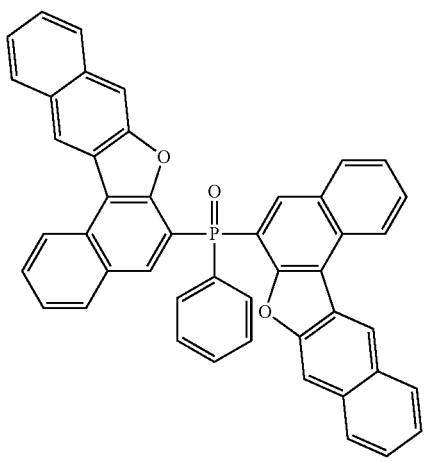
60

In an embodiment, X and Z may be the substituted or unsubstituted hexagonal hydrocarbon ring, and Y may be the substituted or unsubstituted hexagonal heterocycle.

In an embodiment, Formula 1 may be represented by the following Formula 5.

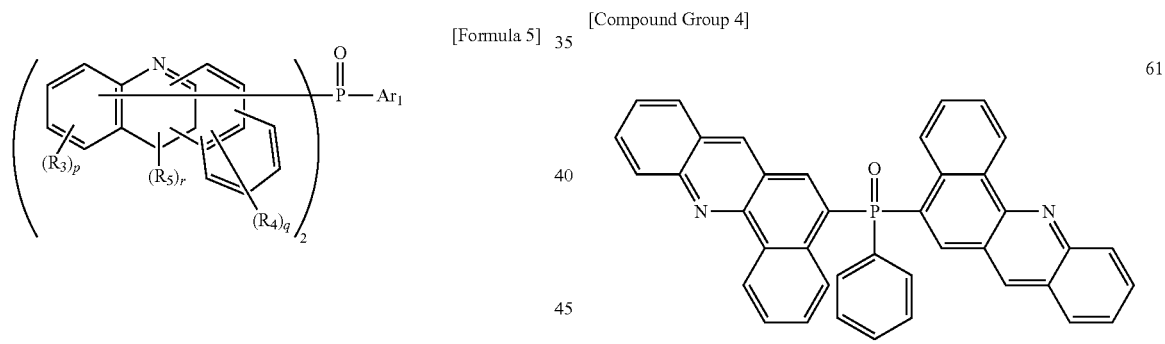
[Formula 5]

where $R_3$, $R_4$ and $R_5$ are each independently a hydrogen atom, a deuterium atom, a halogen atom, a nitro group, a cyano group, a substituted or unsubstituted silyl group, a substituted or unsubstituted boron group, a substituted or unsubstituted alkyl group having 1 to 50 carbon atoms, a substituted or unsubstituted alkenyl group having 2 to 20 carbon atoms, a substituted or unsubstituted arylamine group, a substituted or unsubstituted aryl group having 6 to 40 carbon atoms for forming a ring, a substituted or unsubstituted heteroaryl group having 3 to 40 carbon atoms for forming a ring, or a substituted or unsubstituted condensed polycyclic group having 6 to 60 carbon atoms for forming a ring, p and q are each independently an integer of 0 to 4, r is 0 or 1, and $Ar_1$ is the same as defined in Formula 1.

In an embodiment, Formula 5 may be represented by the following Formula 5-1 or Formula 5-2.

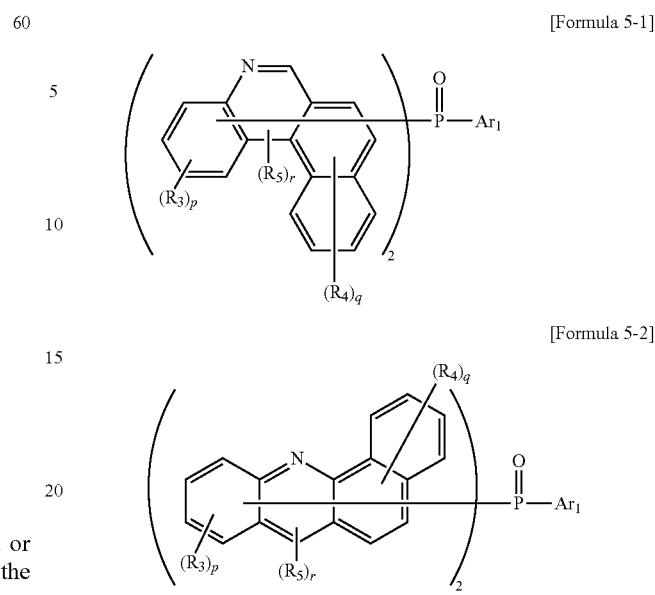
[Formula 5-1]

[Formula 5-2]

where $R_3$ to $R_5$, p to r and $Ar_1$ are the same as defined in Formula 5.

In an embodiment, the condensed cyclic compound represented by Formula 5 may be one selected from compounds represented in the following Compound Group 4.

[Compound Group 4]

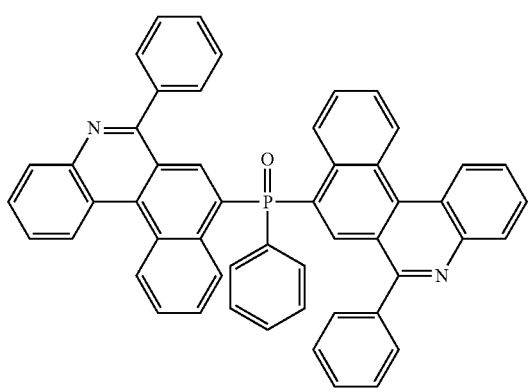
61

62

-continued

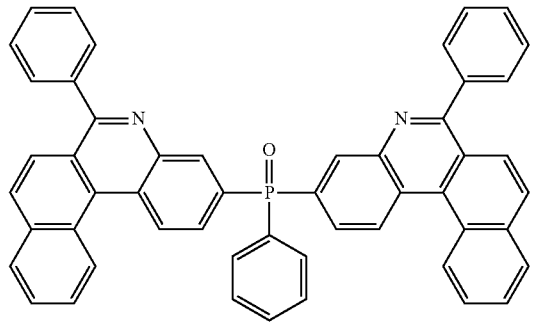
63

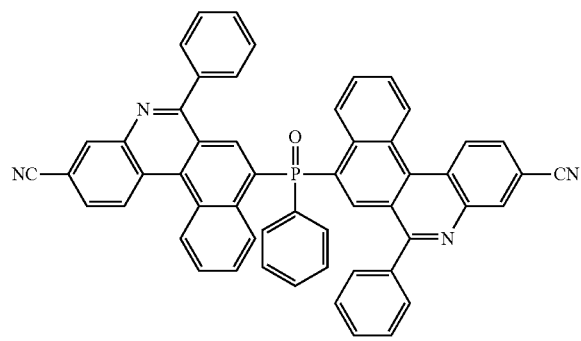
64

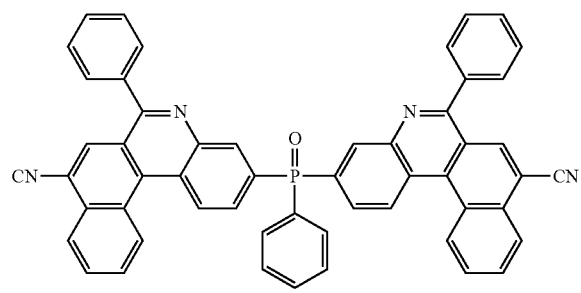
65

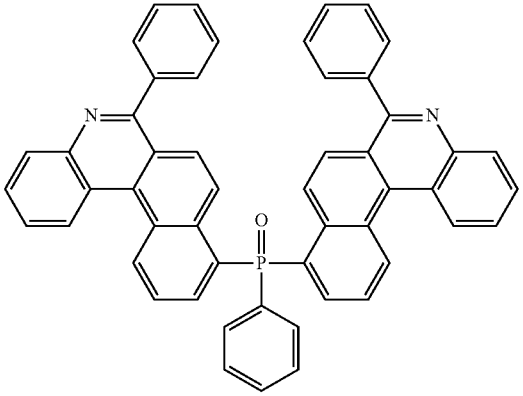
66

In an embodiment, $Ar_1$ may be a substituted or unsubstituted phenyl group.

In an embodiment of the inventive concept, an organic electroluminescence device includes a first electrode, a hole transport region disposed on the first electrode, an emission layer disposed on the hole transport region, an electron transport region disposed on the emission layer, and a second electrode disposed on the electron transport region, wherein the electron transport region includes a condensed cyclic compound represented by the following Formula 1.

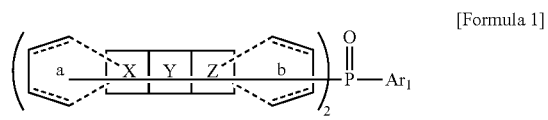

[Formula 1]

where X, Y, Z, a, b and $Ar_1$ are the same as defined in Formula 1.

In an embodiment of the organic electroluminescence device, Formula 1 may be represented by the following Formula 3.

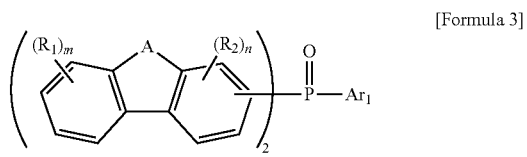

[Formula 3]

where A, $R_1$, $R_2$, m and n are the same as defined in Formula 3.

In an embodiment of the organic electroluminescence device, Formula 1 may be represented by the following Formula 4.

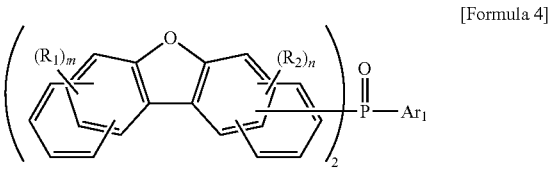

[Formula 4]

where $R_1$, $R_2$, m and n are the same as defined in Formula 4.

In an embodiment of the organic electroluminescence device, Formula 1 may be represented by the following Formula 5.

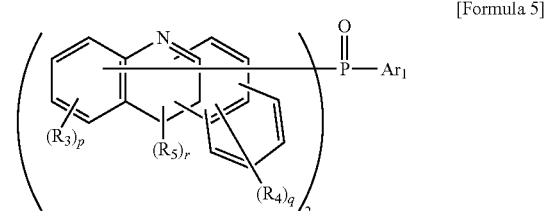

[Formula 5]

where $R_3$, $R_4$, $R_5$, p, q, r and $Ar_1$ are the same as defined in Formula 5.

In an embodiment of the organic electroluminescence device, the hole transport region may include an amine compound represented by the following Formula 6.

[Formula 6]

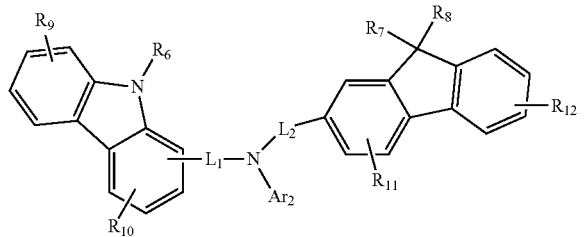

where Ar$_2$ is a substituted or unsubstituted aryl group having 6 to 30 carbon atoms for forming a ring, each of R$_6$ to R$_8$ is independently a hydrogen atom, a deuterium atom, a halogen atom, a substituted or unsubstituted alkyl group having 1 to 30 carbon atoms, a substituted or unsubstituted aryl group having 6 to 30 carbon atoms for forming a ring, a substituted or unsubstituted heteroaryl group having 4 to 30 carbon atoms for forming a ring, a substituted or unsubstituted condensed polycyclic group having 6 to 30 carbon atoms for forming a ring, or may combine with an adjacent group to form a ring, each of R$_9$ to R$_{12}$ is independently a hydrogen atom, a deuterium atom, a halogen atom, a hydroxyl group, a substituted or unsubstituted alkyl group having 1 to 30 carbon atoms, a substituted or unsubstituted aryl group having 6 to 30 carbon atoms for forming a ring, or a substituted or unsubstituted heteroaryl group having 4 to 30 carbon atoms for forming a ring, and each of L$_1$ and L$_2$ is independently a direct linkage, a substituted or unsubstituted alkylene group having 2 to 30 carbon atoms, a substituted or unsubstituted arylene group having 6 to 30 carbon atoms for forming a ring, or a substituted or unsubstituted heteroarylene group having 4 to 30 carbon atoms for forming a ring.

In an embodiment of the organic electroluminescence device, the electron transport region may include at least one of compounds represented in the following Compound Group 5.

[Compound Group 5]

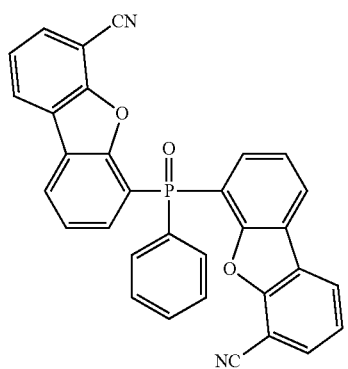

1

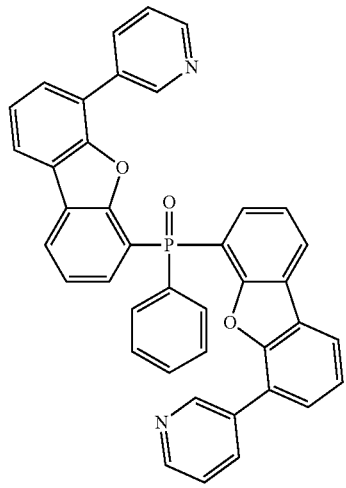

2

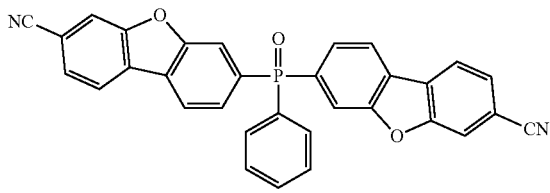

3

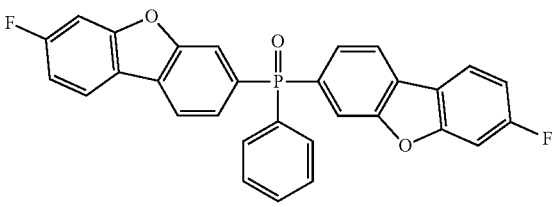

4

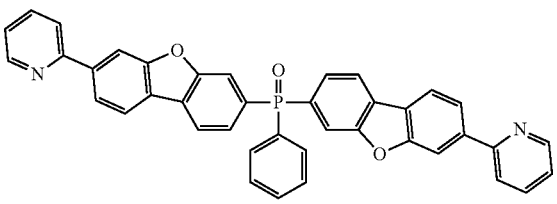

5

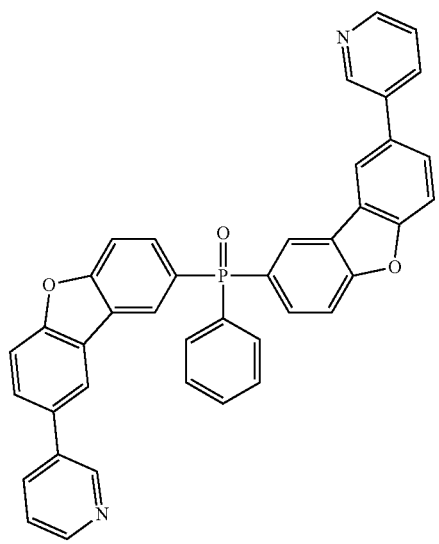
6
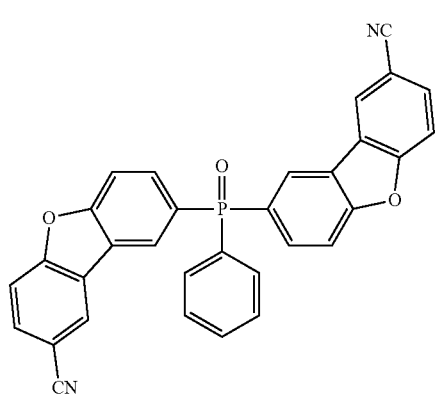
7
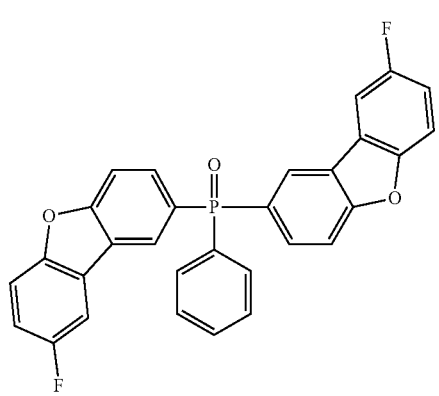
8
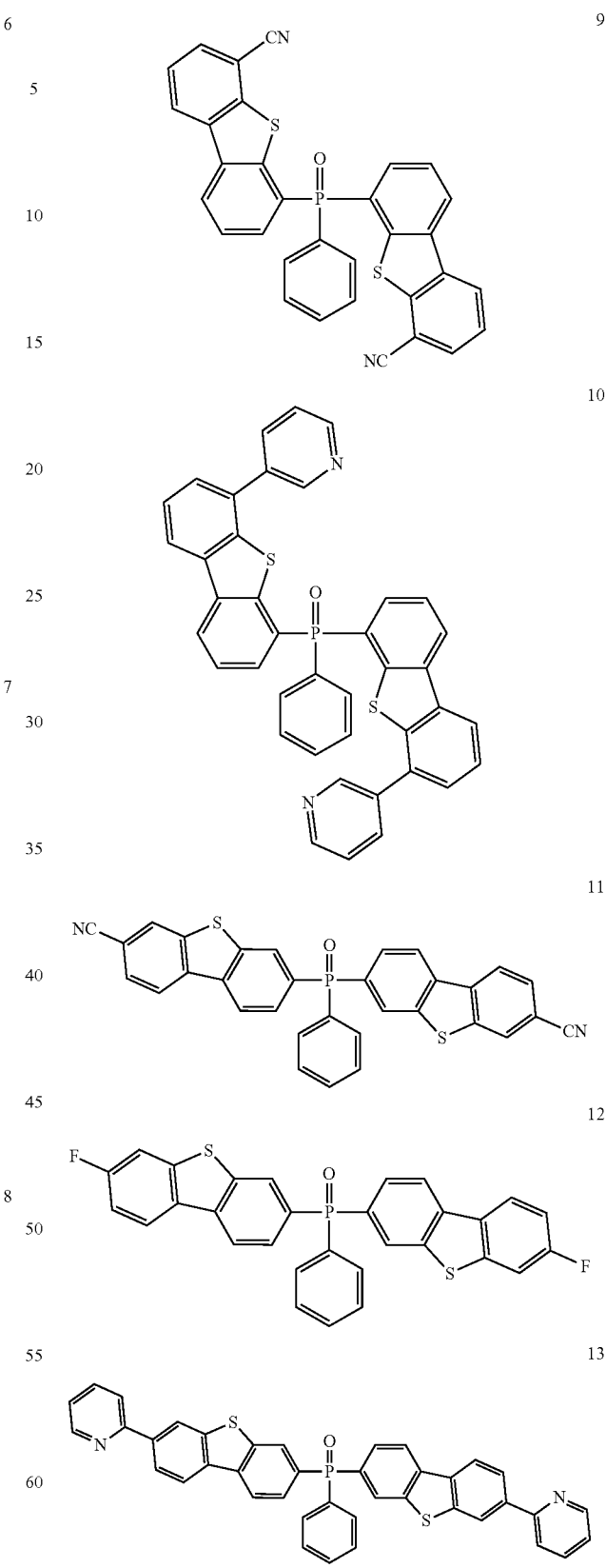

14
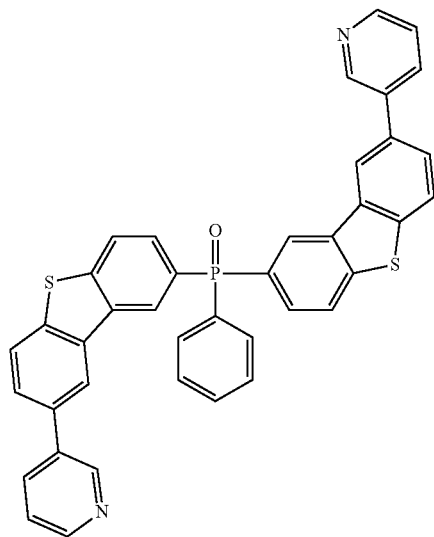
15
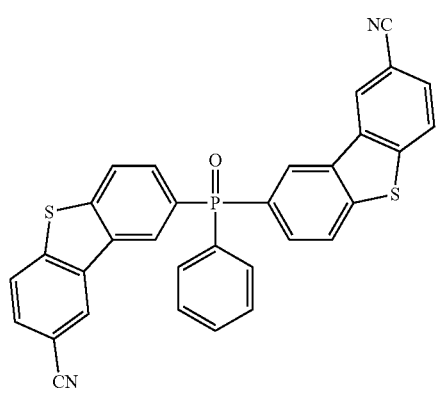
16
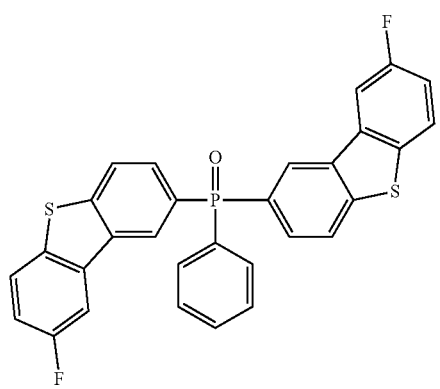
17
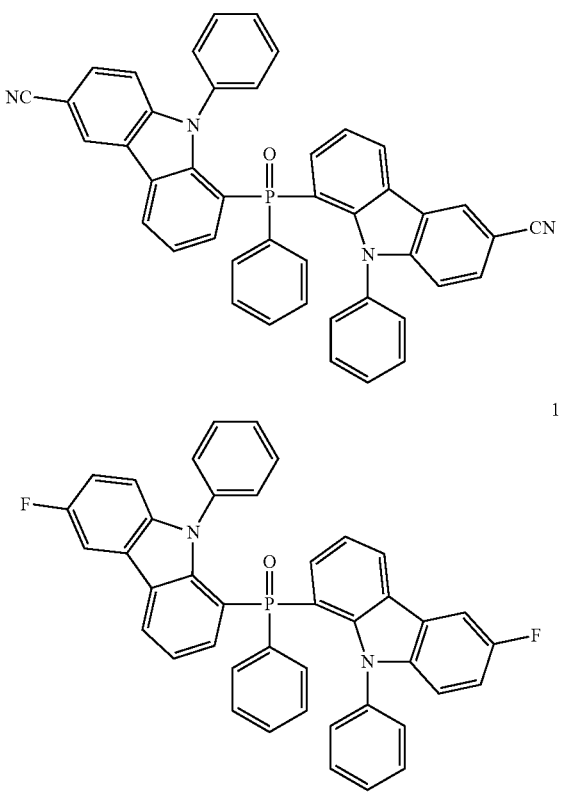
18
19
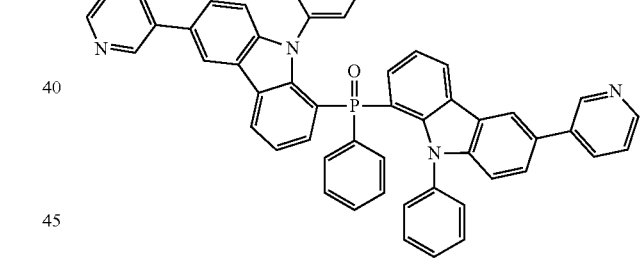
20
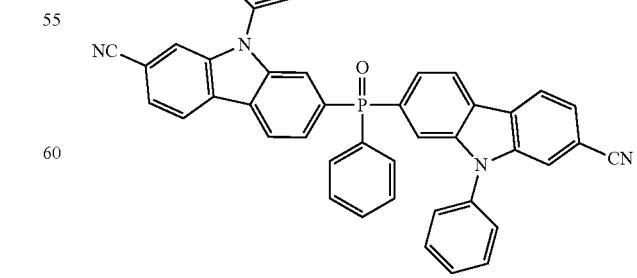

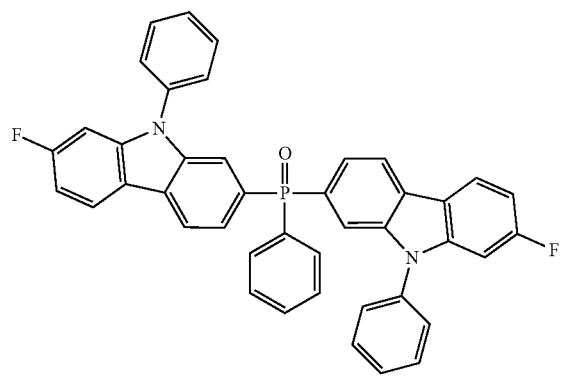
21
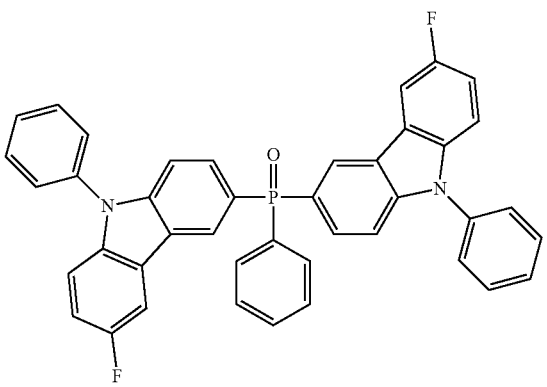
25
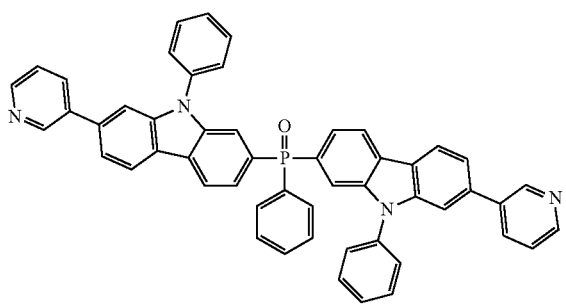
22
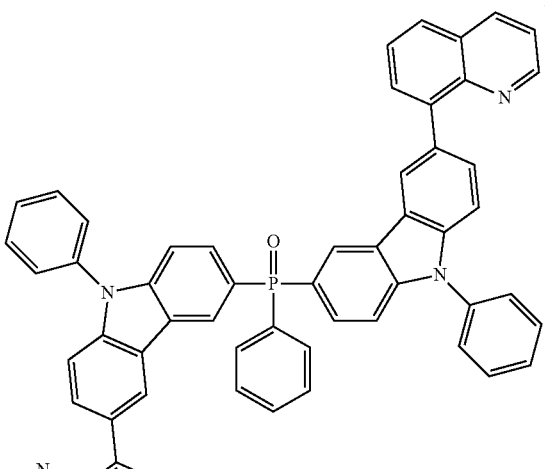
26
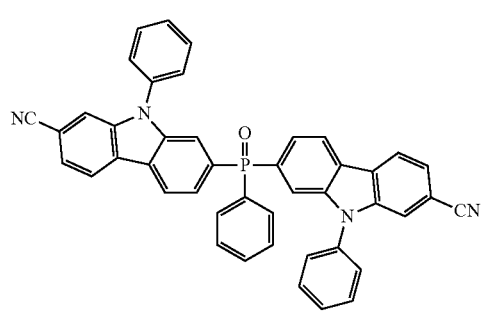
23
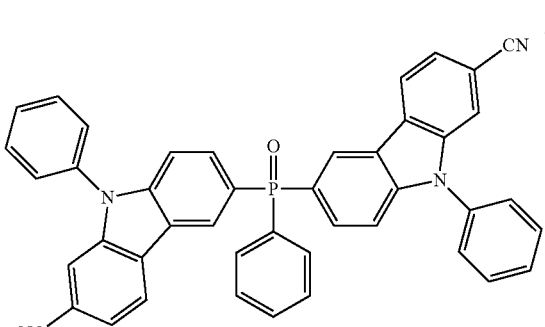
27
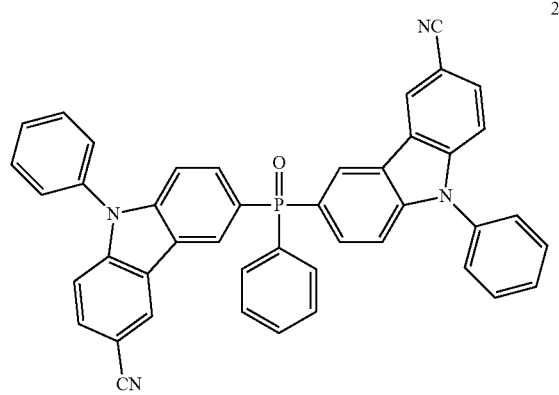
24
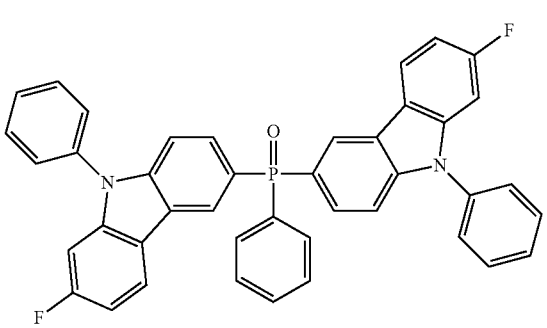
28

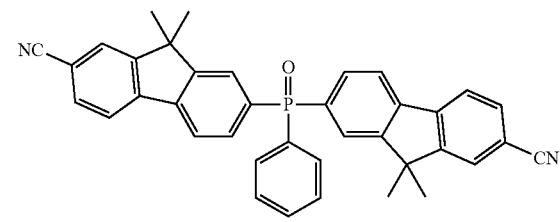
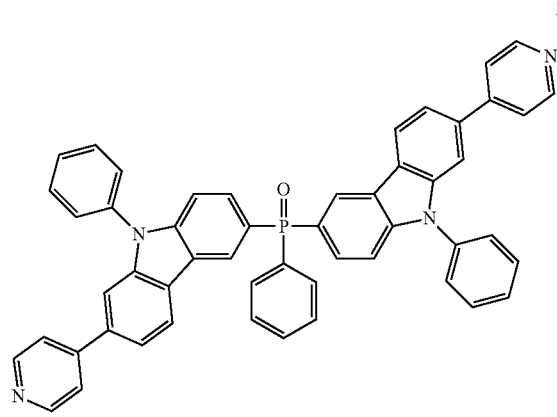
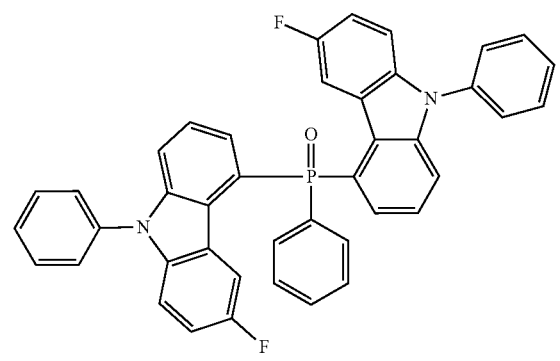
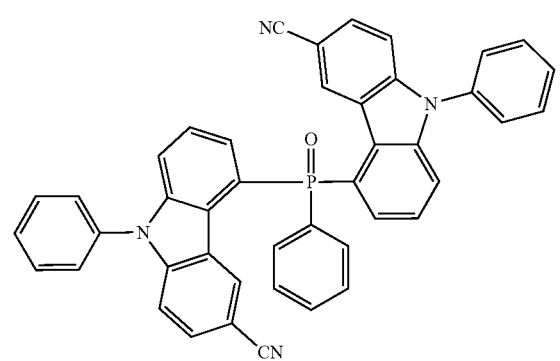
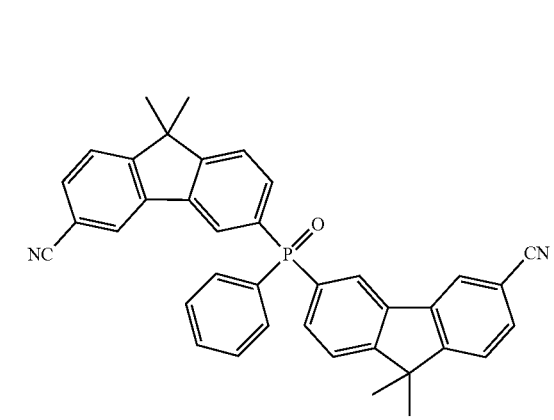
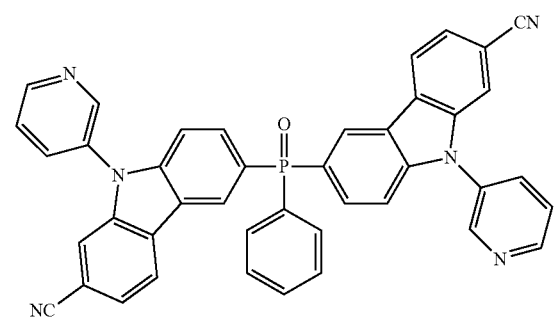
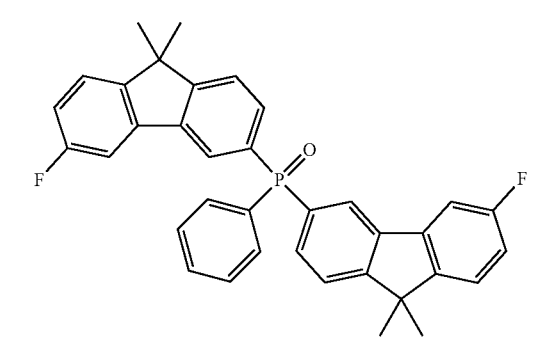

-continued
38
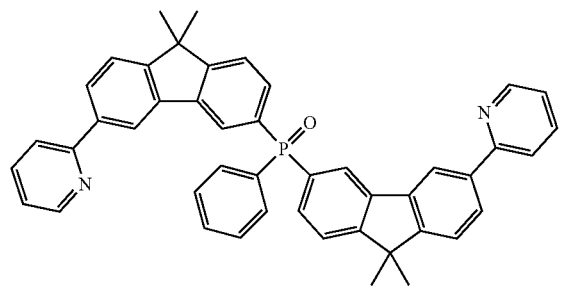
39
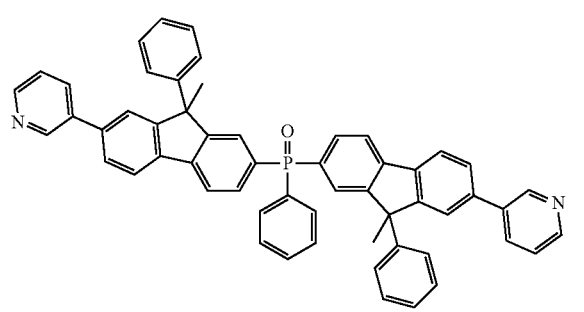
40
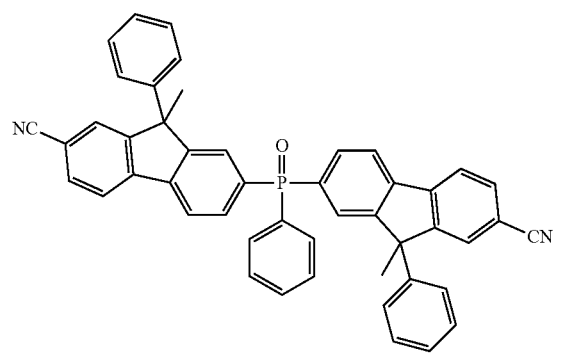
41
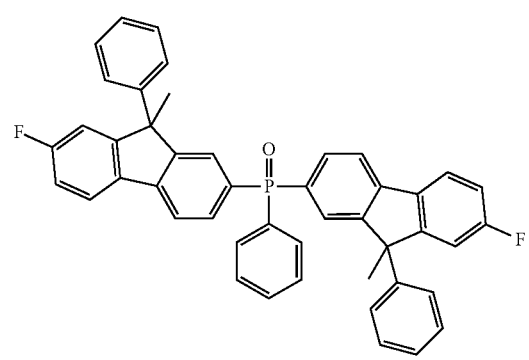
-continued
42
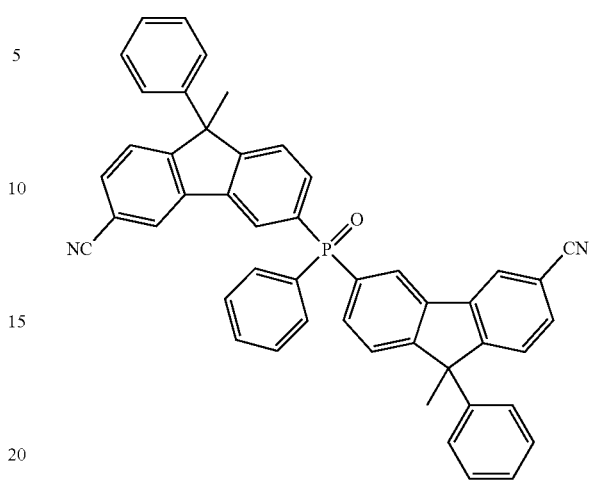
43
44
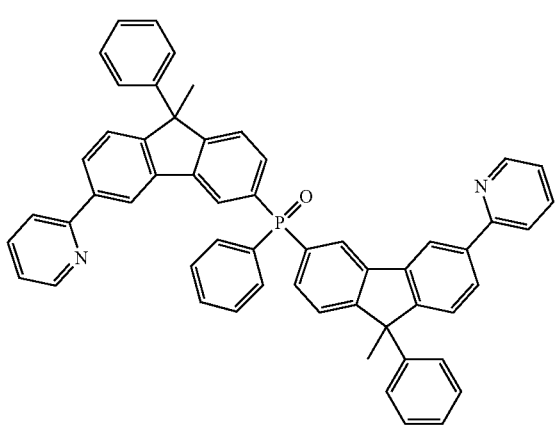

-continued
45
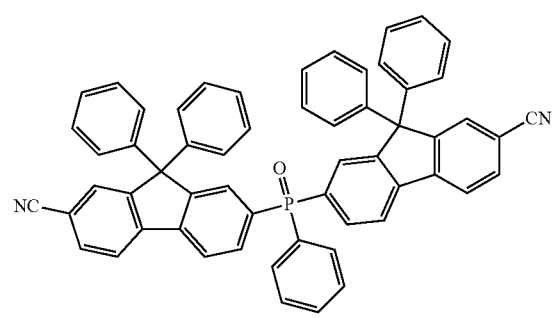
46
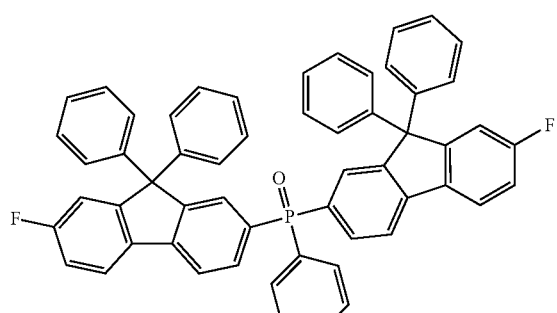
47
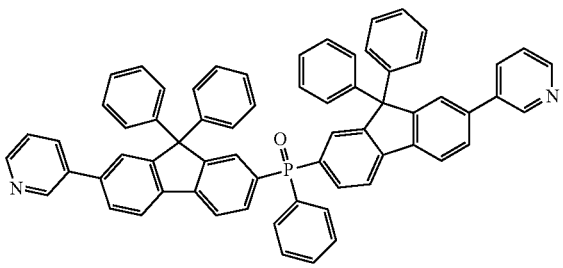
48
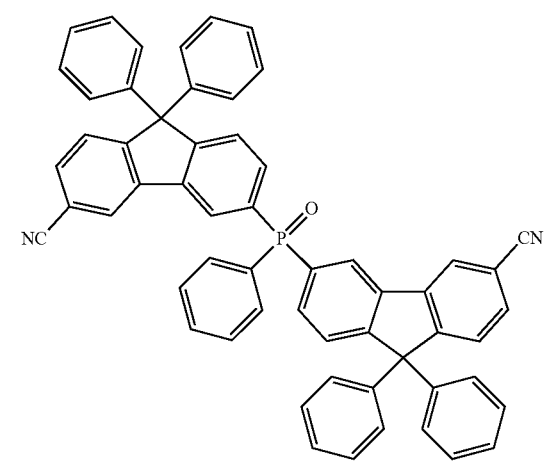
-continued
49
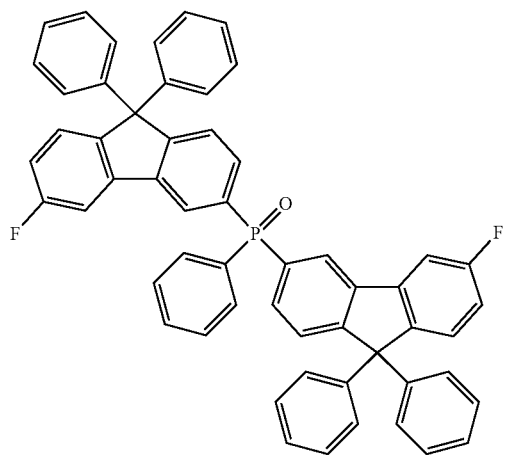
50
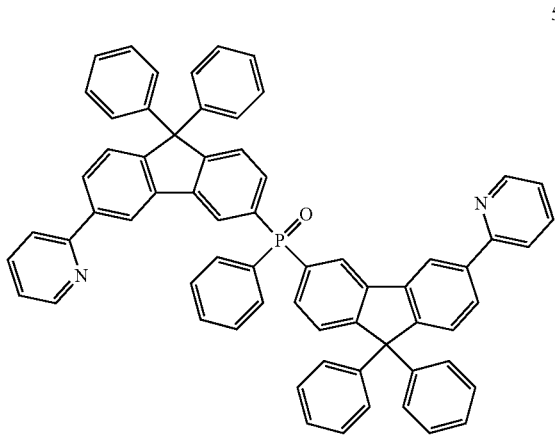
51
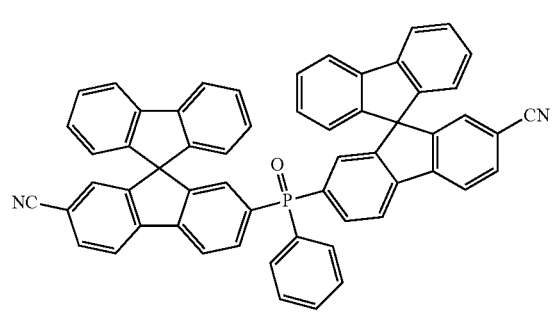
52
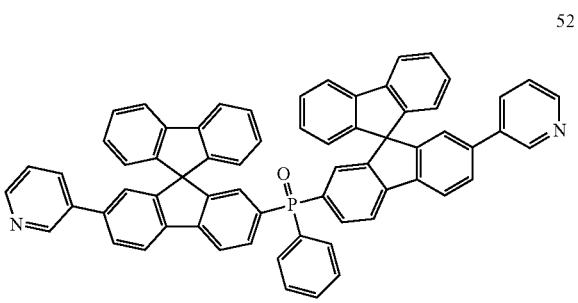

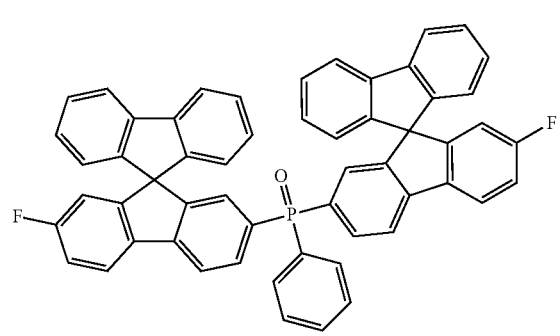
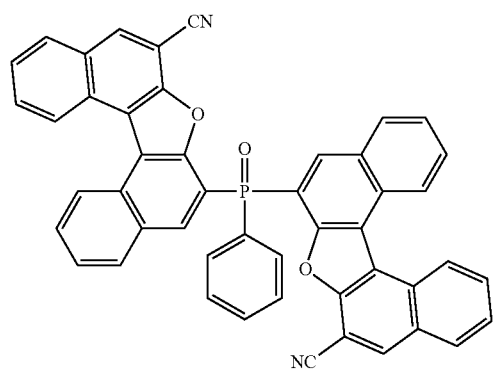
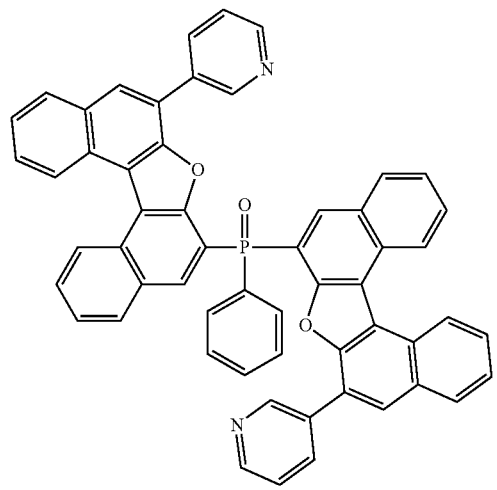
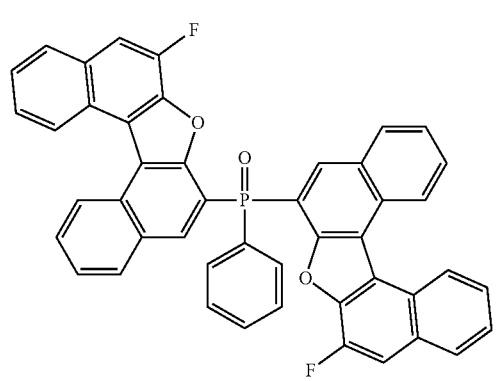

-continued

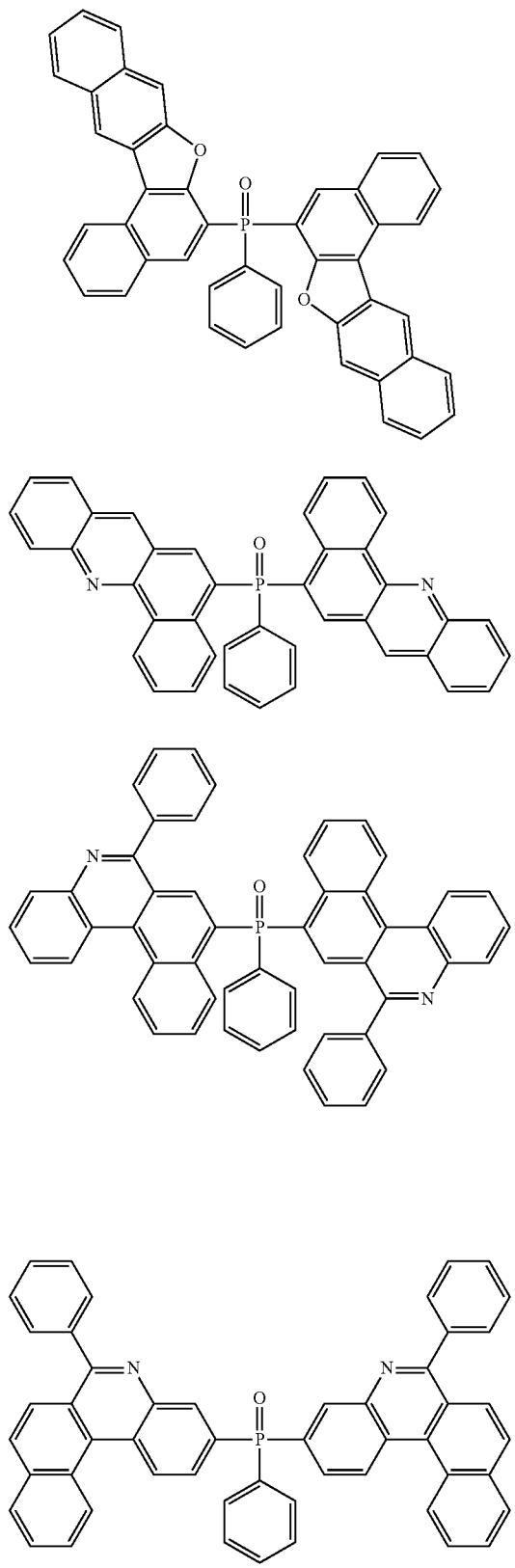

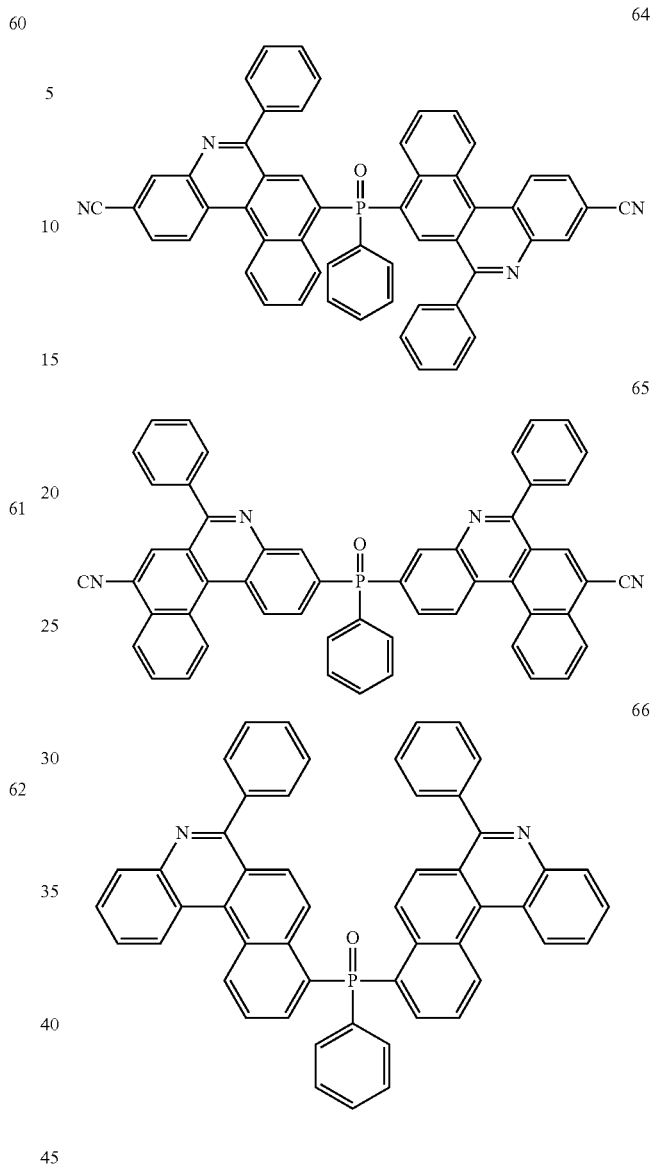

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
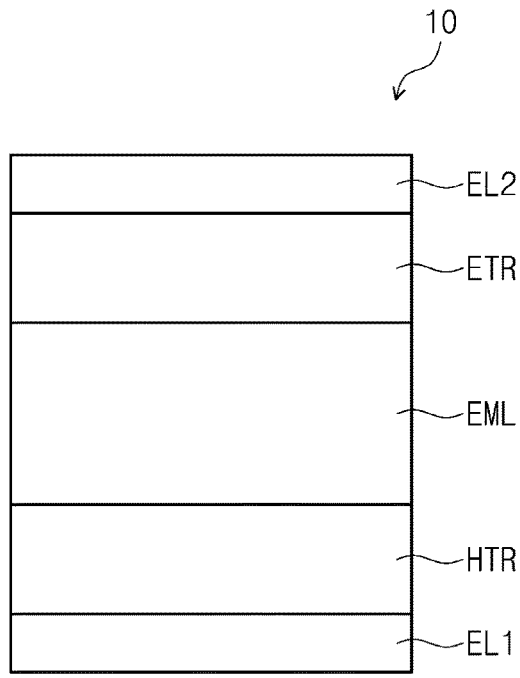
FIG. 1 is a cross-sectional view schematically illustrating an organic electroluminescence device according to an embodiment.

The inventive concept may have various modifications and may be embodied in different forms, and example embodiments will be explained in detail with reference to the accompany drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof. It will also be understood that when a layer, a film, a region, a plate, etc. is referred to as being 'on' another part, it can be directly on the other part, or intervening layers may also be present.

In the description, "-*" means a connected site.

In the description, the term "substituted or unsubstituted" corresponds to substituted or unsubstituted with at least one substituent selected from the group consisting of a deuterium atom, a halogen atom, a cyano group, a nitro group, an amino group, a silyl group, a boron group, a phosphine oxide group, a phosphine sulfide group, an alkyl group, an alkenyl group, an aryl group, and a heterocyclic group. In addition, each of the substituents may be substituted or unsubstituted. For example, a biphenyl group may be interpreted as an aryl group or a phenyl group substituted with a phenyl group.

In the description, the terms "forming a ring via the combination with an adjacent group" may mean forming a substituted or unsubstituted hydrocarbon ring, or substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the ring formed via the combination with an adjacent group may be combined with another ring to form a spiro structure.

In the description, the terms "an adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, the halogen may include a fluorine atom, a chlorine atom, a bromine atom and an iodine atom.

In the description, the alkyl may be a linear, branched or cyclic type. The carbon number of the alkyl may be from 1 to 50, from 1 to 30, from 1 to 20, from 1 to 10, or from 1 to 6. The alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the aryl group means an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylene, pyrenyl, benzofluoranthenyl, chrysenyl, etc., without limitation.

In the description, the fluorenyl group may be substituted, and two substituents may combine to form a spiro structure.

In the description, the heteroaryl may be a heteroaryl including at least one of O, N, P, Si or S as a heteroatom. The carbon number for forming a ring of the heteroaryl may be 2 to 30, or 2 to 20. Examples of the heteroaryl may include monocyclic heteroaryl or polycyclic heteroaryl. Examples of the polycyclic heteroaryl may have dicyclic or tricyclic structure. Examples of the heteroaryl may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidinyl, pyrido pyrazinyl, pyrazino pyrazinyl, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuranyl, phenanthroline, thiazolyl, isooxazolyl, oxadiazolyl, thiadiazolyl, benzothiazolyl, phenothiazinyl, dibenzosilole, dibenzofuranyl, etc., without limitation.

In the description, explanation on the aryl may be applied to the arylene except that the arylene is a divalent group.

In the description, explanation on the heteroaryl may be applied to the heteroarylene except that the heteroarylene is a divalent group.

In the description, the silyl may include alkyl silyl and aryl silyl. Examples of the silyl may include trimethylsilyl, triethylsilyl, t-butyldimethylsilyl, vinyldimethylsilyl, propyldimethylsilyl, triphenylsilyl, diphenylsilyl, phenylsilyl, etc., without limitation.

In the description, the boron group may include an alkyl boron group and an aryl boron group. Examples of the boron group may include a trimethylboron group, a triethylboron group, a t-butyldimethylboron group, a triphenylboron group, a diphenylboron group, a phenylboron group, etc., without limitation.

In the description, the alkenyl may be linear or branched. The carbon number is not specifically limited, but may be 2 to 30, 2 to 20, or 2 to 10. Examples of the alkenyl may include vinyl, 1-butenyl, 1-pentenyl, 1,3-butadienyl aryl, styrenyl, styrylvinyl, etc., without limitation.

In the description, the carbon number of the amino group is not specifically limited, and may be 1 to 30. The amino group may include alkylamino group and arylamino group. Examples of the amino group may include methylamino group, dimethylamino group, phenylamino group, diphenylamino group, naphthylamino group, 9-methyl-anthracenylamino group, triphenylamino group, etc., without limitation.

Hereinafter, a condensed cyclic compound according to an embodiment will be explained.

A condensed cyclic compound according to an embodiment is represented by the following Formula 1.

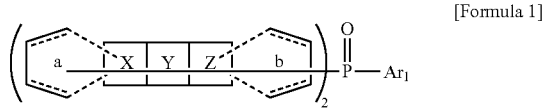
[Formula 1]

where each of X, Y and Z is independently a substituted or unsubstituted pentagonal hydrocarbon ring, a substituted or unsubstituted hexagonal hydrocarbon ring, a substituted or unsubstituted pentagonal heterocycle, or a substituted or unsubstituted hexagonal heterocycle, and each of the pentagonal heterocycle and the hexagonal heterocycle independently includes one heteroatom.

In Formula 1, each of a and b may be independently 0 or 1. In Formula 1, "a" means the number of the ring indicated by a, and "b" means the number of the ring indicated by b. For example, in the case where a or b is 1, the ring indicated by a or b forms a condensed ring, and in the case where a or b is 0, the ring indicated by a or b is not exist.

Particularly, in the case where a is 0 and b is 1, or a is 1 and b is 0, the condensed ring of Formula 1 may be a cyclic compound having four rings. In addition, in the case where both a and b are 0, the condensed ring of Formula 1 may be a cyclic compound having three rings. In addition, both a and b are 1, the condensed ring of Formula 1 may be a cyclic compound having five rings.

Meanwhile, the rings indicated by "a" or "b" may be each independently a substituted or unsubstituted pentagonal hydrocarbon ring, a substituted or unsubstituted hexagonal hydrocarbon ring, a substituted or unsubstituted pentagonal heterocycle, or a substituted or unsubstituted hexagonal heterocycle. For example, in an embodiment, each of the ring indicated by "a" or "b" may independently be a substituted or unsubstituted hexagonal hydrocarbon ring, or a substituted or unsubstituted hexagonal heterocycle.

In Formula 1, $Ar_1$ may be a substituted or unsubstituted aryl group having 6 to 30 carbon atoms for forming a ring. Particularly, $Ar_1$ may be a substituted or unsubstituted phenyl group. For example, $Ar_1$ may be an unsubstituted phenyl group.

In Formula 1, the ring or the heterocycle represented by X, Y and Z may be substituted. In this case, each of X, Y and Z is a halogen atom, a nitro group, a cyano group, a substituted or unsubstituted silyl group, a substituted or unsubstituted boron group, a substituted or unsubstituted alkyl group having 1 to 50 carbon atoms, a substituted or unsubstituted alkenyl group having 2 to 20 carbon atoms, a substituted or unsubstituted arylamine group, a substituted or unsubstituted aryl group having 6 to 40 carbon atoms for forming a ring, a substituted or unsubstituted heteroaryl group having 3 to 40 carbon atoms for forming a ring, or a substituted or unsubstituted condensed polycyclic group having 6 to 60 carbon atoms for forming a ring. Meanwhile, the substituents may combine with an adjacent group to form a ring.

For example, X, Y or Z may be substituted with a fluorine atom, a cyano group, a phenyl group, a pyridinyl group, or a quinolinyl group.

Meanwhile, in Formula 1,

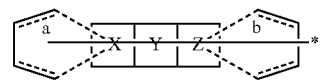

may be symmetrically disposed with P as the center.

In Formula 1, a case where

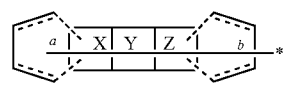

is benzoquinoline or phenanthroline, is excluded.

The condensed ring,

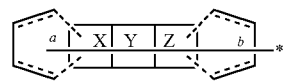

which is included in the condensed cyclic compound according to an embodiment may be a substituted or unsubstituted cyclic compound having three rings, a substituted or unsubstituted cyclic compound having four rings, or a substituted or unsubstituted cyclic compound having five rings.

In addition, the condensed cyclic compound according to an embodiment may be a phosphine oxide-based compound including two condensed rings of three or more rings. For example, the condensed cyclic compound of an embodiment may be a phosphine oxide-based compound including two substituted or unsubstituted cyclic compounds having three rings, two substituted or unsubstituted cyclic compounds having four rings, or two substituted or unsubstituted cyclic compounds having five rings.

In Formula 1, Y may be a substituted or unsubstituted pentagonal hydrocarbon ring, or a substituted or unsubstituted pentagonal heterocycle. In addition, each o X and Z may independently be a substituted or unsubstituted hexagonal hydrocarbon ring, or a substituted or unsubstituted hexagonal heterocycle.

The condensed cyclic compound of Formula 1 may be represented by the following Formula 2.

[Formula 2]
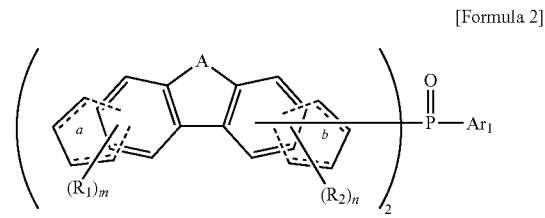

Formula 2 may be a condensed cyclic compound of Formula 1 in which both X and Z are substituted or unsubstituted hexagonal hydrocarbon rings, Y is a substituted or unsubstituted pentagonal hydrocarbon ring or a substituted or unsubstituted pentagonal heterocycle.

In Formula 2, "A" may be one of CRR', NR", O or S, and each of R, R' and R" may independently be a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. In addition, R, R' and R" may combine with an adjacent group to form a ring.

In Formula 2, each of $R_1$ and $R_2$ may independently be a hydrogen atom, a deuterium atom, a halogen atom, a nitro group, a cyano group, a substituted or unsubstituted silyl group, a substituted or unsubstituted boron group, a substituted or unsubstituted alkyl group having 1 to 50 carbon atoms, a substituted or unsubstituted alkenyl group having 2 to 20 carbon atoms, a substituted or unsubstituted arylamine group, a substituted or unsubstituted aryl group having 6 to 40 carbon atoms for forming a ring, a substituted or unsubstituted heteroaryl group having 3 to 40 carbon atoms for forming a ring, or a substituted or unsubstituted condensed polycyclic group having 6 to 60 carbon atoms for forming a ring.

For example, each of $R_1$ and $R_2$ may independently be a halogen atom, a cyano group, or a substituted or unsubstituted phenyl group.

In addition, each of m and n may independently be an integer of 0 to 4. In the case where m is an integer of 2 or more, a plurality of $R_1$ may be the same or different. In the case where n is an integer of 2 or more, a plurality of $R_2$ may be the same or different.

In Formula 2, a, b, and $Ar_1$ are the same as defined in Formula 1. Formula 2 may be represented by Formula 3.

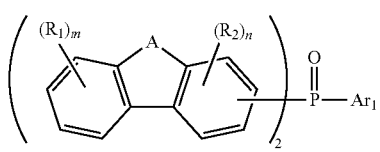

[Formula 3]

The condensed cyclic compound represented by Formula 3 according to an embodiment may be Formula 2 in which both a and b are 0. In particular, Formula 3 may be a case where the condensed cyclic group combined with P is a cyclic group including three rings.

In Formula 3, the condensed cyclic group combined with P in the case where "A" is CRR' may be a substituted or unsubstituted fluorenyl group. In addition, in Formula 3, the condensed cyclic group combined with P in the case where "A" is NR" may be a substituted or unsubstituted carbazole group. In Formula 3, the condensed cyclic group combined with P in the case where "A" is O may be a substituted or unsubstituted dibenzofuranyl group, and the condensed cyclic group combined with P in the case where "A" is S(Sulfur) may be a substituted or unsubstituted dibenzothiophenyl group.

In Formula 3, the same explanation on A, $R_1$, $R_2$, m, n and $Ar_1$ as that for Formula 2 may be applied.

For example, the condensed cyclic group combined with P in Formula 3 may be one of the following E-1 to E-3. In this case, R' in E-1 may be a substituted or unsubstituted phenyl group. In addition, R' in E-1 may be a substituted or unsubstituted pyridyl group.

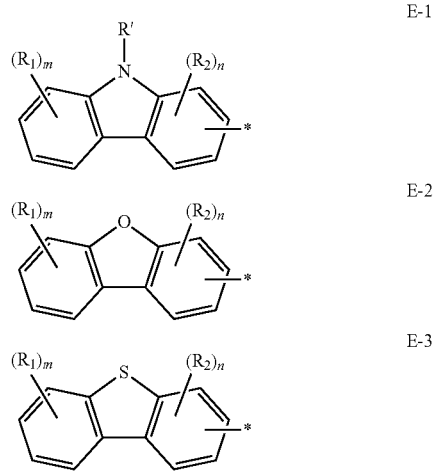

Formula 3 may be represented by the following Formula 3-1.

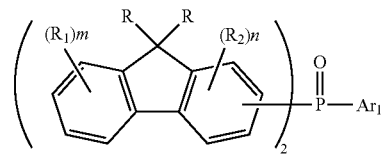

[Formula 3-1]

Formula 3-1 may be Formula 3 in which "A" is CRR'.

The condensed cyclic group combined with P in Formula 3-1 may be one of the following F-1 to F-4.

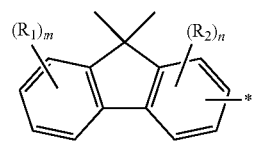

F-1

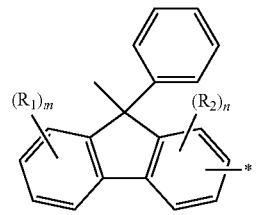

F-2

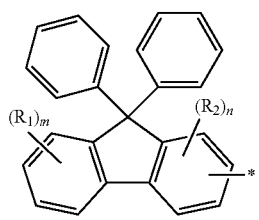

F-3

F-4
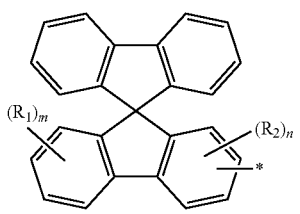
In Formulae 3 and 3-1, the same explanation on R, R', $R_1$, $R_2$, m, n and $Ar_1$ as that for Formula 2 may be applied.
The condensed cyclic compound represented by Formula 3 according to an embodiment may be one of the compounds represented in the following Compound Group 1.
[Compound Group 1]
1
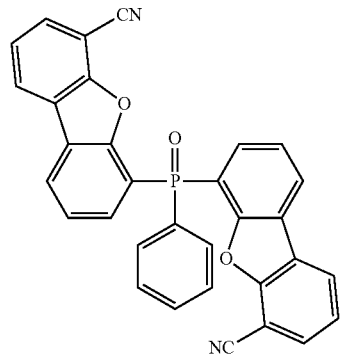
2
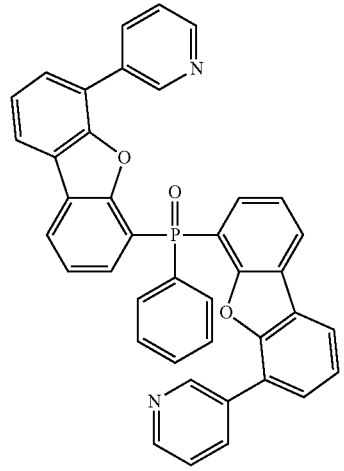
3
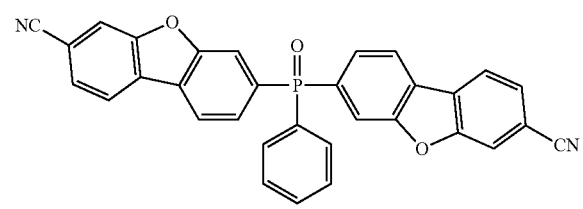
4
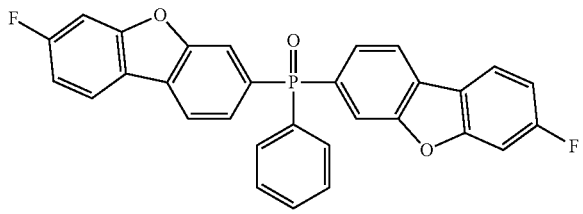
5
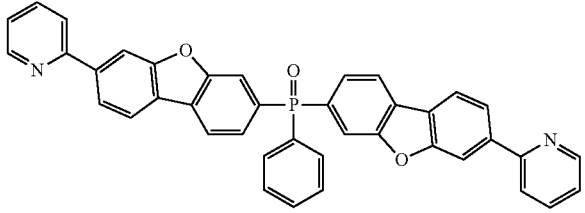
6
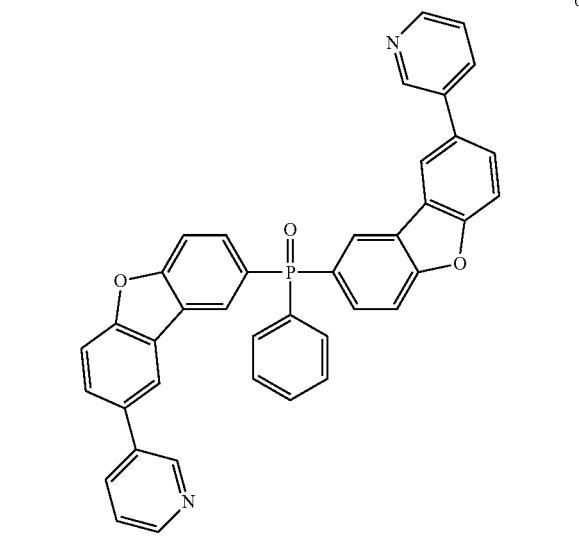
7
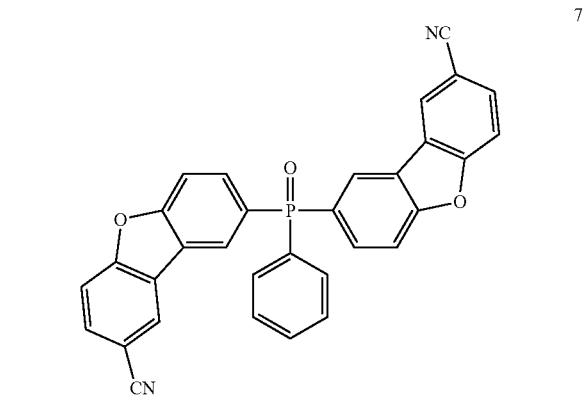

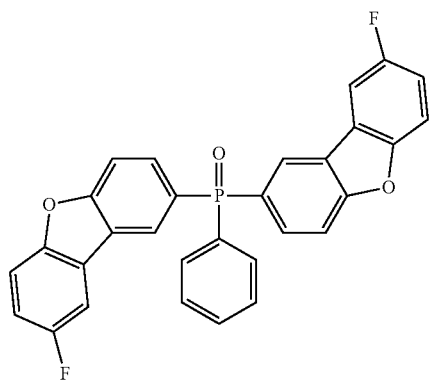
8
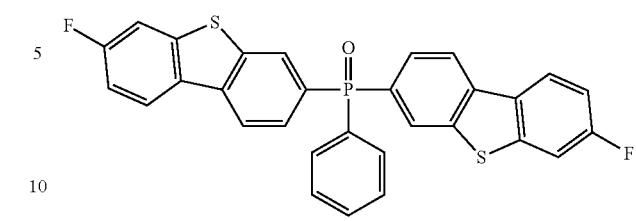
12
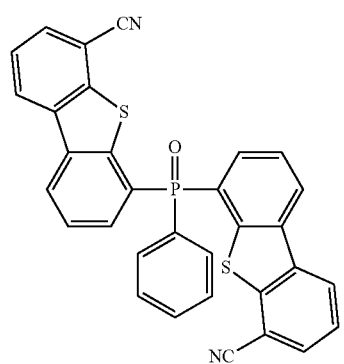
9
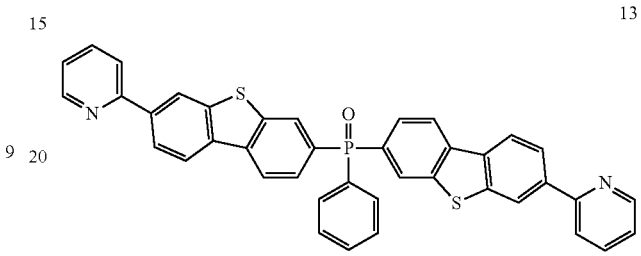
13
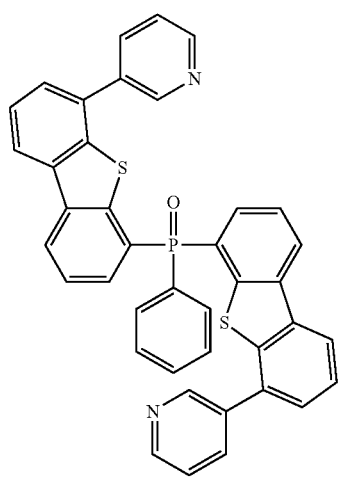
10
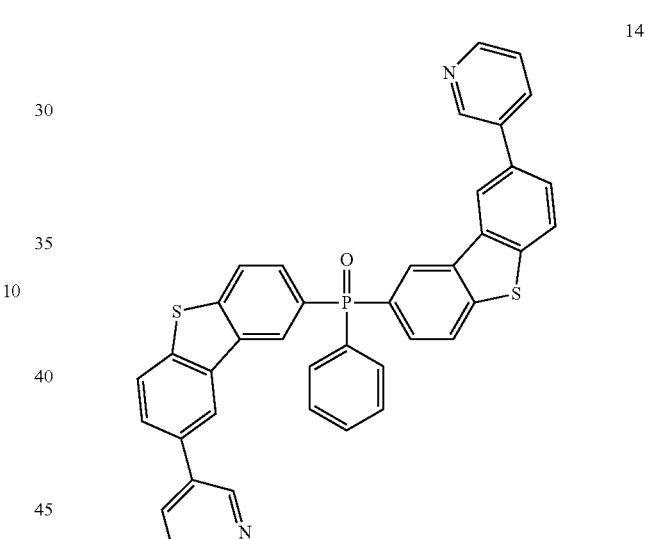
14
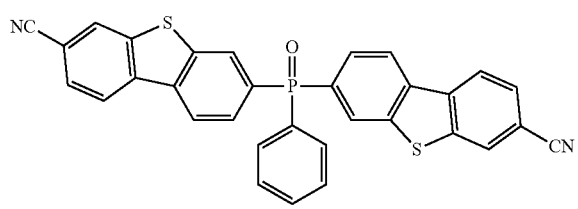
11
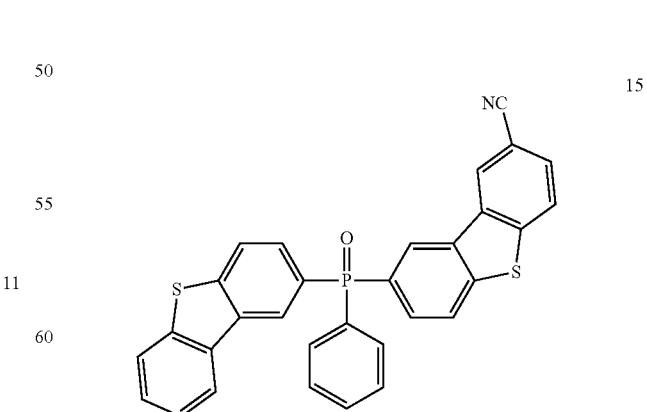
15

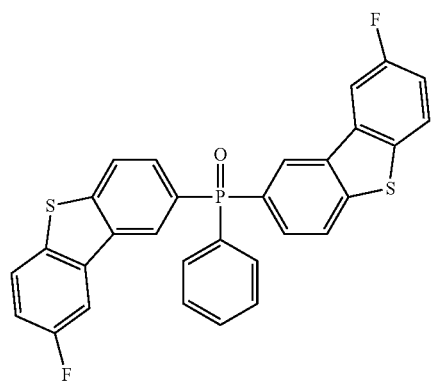
16
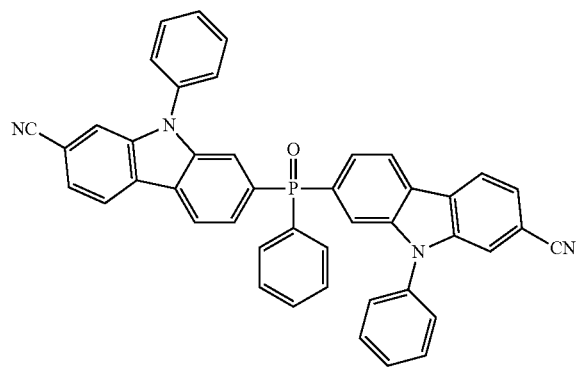
20
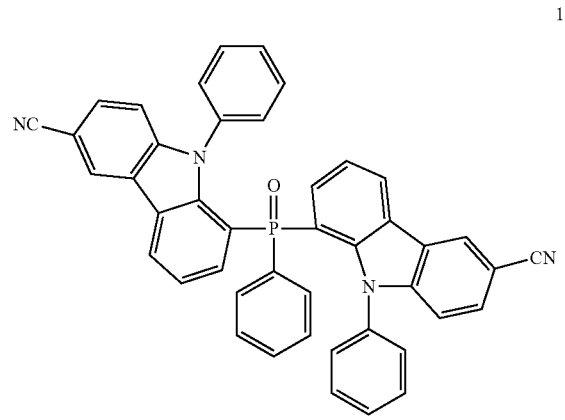
17
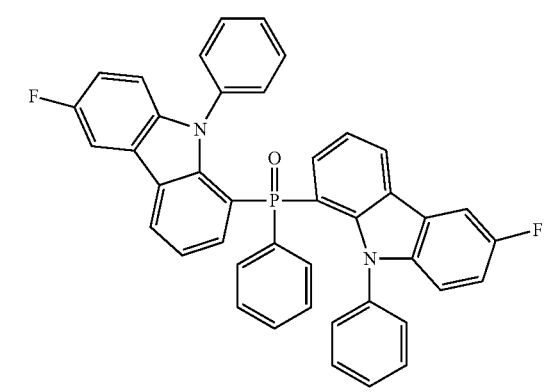
18
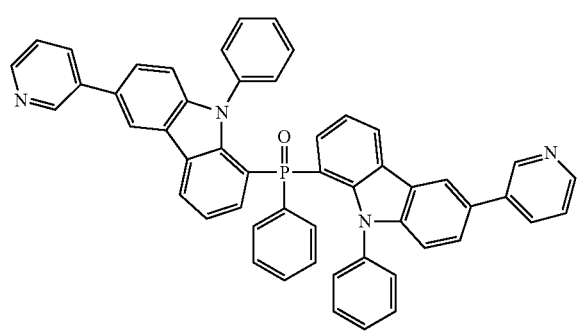
19

24
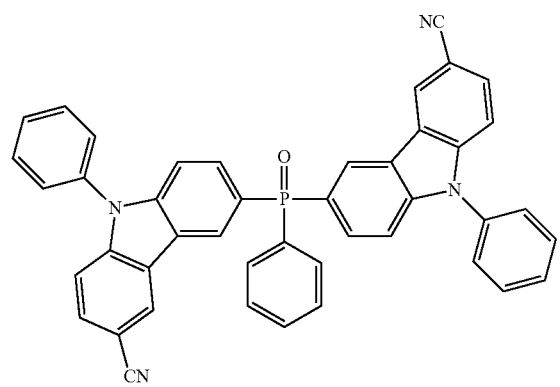
25
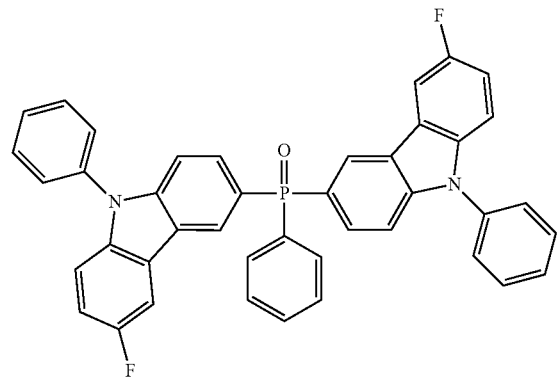
26
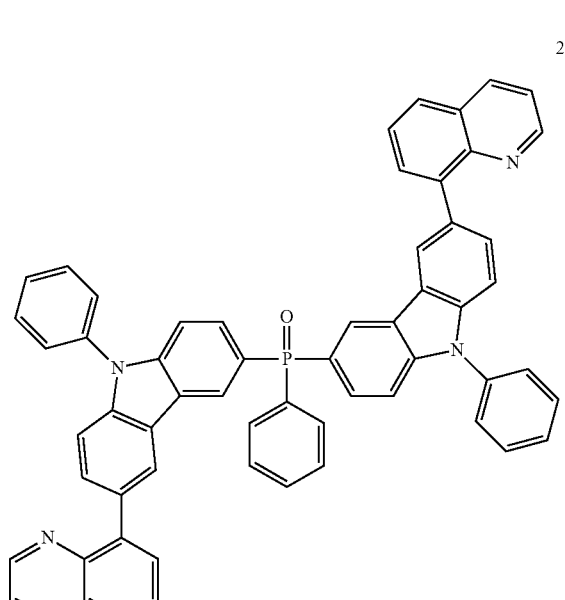
27
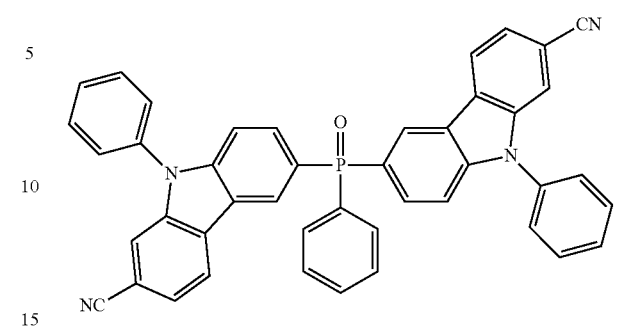
28
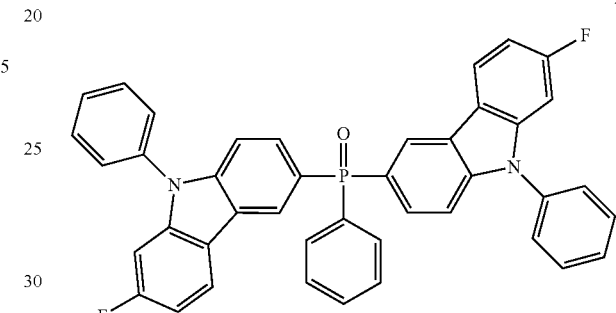
29
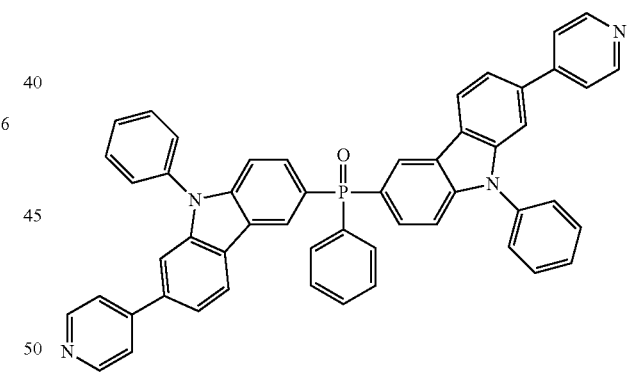
30
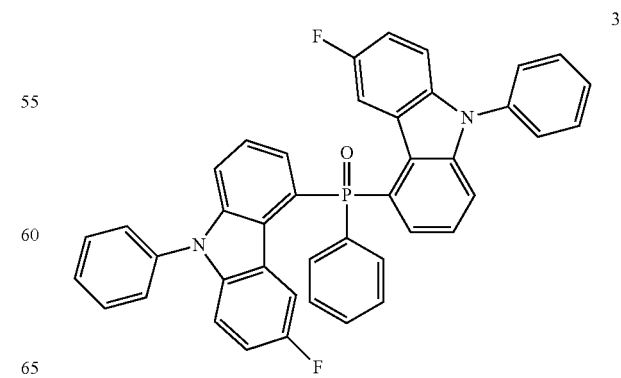

31
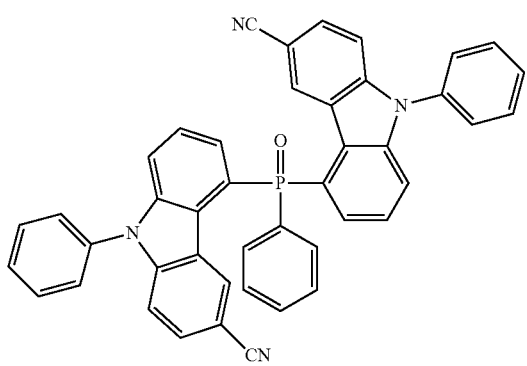
32
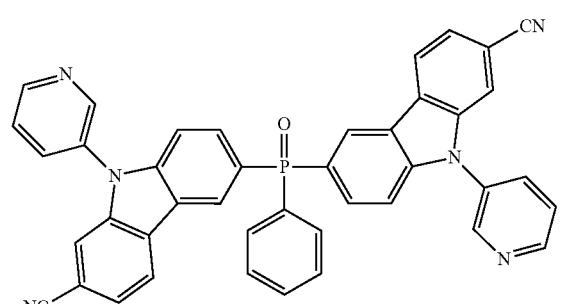
In addition, the condensed cyclic compound represented by Formula 3 according to an embodiment may be one of the compounds represented in the following Compound Group 2.
[Compound Group 2]
33
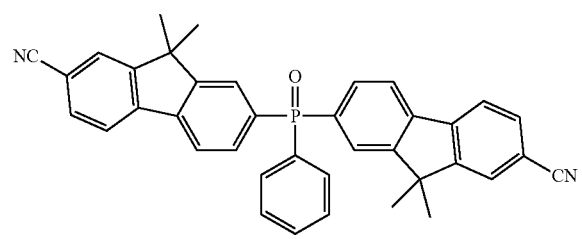
34
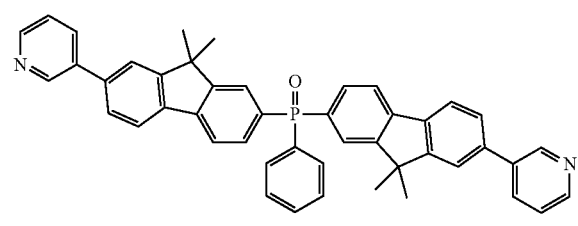
35
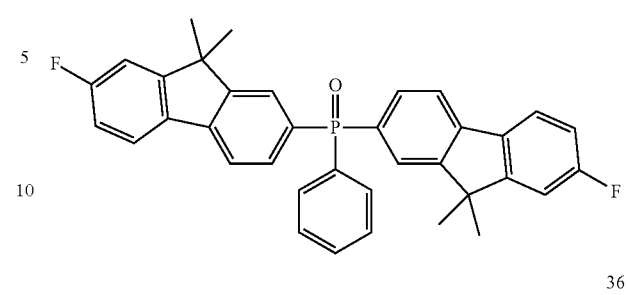
36
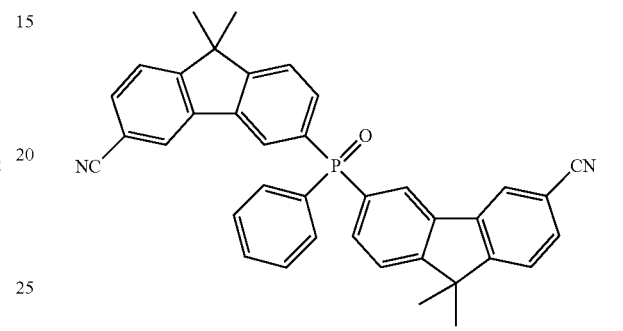
37
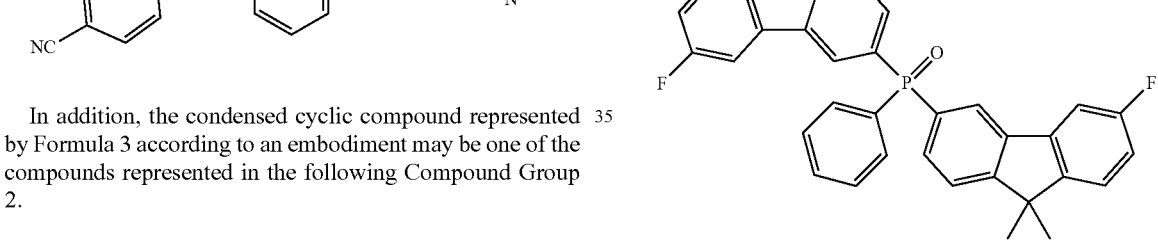
38
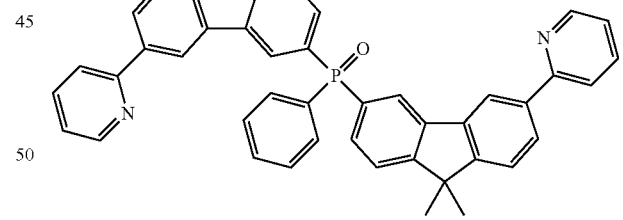
39
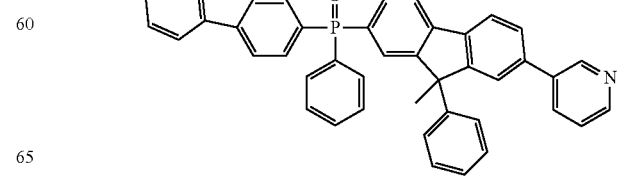

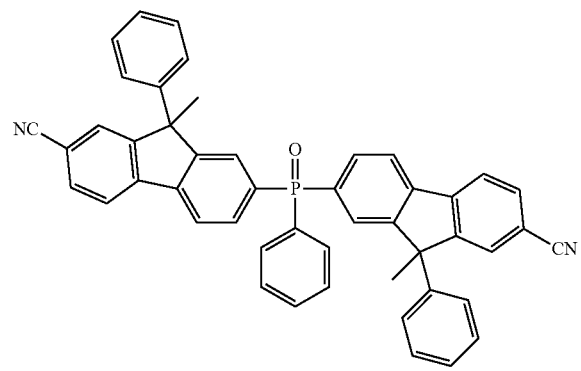
40
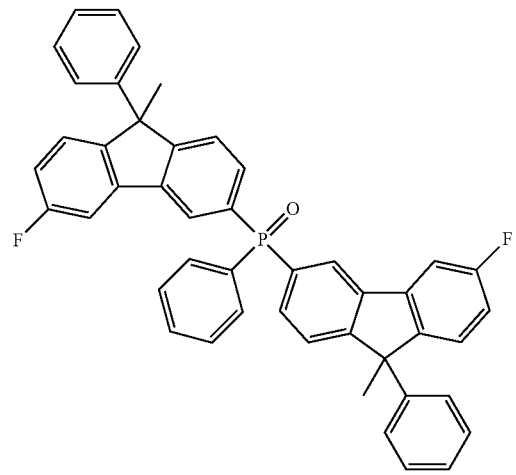
43
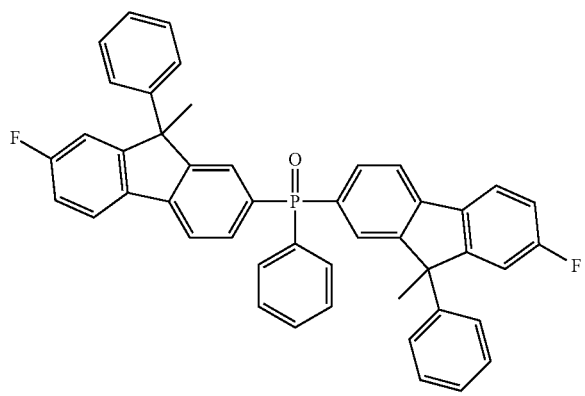
41
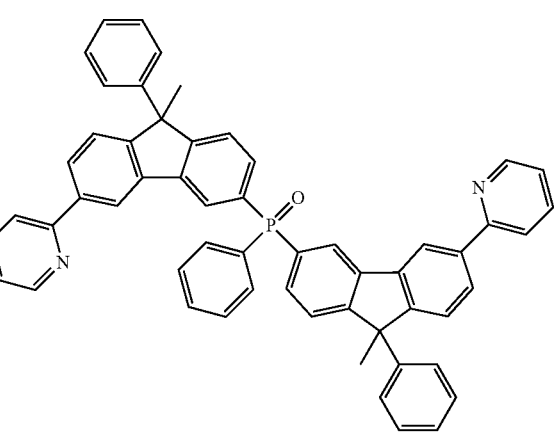
44
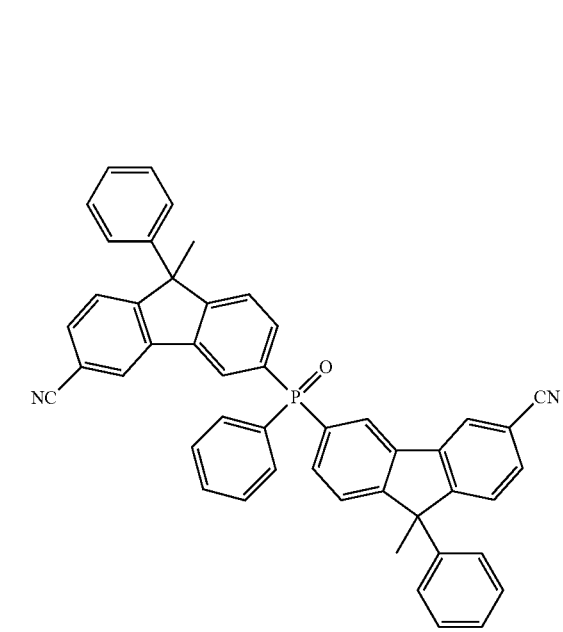
42
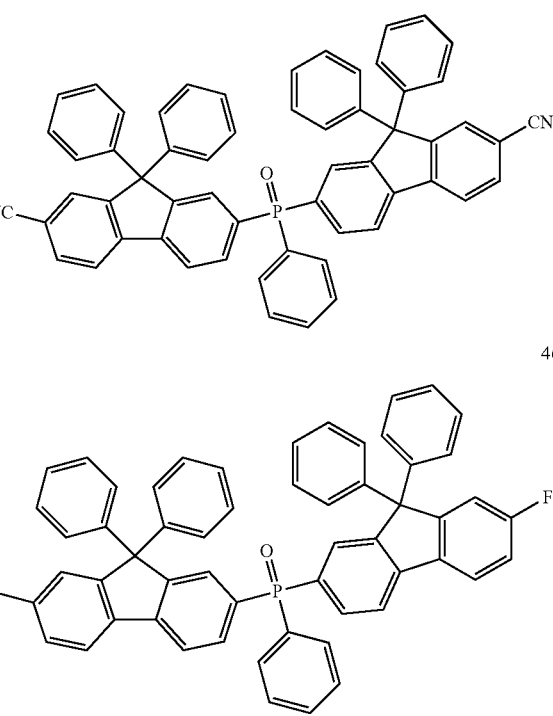
45
46

47
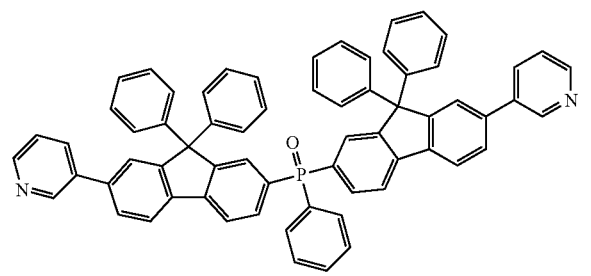
48
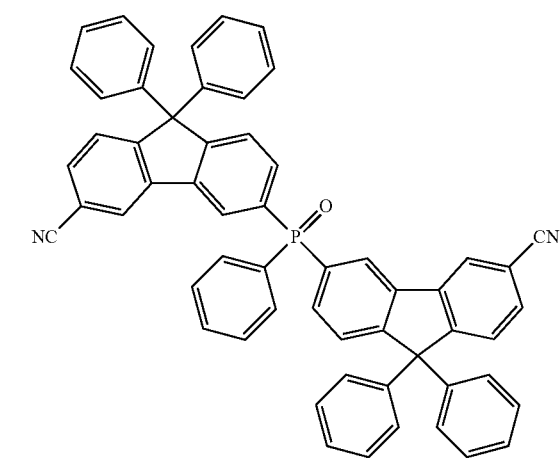
49
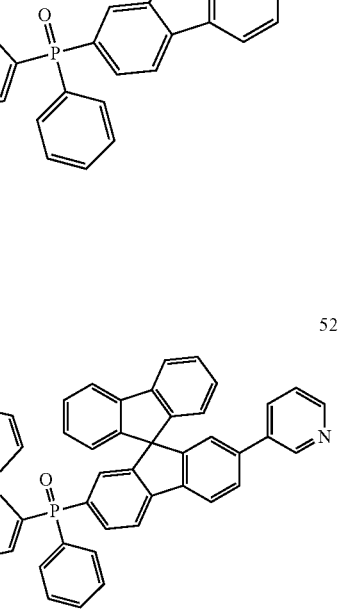
50
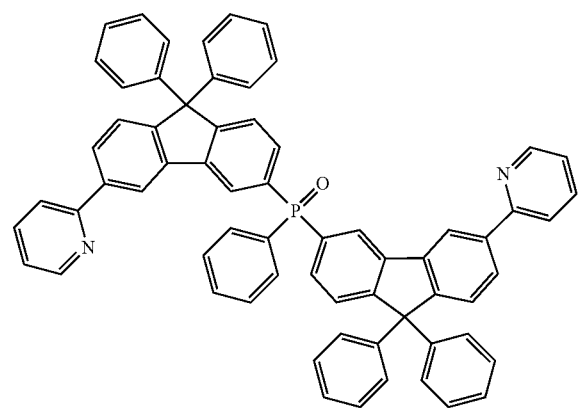
51
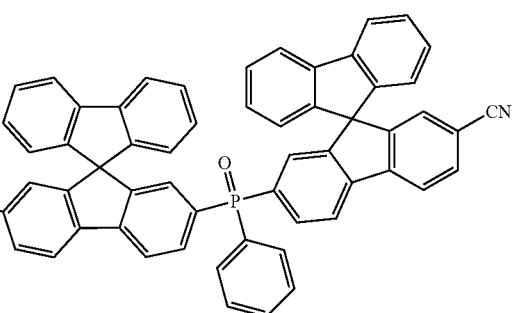
52
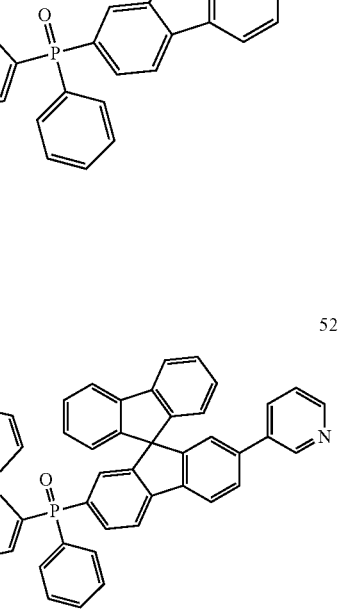
53
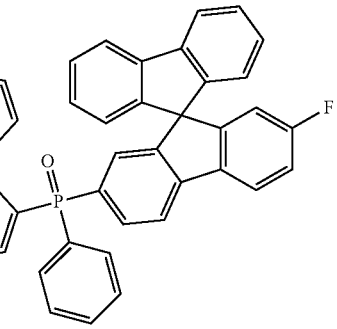
54
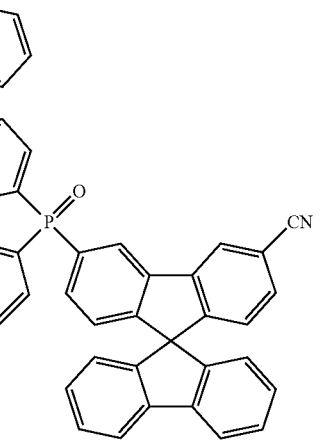

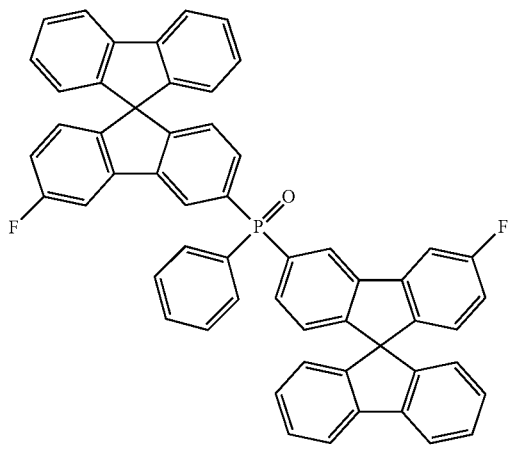

In addition, the condensed cyclic compound represented by Formula 2 according to an embodiment may be represented by the following Formula 4.

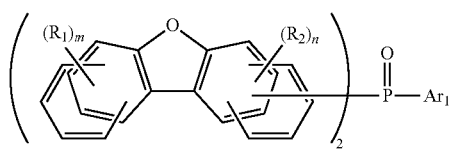

The condensed cyclic compound represented by Formula 4 according to an embodiment may be Formula 2 where both a and b are 1. In particular, Formula 4 may be a case where the condensed cyclic group combined with P is a cyclic group having five rings. In addition, Formula 4 may be Formula 2 in which "A" is O(Oxygen).

In Formula 4, the same explanation on $R_1$, $R_2$, m, n and $Ar_1$ as that for Formula 2 may be applied.

The condensed cyclic compound represented by Formula 4 according to an embodiment may be represented by the following Formula 4-1 or Formula 4-2.

[Formula 4-1]

[Formula 4-2]

In Formula 4-1 and Formula 4-2, the same explanation on $R_1$, $R_2$, m, n and $Ar_1$ as that for Formula 2 may be applied.

The condensed cyclic compound represented by Formula 4 according to an embodiment may be one of the compounds represented in the following Compound Group 3.

[Compound Group 3]

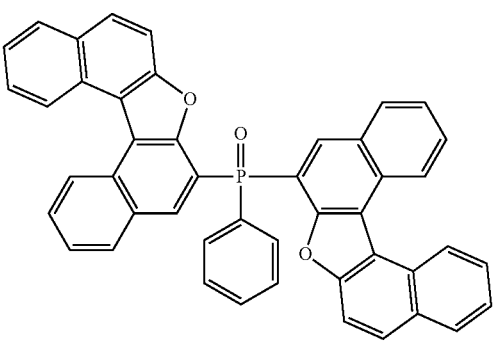

56

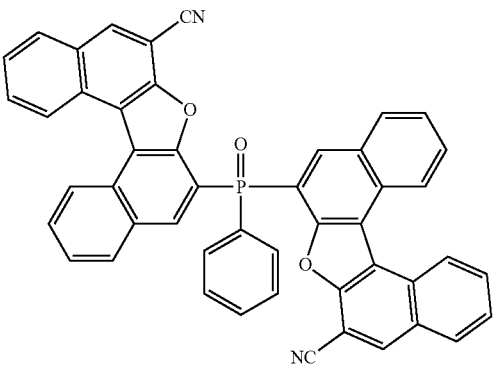

57

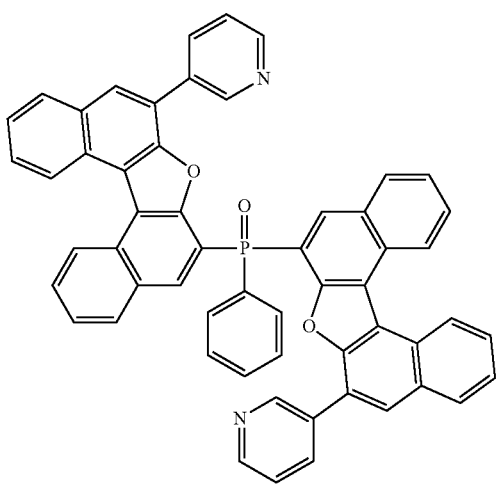

58

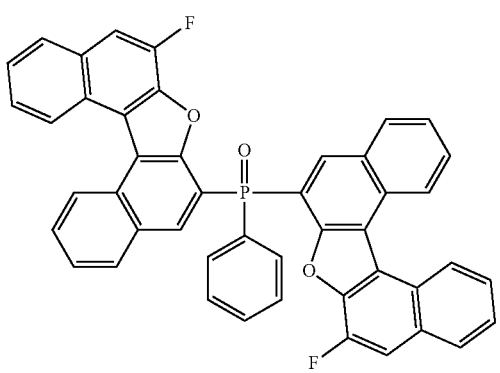

59

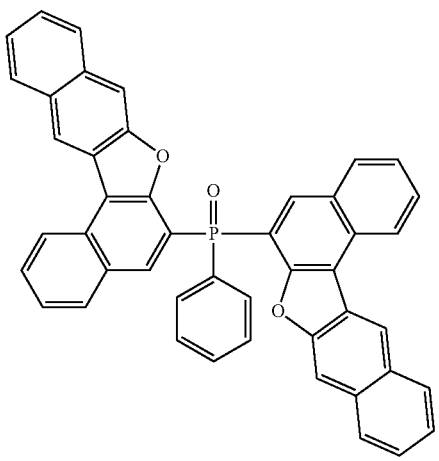

60

Meanwhile, in the condensed cyclic compound represented by Formula 1 according to an embodiment, X and Z may be a substituted or unsubstituted hexagonal hydrocarbon ring, and Y may be a substituted or unsubstituted hexagonal heterocycle. For example, Y may be a substituted or unsubstituted hexagonal heterocycle which contains N as a heteroatom.

Formula 1 may be represented by the following Formula 5.

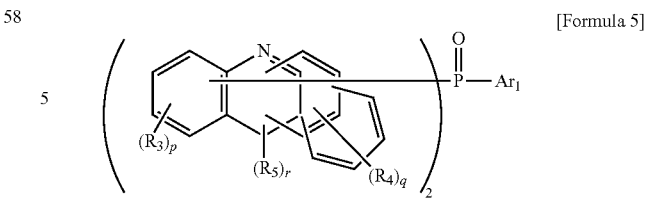

[Formula 5]

Formula 5 may be Formula 1 in which both X and Z are substituted or unsubstituted hexagonal hydrocarbon rings, Y is a substituted or unsubstituted hexagonal heterocycle, and one of a and b is 1. Formula 5 may be a case where the condensed cyclic group combined with P is a cyclic group having four rings.

Each of $R_3$, $R_4$ and $R_5$ may independently be a hydrogen atom, a deuterium atom, a halogen atom, a nitro group, a cyano group, a substituted or unsubstituted silyl group, a substituted or unsubstituted boron group, a substituted or unsubstituted alkyl group having 1 to 50 carbon atoms, a substituted or unsubstituted alkenyl group having 2 to 20 carbon atoms, a substituted or unsubstituted arylamine group, a substituted or unsubstituted aryl group having 6 to 40 carbon atoms for forming a ring, a substituted or unsubstituted heteroaryl group having 3 to 40 carbon atoms for forming a ring, or a substituted or unsubstituted condensed polycyclic group having 6 to 60 carbon atoms for forming a ring.

For example, each of $R_3$ and $R_4$ may independently be a halogen atom, a cyano group, or a substituted or unsubstituted phenyl group. In addition, $R_5$ may be, for example, a substituted or unsubstituted phenyl group.

Each of p and q may independently be an integer of 0 to 4, and r may be 0 or 1. In the case where p is an integer of 2 or more, a plurality of $R_3$ may be the same or different. In the case where q is an integer of 2 or more, a plurality of $R_4$ may be the same or different.

In Formula 5, $Ar_1$ may be a substituted or unsubstituted aryl group having 6 to 30 carbon atoms for forming a ring. In particular, $Ar_1$ may be a substituted or unsubstituted phenyl group. For example, $Ar_1$ may be an unsubstituted phenyl group.

In an embodiment, Formula 5 may be represented by the following Formula 5-1 or Formula 5-2

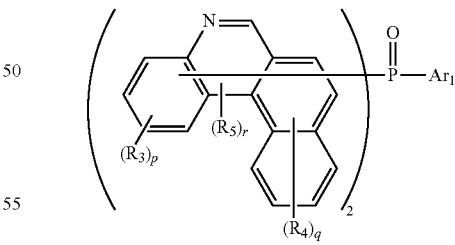

[Formula 5-1]

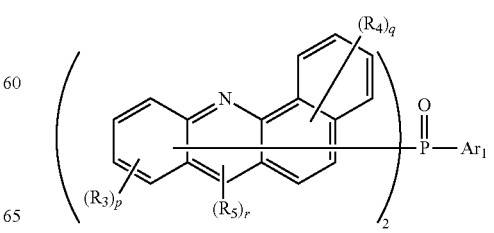

[Formula 5-2]

The same explanation on $R_3$ to $R_5$, p to r and $Ar_1$ as that for Formula 5 will be applied.

The condensed cyclic compound represented by Formula 5 according to an embodiment may be one of the compounds represented in the following Compound Group 4.

[Compound Group 4]

61
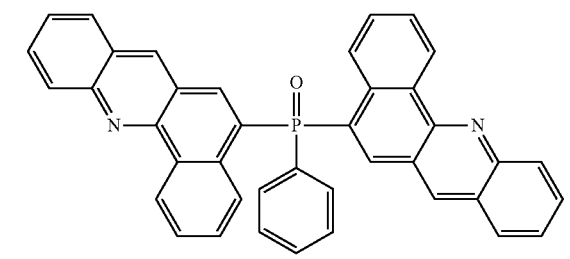

62
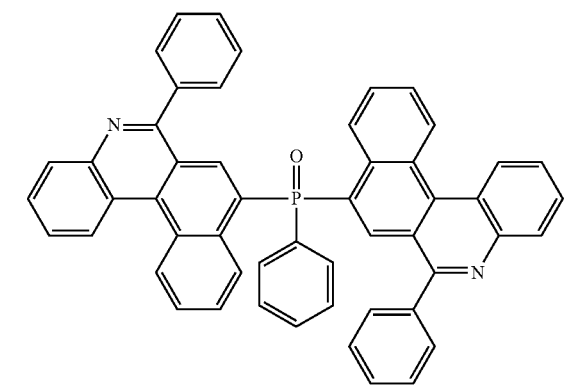

63
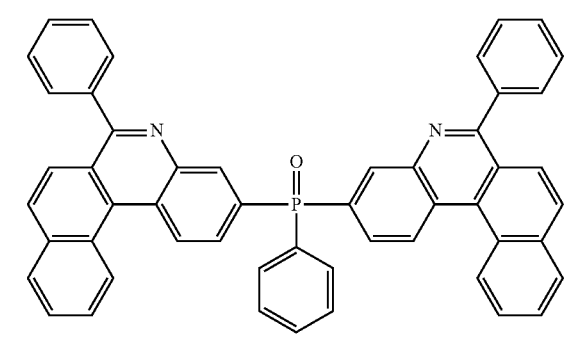

64
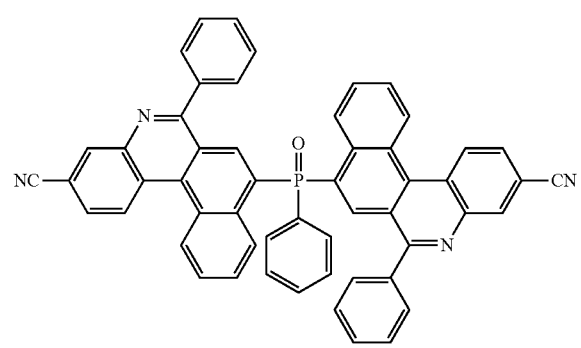

-continued

65
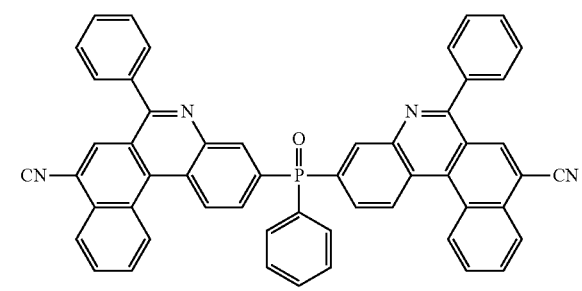

66
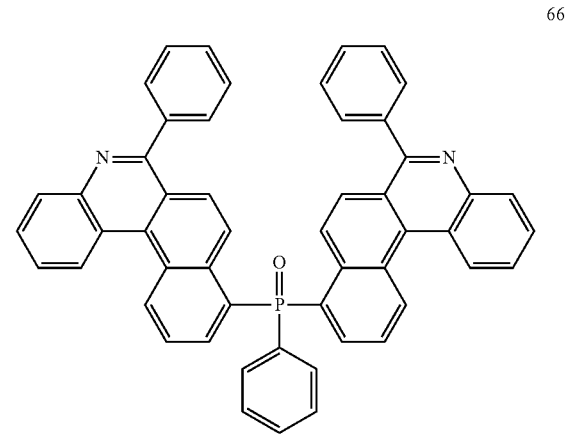

The above-described condensed cyclic compound according to an embodiment may be used in an organic electroluminescence device to improve the efficiency and life of the organic electroluminescence device. In addition, condensed cyclic compound according to an embodiment may decrease the driving voltage of the organic electroluminescence device.

The condensed cyclic compound according to an embodiment includes a cyclic group having three or more rings, and has high glass transition temperature and is highly amorphous. Accordingly, the compound may be used as a material for improving the electrical properties and reliability of an organic electroluminescence device.

In particular, the condensed cyclic compound according to an embodiment is used as a material for an organic electroluminescence device to improve the emission efficiency and life of a luminescent device in a whole emission wavelength region irrespective of an emission wavelength region.

Hereinafter, an organic electroluminescence device according to an embodiment of the inventive concept will be explained. Hereinafter, the above-described condensed cyclic compound according to an embodiment of the inventive concept will not be explained in particular, and unexplained parts will follow the above explanation on the condensed cyclic compound according to an embodiment of the inventive concept.

Figure 2:
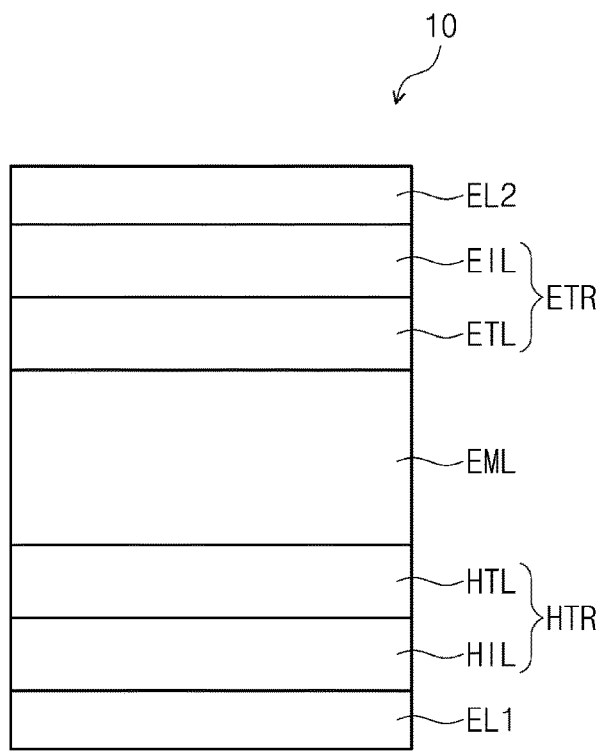
FIG. 2 is a cross-sectional view schematically illustrating an organic electroluminescence device according to an embodiment.

FIG. 1 is a cross-sectional view schematically illustrating an organic electroluminescence device according to an embodiment. FIG. 2 is a cross-sectional view schematically illustrating an organic electroluminescence device according to an embodiment.

Referring to FIGS. 1 and 2, an organic electroluminescence device 10 according to an embodiment of the inventive concept includes a first electrode EL1, a hole transport region HTR, an emission layer EML, an electron transport region ETR, and a second electrode EL2 laminated one by one.

The first electrode EL1 and the second electrode EL2 are disposed at opposite ends of the organic electroluminescence device 10 from each other, and a plurality of organic layers may be disposed between the first electrode EL1 and the second electrode EL2. The plurality of the organic layers may include the hole transport region HTR, the emission layer EML, and the electron transport region ETR.

The organic electroluminescence device 10 according to an embodiment may include the condensed cyclic compound according to an embodiment in at least one of the plurality of the organic layers disposed between the first electrode EL1 and the second electrode EL2. For example, the condensed cyclic compound according to an embodiment may be included in the electron transport region ETR.

In the explanation on the organic electroluminescence device 10 below, a case where the condensed cyclic compound according to an embodiment is included in the electron transport region ETR will be explained. However, an embodiment of the inventive concept is not limited thereto. The condensed cyclic compound according to an embodiment may be included in at least one of the plurality of the organic layers disposed between the first electrode EL1 and the second electrode EL2. For example, an aromatic compound according to an embodiment may be included as a material of the emission layer EML.

The first electrode EL1 has conductivity. The first electrode EL1 may be formed using a metal alloy or a conductive compound. The first electrode EL1 may be an anode.

The first electrode EL1 may be a transmissive electrode, a transflective electrode, or a reflective electrode. In the case where the first electrode EL1 is the transmissive electrode, the first electrode EL1 may be formed using a transparent metal oxide such as indium tin oxide (ITO), indium zinc oxide (IZO), zinc oxide (ZnO), and indium tin zinc oxide (ITZO). In the case where the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may include a plurality of layers including a reflective layer, or a transflective layer formed using the above materials, and a transmissive layer formed using ITO, IZO, ZnO, or ITZO.

The hole transport region HTR is provided on the first electrode EL1. The hole transport region HTR may include at least one of a hole injection layer HIL, a hole transport layer HTL, a hole buffer layer, or an electron blocking layer. The thickness of the hole transport region HTR may be, for example, from about 1,000 Å to about 1,500 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer such as a hole injection layer HIL, or a hole transport layer HTL, and may have a structure of a single layer formed using a hole injection material and a hole transport material. Alternatively, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include an amine compound represented by the following Formula 6.

[Formula 6]

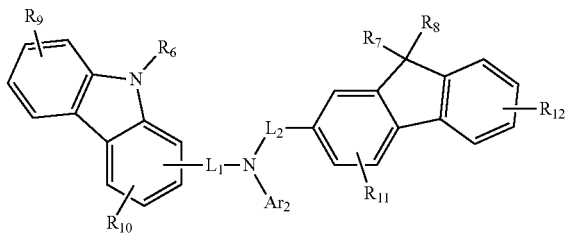

In Formula 6, $Ar_2$ may be a substituted or unsubstituted aryl group having 6 to 30 carbon atoms for forming a ring.

In Formula 6, each of $R_6$ to $R_8$ may independently be a hydrogen atom, a deuterium atom, a halogen atom, a substituted or unsubstituted alkyl group having 1 to 30 carbon atoms, a substituted or unsubstituted aryl group having 6 to 30 carbon atoms for forming a ring, a substituted or unsubstituted heteroaryl group having 4 to 30 carbon atoms for forming a ring, or a substituted or unsubstituted condensed polycyclic group having 6 to 30 carbon atoms for forming a ring, or may combine with an adjacent group to form a ring.

Each of $R_9$ to $R_{12}$ may independently be a hydrogen atom, a deuterium atom, a halogen atom, a hydroxyl group, a substituted or unsubstituted alkyl group having 1 to 30 carbon atoms, a substituted or unsubstituted aryl group having 6 to 30 carbon atoms for forming a ring, or a substituted or unsubstituted heteroaryl group having 4 to 30 carbon atoms for forming a ring.

Each of $L_1$ and $L_2$ may independently be a direct linkage, a substituted or unsubstituted alkylene group having 2 to 30 carbon atoms, a substituted or unsubstituted arylene group having 6 to 30 carbon atoms for forming a ring, or a substituted or unsubstituted heteroarylene group having 4 to 30 carbon atoms for forming a ring.

In the organic electroluminescence device according to an embodiment, the hole transport region may include at least one of the compounds represented in the following Compound Group 6.

[Compound Group 6]
H-1
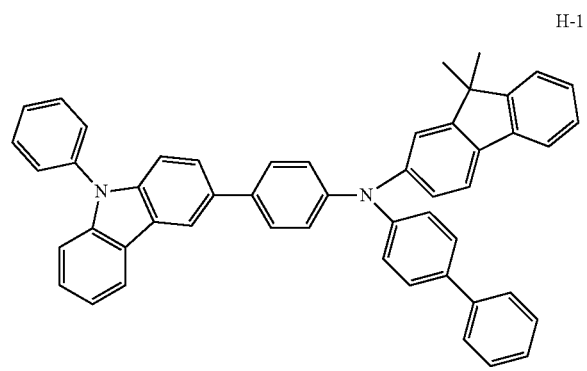
H-2
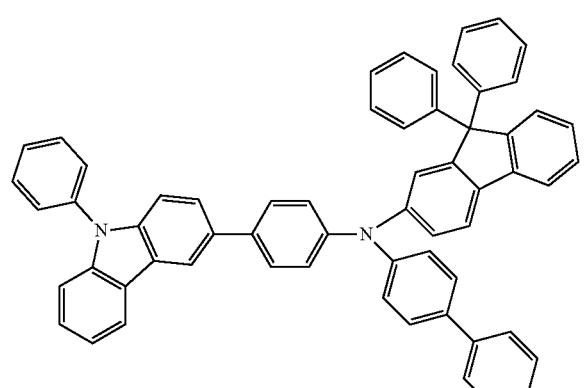
H-3
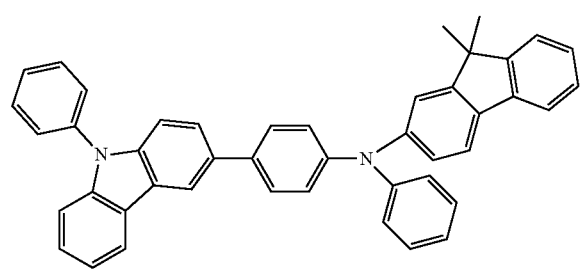
H-4
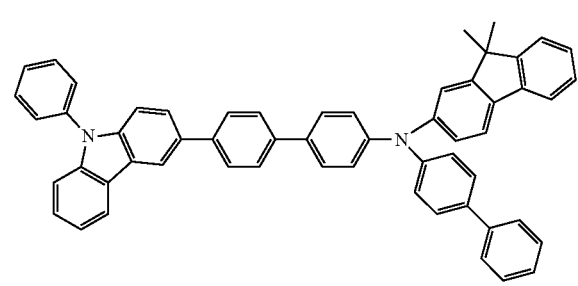
H-5
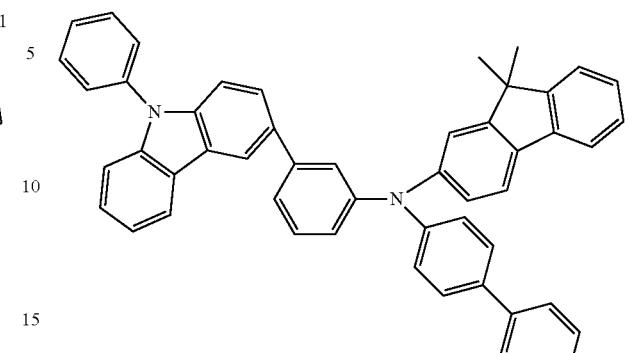
H-6
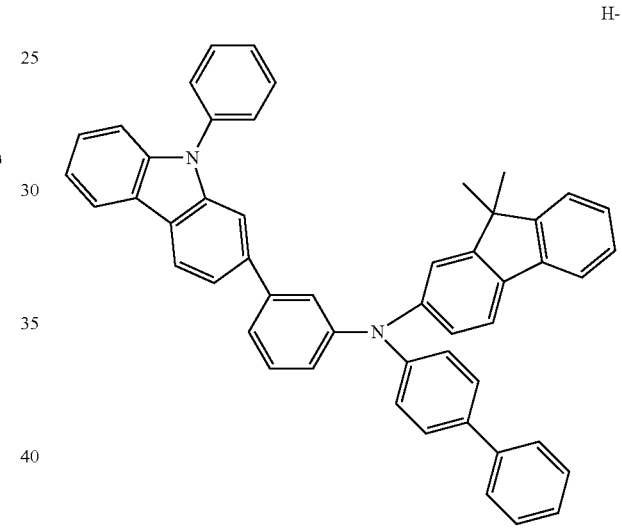
H-7
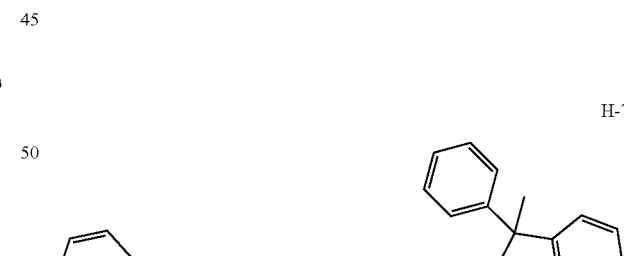

H-8
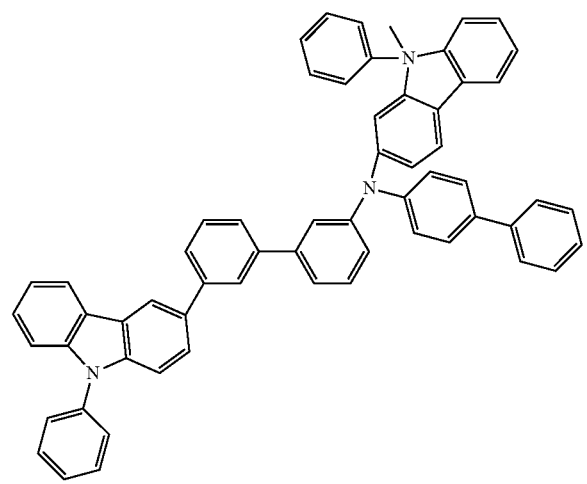
H-9
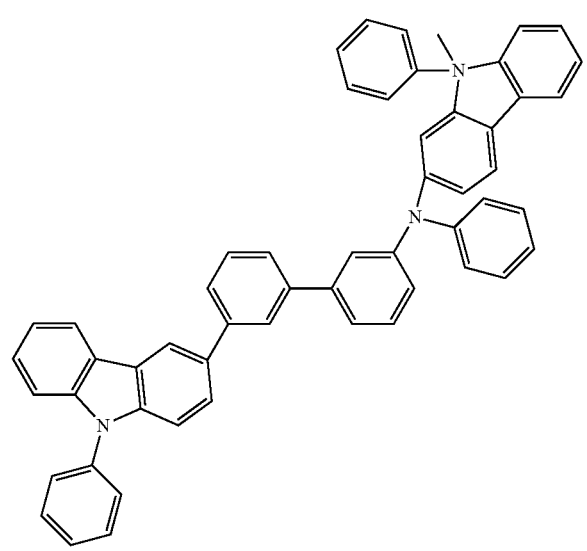
H-10
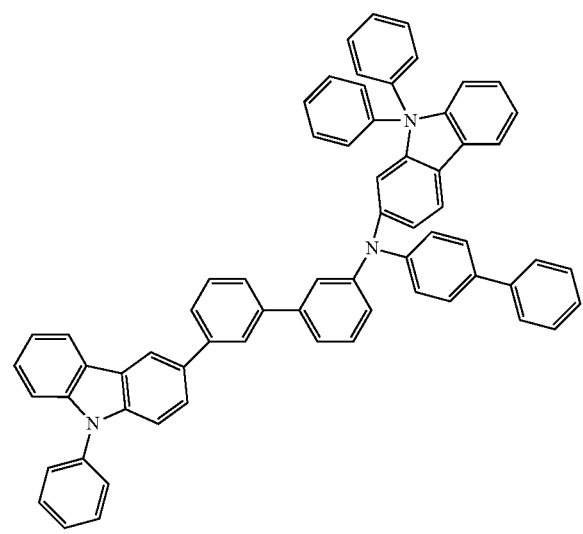
H-11
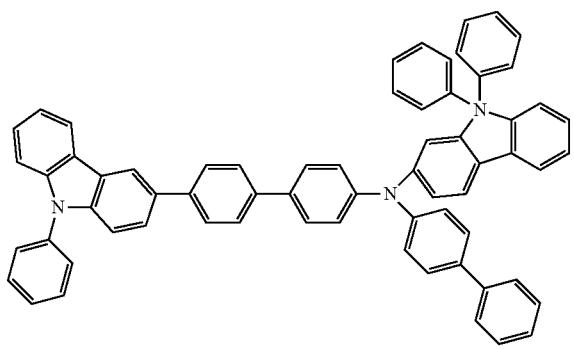
H-12
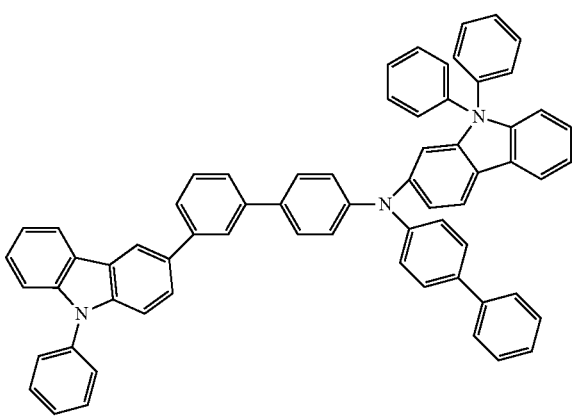
H-13
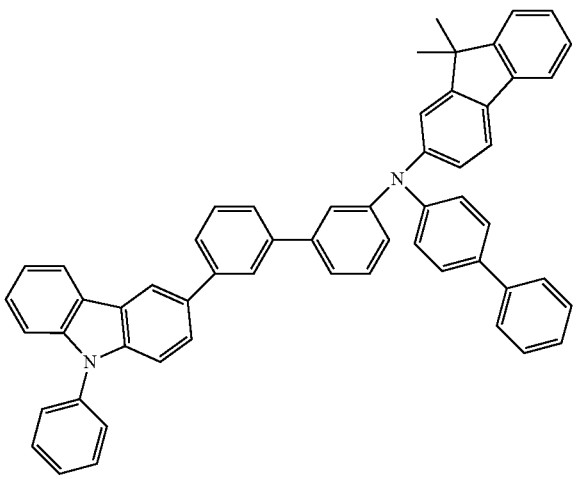

-continued

H-14

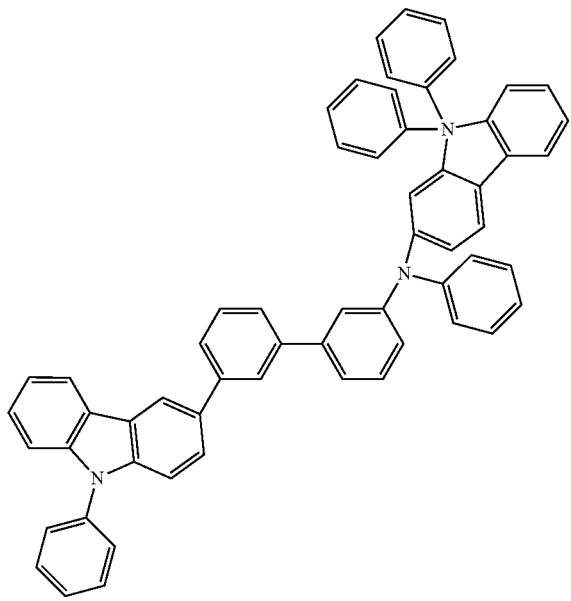

H-15

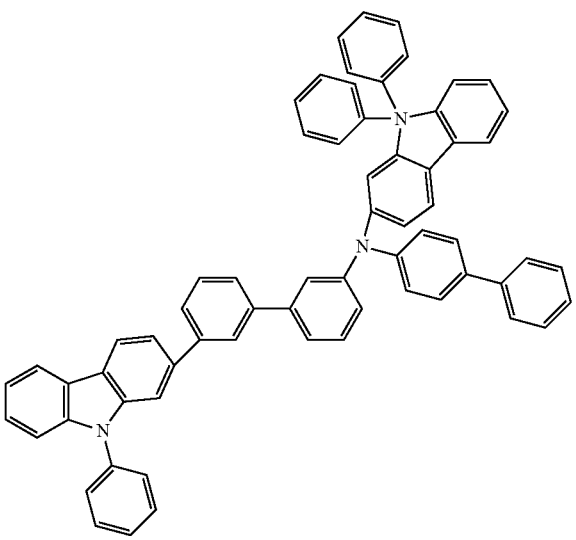

In the case that the hole transport region HTR includes the hole injection layer HIL and the hole transport layer HTL, the amine compound represented by Formula 6 may be included in at least one of the hole injection layer HIL and the hole transport layer HTL.

For example, the amine compound of Formula 6 may be included in the hole transport layer HTL. In the case where the hole transport layer HTL is formed including the amine compound represented by Formula 6, the hole transport layer HTL may further include a known hole transport material in addition to the amine compound. In addition, the hole injection layer HIL may be formed including a known hole injection material.

Examples of the known hole injection material may include, for example, triphenylamine-containing polyetherketone (TPAPEK), 4-isopropyl-4'-methyldiphenyliodoniumtetrakis(pentafluorophenyl)borate (PPBL), N,N'-diphenyl-N,N'-bis-[4-(phenyl-m-tolyl-amino)-phenyl]-phenyl-4,4'-diamine (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenyl-benzidine (NPB), 4,4',4"-tris(N,N-diphenylamino)triphenylamine (TDATA), 4,4',4"-tris(N,N-2-naphthyphenylamino)-triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), or polyaniline/poly(4-styrenesulfonate) (PANI/PSS). However, an embodiment of the inventive concept is not limited thereto.

Examples of the known hole transport material may include, for example, 1,1-bis[(di-4-trileamino)phenyl]cyclohexane (TAPC), carbazole derivatives such as N-phenyl carbazole and polyvinyl carbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), N,N'-di(1-naphtyl)-N,N'-diphenylbenzidine (NPB), etc. However, an embodiment of the inventive concept is not limited thereto.

In addition, the amine compound represented by Formula 6 may be included in the hole injection layer HIL. In the case where the hole injection layer HIL is formed including the amine compound represented by Formula 6, the hole transport layer HTL may be formed including a known hole transport material. In addition, the hole injection layer HIL may be formed including the amine compound represented by Formula 6 with the known hole injection material.

The thickness of the hole transport region HTR may be from about 100 Å to about 10,000 Å, for example, from about 100 Å to about 1,000 Å. In the case where the hole transport region HTR includes both the hole injection layer HIL and the hole transport layer HTL, the thickness of the hole injection layer HIL may be from about 100 Å to about 10,000 Å, for example, from about 100 Å to about 1,000 Å, and the thickness of the hole transport layer HTL may be from about 30 Å to about 1,000 Å. In the case where the thicknesses of the hole transport region HTR, the hole injection layer HIL, and the hole transport layer HTL satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed uniformly or non-uniformly in the hole transport region HTR. The charge generating material may be, for example, a p-dopant. The p-dopant may be one of a quinone derivative, a metal oxide, or a cyano group-containing compound, without limitation. For example, non-limiting examples of the p-dopant may include quinone derivatives such as tetracyanoquinodimethane (TCNQ) and 2,3,5,6-tetrafluoro-tetracyanoquinodimethane (F4-TCNQ), a metal oxide such as tungsten oxide, and molybdenum oxide, without limitation.

As described above, the hole transport region HTR may further include one of a hole buffer layer and an electron blocking layer in addition to the hole transport layer HTL and the hole injection layer HIL. The hole buffer layer may compensate an optical resonance distance according to the wavelength of light emitted from the emission layer EML and increase light emission efficiency. Materials included in the hole transport region HTR may be used as materials included in the hole buffer layer. The electron blocking layer is a layer preventing electron injection from the electron transport region ETR to the hole transport region HTR.

The emission layer EML may be provided on the hole transport region HTR. The thickness of the emission layer EML may be from about 100 Å to about 300 Å. The emission layer EML may have a single layer formed using a single material, a single layer formed using a plurality of different materials, or a multilayer structure having a plurality of layers formed using a plurality of different materials.

The emission layer EML may emit one of red light, green light, blue light, white light, yellow light, or cyan light. The emission layer EML may include a phosphorescent material or a fluorescent material. The emission layer EML may include an arylamine compound, a pyrene compound, or a styryl compound.

In addition, the emission layer EML may include a host or a dopant. The emission layer EML may have a thickness of about 100 Å to about 600 Å.

The host may be any material commonly used without specific limitation and may include, for example, tris(8-hydroxyquinolino)aluminum (Alq3), 4,4'-bis(N-carbazolyl)-1,1'-biphenyl (CBP), poly(N-vinylcarbazole) (PVK), 9,10-di(naphthaline-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), etc.

The dopant may include, for example, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

When the emission layer EML emits red light, the emission layer EML may include, for example, tris(dibenzoylmethanato)phenanthroline europium (PBD:Eu(DBM)$_3$(Phen)), or a phosphorescent material including perylene. In the case where the emission layer EML emits red light, the dopant included in the emission layer EML may be selected from a metal complex or an organometallic complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP), rubrene and the derivatives thereof, or 4-dicyanomethylene-2-(p-dimethylaminostyryl)-6-methyl-4H-pyran (DCM) and the derivatives thereof.

In the case where the emission layer EML emits green light, the emission layer EML may include a phosphorescent material including, for example, tris(8-hydroxyquinolino)aluminum (Alq3). In the case where the emission layer EML emits green light, the dopant included in the emission layer EML may be selected from a metal complex or an organometallic complex such as fac-tris(2-phenylpyridine)iridium (Ir(ppy)3), or a coumarin and the derivatives thereof.

In the case where the emission layer EML emits blue light, the emission layer EML may include a phosphorescent material including at least one selected from the group consisting of, for example, spiro-DPVBi, spiro-6P, distyryl-benzene (DSB), distyryl-arylene (DSA), a polyfluorene (PFO)-based polymer, and a poly(p-phenylene vinylene) (PPV)-based polymer. In the case where the emission layer EML emits blue light, the dopant included in the emission layer EML may be selected from a metal complex or an organometallic complex such as (4,6-F2ppy)$_2$Irpic, or perylene and the derivatives thereof.

The electron transport region ETR is provided on the emission layer EML. The electron transport region ETR may include at least one of an electron blocking layer, an electron transport layer ETL or an electron injection layer EIL. However, an embodiment of the inventive concept is not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of the electron injection layer EIL or the electron transport layer ETL, or a single layer structure formed using an electron injection material and an electron transport material. Further, the electron transport region ETR may have a single layer structure having a plurality of different materials, or a structure laminated from the first electrode EL1 of electron transport layer ETL/electron injection layer EIL, or hole blocking layer/electron transport layer ETL/electron injection layer EIL, without limitation. The thickness of the electron transport region ETR may be, for example, from about 100 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include the above-described condensed cyclic compound according to an embodiment.

In the case where the electron transport region ETR includes an electron transport layer ETL and an electron injection layer EIL, the condensed cyclic compound according to an embodiment may be included in the electron transport layer ETL. However, an embodiment of the inventive concept is not limited thereto. For example, in the case where the electron transport region ETR has a multilayer structure, the condensed cyclic compound according to an embodiment of the inventive concept may be included in a layer adjacent to the emission layer EML, or in each of the layer adjacent to the emission layer EML and the electron transport layer ETL. In the case where the electron transport layer ETL includes the condensed cyclic compound according to an embodiment of the inventive concept, the electron transport layer ETL may include one kind or two or more kinds of the condensed cyclic compounds according to an embodiment.

In particular, the electron transport region ETR may include a condensed cyclic compound represented by the following Formula 1.

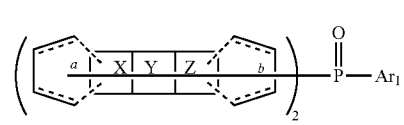

[Formula 1]

In Formula 1, the same explanation on X, Y, Z, a, b and Ar$_1$ as that for the above-described condensed cyclic compound according to an embodiment may be applied.

In addition, in the organic electroluminescence device according to an embodiment, the electron transport region ETR may include a condensed cyclic compound represented by the following Formulae 3 to 5.

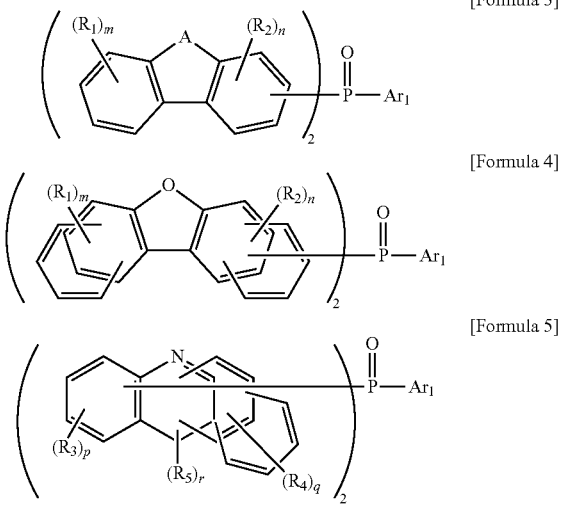

[Formula 3]
[Formula 4]
[Formula 5]

In Formulae 3 to 5, the same explanation on A, $R_1$, $R_2$, $R_3$, $R_4$, $R_5$, m, n, p, q, r and $Ar_1$ as that for the above-described condensed cyclic compound according to an embodiment may be applied.

In the case where the electron transport region ETR includes the electron transport layer ETL, the electron transport region ETR may include a known material in addition to the above-described condensed cyclic compound. For example, the electron transport region ETR may include tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl)anthracene (ADN), or a mixture thereof, without limitation.

In the case where the electron transport region ETR includes the electron transport layer ETL, the thickness of the electron transport layer ETL may be from about 100 Å to about 1,000 Å and may be from about 150 Å to about 500 Å. If the thickness of the electron transport layer ETL satisfies the above-described range, satisfactory electron transport properties may be obtained without substantial increase of a driving voltage.

When the electron transport region ETR includes the electron injection layer EIL, the electron transport region ETR may further include a known material in addition to the condensed cyclic compound according to an embodiment. For example, the electron transport region ETR may include LiF, lithium quinolate (LiQ), $Li_2O$, BaO, NaCl, CsF, a metal in lanthanoides such as Yb, or a metal halide such as RbCl, RbI and KI. However, an embodiment of the inventive concept is not limited thereto. The electron injection layer EIL also may be formed using a mixture material of an electron transport material and an insulating organo metal salt. The organo metal salt may be a material having an energy band gap of about 4 eV or more. Particularly, the organo metal salt may include, for example, metal acetates, metal benzoates, metal acetoacetates, metal acetylacetonates, or metal stearates.

In the case where the electron transport region ETR includes the electron injection layer EIL, the thickness of the electron injection layer EIL may be from about 1 Å to about 100 Å, and from about 3 Å to about 90 Å. In the case where the thickness of the electron injection layer EIL satisfies the above described range, satisfactory electron injection properties may be obtained without inducing the substantial increase of a driving voltage.

The electron transport region ETR may include a hole blocking layer, as described above. The hole blocking layer may include at least one of, for example, 2,9-dimethyl-4,7-diphenyl-1,10-phenanthroline (BCP), or 4,7-diphenyl-1,10-phenanthroline (Bphen). However, an embodiment of the inventive concept is not limited thereto.

The second electrode EL2 may be provided on the electron transport region ETR. The second electrode EL2 has conductivity. The second electrode EL2 may be formed using a metal alloy or a conductive compound. The second electrode EL2 may be a cathode. The second electrode EL2 may be a transmissive electrode, a transflective electrode or a reflective electrode. In the case where the second electrode EL2 is the transmissive electrode, the second electrode EL2 may include a transparent metal oxide, for example, ITO, IZO, ZnO, ITZO, etc.

In the case where the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

Even not shown, the second electrode EL2 may be connected with an auxiliary electrode. In the case where the second electrode EL2 is connected with the auxiliary electrode, the resistance of the second electrode EL2 may decrease.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to produce excitons, and the excitons may emit light via transition from an excited state to a ground state.

In the case where the organic electroluminescence device 10 is a top emission type, the first electrode EL1 may be a reflective electrode and the second electrode EL2 may be a transmissive electrode or a transflective electrode. In the case where the organic electroluminescence device 10 is a bottom emission type, the first electrode EL1 may be a transmissive electrode or a transflective electrode and the second electrode EL2 may be a reflective electrode.

An organic electroluminescence device according to an embodiment of the inventive concept includes a condensed cyclic compound according to an embodiment, thereby having improved emission efficiency and life. In addition, the organic electroluminescence device according to an embodiment includes the condensed cyclic compound in an electron transport region, thereby decreasing the driving voltage and improving the emission efficiency and life of a device.

Hereinafter a condensed cyclic compound and an organic electroluminescence device including the same according to the inventive concept will be explained in more detail with reference to preferred embodiments. The following embodiments are only illustrations to assist the understanding of the inventive concept, and the scope of the inventive concept is not limited thereto.

Examples

1. Synthesis of Condensed Cyclic Compounds

First, a synthetic method of the condensed cyclic compounds according to exemplary embodiments will be explained referring to synthetic methods of Compound 1, Compound 20 and Compound 32 in Compound Group 1, Compound 34 in Compound Group 2, Compound 56 and Compound 60 in Compound Group 3, and Compound 61, Compound 62 and Compound 63 in Compound Group 4. In addition, the following synthetic methods of the condensed cyclic compounds are for illustrations, and the synthetic method of the condensed cyclic compound according to an embodiment of the inventive concept is not limited to the following examples.

Synthesis of Compound 1

Compound 1 which is a condensed cyclic compound according to an embodiment may be synthesized, for example, by the following Reaction 1.

[Reaction 1]

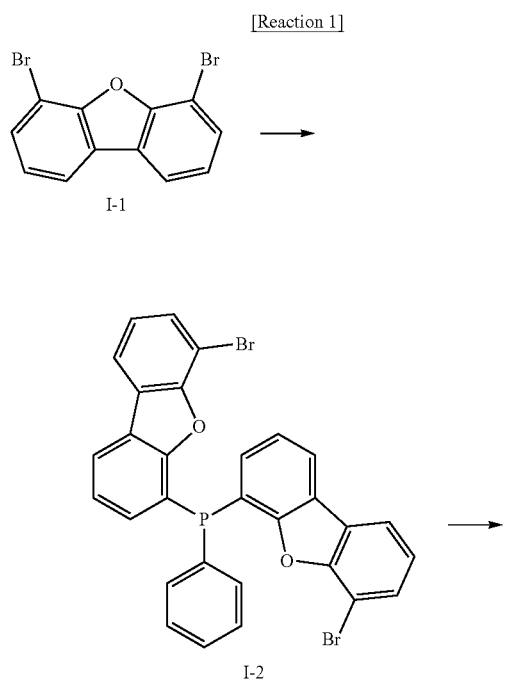

-continued

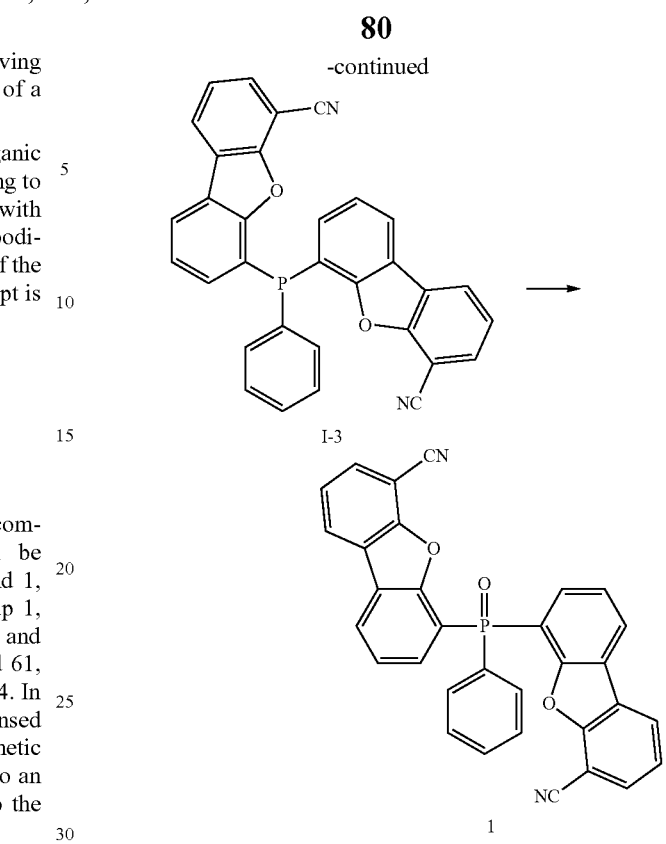

1) Synthesis of Intermediate I-2

6.48 g (20 ml) of 4,6-dibromodibenzo[b,d]furan was dissolved in 100 ml of THF, and 8 ml (2.5 M in hexane) of normal butyllithium was added thereto at about −78° C. After one hour, 1.36 ml (10 mmol) of dichlorophenylphosphine was slowly added dropwisely and stirred for about 3 hours. The temperature was increased to room temperature, water was added, and then, the solution was washed with ethyl acetate (30 ml) three times. The washed ethyl acetate layer was dried with magnesium sulfate ($MgSO_4$) and dried at a reduced pressured to produce a crude product. The crude product thus obtained was separated by silica gel column chromatography to obtain 4.19 g of Intermediate I-23(yield 70%). The product thus obtained was identified by LC-MS ($C_{30}H_{17}Br_2O_2P$: M+1 598.0).

2) Synthesis of Intermediate I-3

5.98 g (10.0 mmol) of Intermediate I-2 and 2.69 g (30.0 mmol) of CuCN were dissolved in 70 ml of DMF and stirred at about 150° C. for about 24 hours. The reaction solution was cooled to room temperature, 60 ml of aqueous ammonia and 60 ml of water were added thereto, and extraction was performed using 50 ml of $CH_2Cl_2$ three times. An organic layer collected was dried with magnesium sulfate ($MgSO_4$), and solvents were evaporated. The crude product thus obtained was separated by silica gel column chromatography to obtain 3.59 g of Intermediate I-3 (yield 73%). The product thus obtained was identified by LC-MS ($C_{32}H_{17}N_2O_2P$: M+1 492.1).

3) Synthesis of Compound 1

4.92 g (10.0 mmol) of Intermediate I-3 was dissolved in 50 ml of dichloromethane, and 4 ml of hydrogen peroxide was added thereto, followed by stirring at room temperature for about 20 hours. 20 ml of water was added thereto, and extraction was performed using 20 ml of CH$_2$Cl$_2$ three times. An organic layer collected was dried with magnesium sulfate (MgSO$_4$), and solvents were evaporated. The crude product thus obtained was separated by silica gel column chromatography to obtain 4.83 g of Compound 1 (yield 95%). The product thus obtained was identified by MS/FAB and $^1$H NMR (C$_{32}$H$_{17}$N$_2$O$_3$P cal. 508.10, found 508.12).

Synthesis of Compound 20

Compound 20 which is a condensed cyclic compound according to an embodiment may be synthesized, for example, by the following Reaction 2.

[Reaction 2]

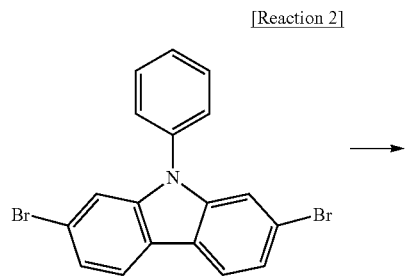

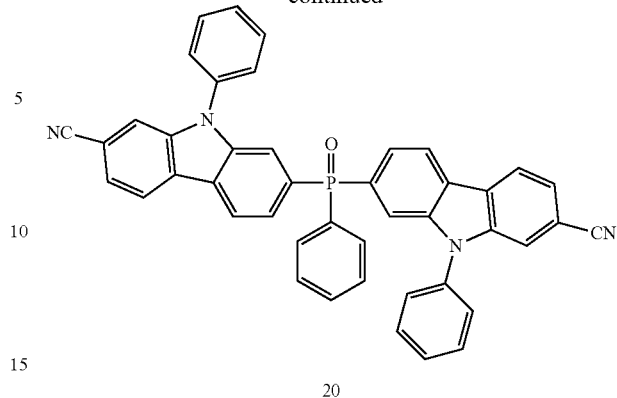

20

6.06 g (yield 92%) of Compound 20 was synthesized by the same method described for synthesizing Compound 1 except for using 2,7-dibromo-9-phenyl-9H-carbazole instead of 4,6-dibromodibenzo[b,d]furan in the synthesis of Intermediate I-1. The product thus obtained was identified by MS/FAB and $^1$H NMR (C$_{44}$H$_{27}$N$_4$OP cal. 658.19, found 658.20).

Synthesis of Compound 32

Compound 32 which is a condensed cyclic compound according to an embodiment may be synthesized, for example, by the following Reaction 3.

[Reaction 3]

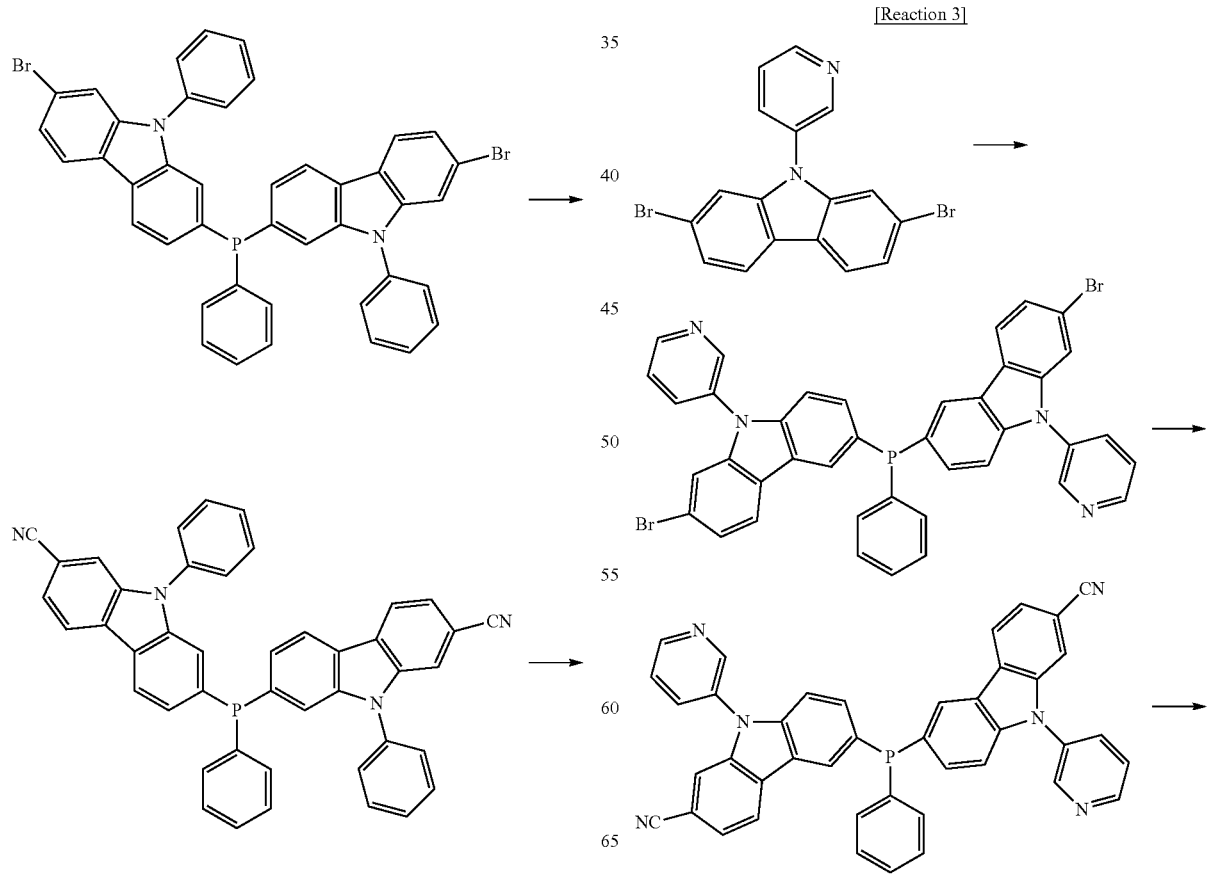

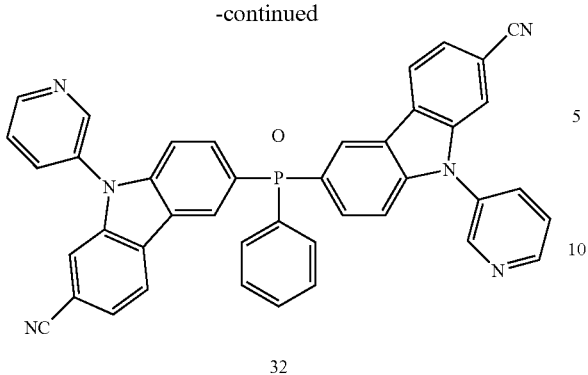

32

5.94 g (yield 90%) of Compound 32 was synthesized by the same method described for synthesizing Compound 1 except for using 2,7-dibromo-9-pyridyl-9H-carbazole instead of 4,6-dibromodibenzo[b,d]furan in the synthesis of Intermediate I-1. The product thus obtained was identified by MS/FAB and $^1$H NMR ($C_{42}H_{25}N_6OP$ cal. 660.18, found 660.19).

Synthesis of Compound 34

Compound 34 which is a condensed cyclic compound according to an embodiment may be synthesized, for example, by the following Reaction 4.

[Reaction 4]

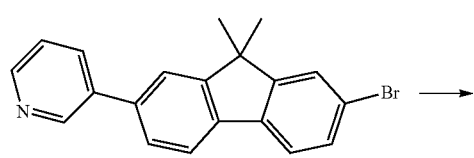

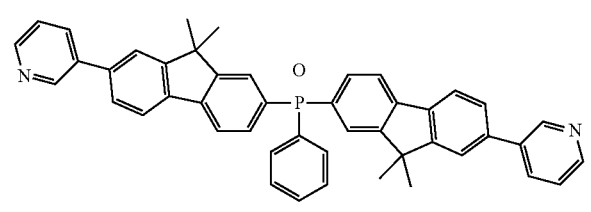

34

6.98 g (20 mmol) of 3-(7-bromo-9,9-dimethyl-9H-fluoren-2-yl)pyridine was dissolved in 100 ml of THF, and 8 ml (2.5 M in hexane) of normal butyllithium was added thereto at about −78° C. After one hour, 1.36 ml (10 mmol) of dichlorophenylphosphine was slowly added dropwise and stirred for about 3 hours. The temperature was increased to room temperature, water was added, and then, the solution was washed with ethyl acetate (30 ml) three times. The washed ethyl acetate layer was dried with magnesium sulfate (MgSO$_4$) and dried at a reduced pressured to obtain an intermediate. The intermediate was dissolved in 40 ml of dichloromethane, and 4 ml of hydrogenperoxide was added thereto, followed by stirring at room temperature for about 20 hours. 20 ml of water was added and extraction was performed using 20 ml of dichloromethane three times. A collected organic layer was dried with magnesium sulfate, and solvents were evaporated. The crude product thus obtained was separated by silica gel column chromatography to obtain 3.99 g of Compound 34 (yield 60%). The product thus obtained was identified by MS/FAB and $^1$H NMR ($C_{46}H_{37}N_2OP$ cal. 664.26, found 664.27).

Synthesis of Compound 56

4.61 g (yield 70%) of Compound 56 was synthesized by the same method described for synthesizing Compound 34 except for using dinaphtho[2,1-b:1',2'-d]furan instead of 3-(7-bromo-9,9-dimethyl-9H-fluoren-2-yl)pyridine. The product thus obtained was identified by MS/FAB and $^1$H NMR ($C_{46}H_{27}O_3P$ cal. 658.17, found 658.18).

Synthesis of Compound 60

4.41 g (yield 67%) of Compound 60 was synthesized by the same method described for synthesizing Compound 34 except for using 6-bromodinaphtho[2,1-b:2',3'-d]furan instead of 3-(7-bromo-9,9-dimethyl-9H-fluoren-2-yl)pyridine. The product thus obtained was identified by MS/FAB and $^1$H NMR ($C_{46}H_{27}O_3P$ cal. 658.17, found 658.17).

Synthesis of Compound 61

5.56 g (yield 76%) of Compound 61 was synthesized by the same method described for synthesizing Compound 34 except for using 8-bromo-6-phenylbenzo[k]phenanthridine instead of 3-(7-bromo-9,9-dimethyl-9H-fluoren-2-yl)pyridine. The product thus obtained was identified by MS/FAB and $^1$H NMR ($C_{52}H_{33}N_2OP$ cal. 580.17, found 580.18).

Synthesis of Compound 62

5.56 g (yield 76%) of Compound 62 was synthesized by the same method described for synthesizing Compound 34 except for using 8-bromo-6-phenylbenzo[k]phenanthridine instead of 3-(7-bromo-9,9-dimethyl-9H-fluoren-2-yl)pyridine. The product thus obtained was identified by MS/FAB and $^1$H NMR ($C_{52}H_{33}N_2OP$ cal. 732.23, found 732.25).

Synthesis of Compound 63

5.35 g (yield 73%) of Compound 63 was synthesized by the same method described for synthesizing Compound 34 except for using 3-bromo-6-phenylbenzo[k]phenanthridine instead of 3-(7-bromo-9,9-dimethyl-9H-fluoren-2-yl)pyridine. The product thus obtained was identified by MS/FAB and $^1$H NMR ($C_{52}H_{33}N_2OP$ cal. 732.23, found 732.22).

Additional compounds were synthesized by the same synthetic route as that of the above-described compounds and using an appropriate intermediate material, and $^1$H NMR and MS/FAB results of the synthesized compounds are shown in Table 1 below.

The synthetic routes of other compounds not shown in Table 1 may be easily recognized referring to the above-described synthetic methods and raw materials by a person skilled in the art.

TABLE 1

| Compound | $^1$H NMR (CDCl$_3$, 400 MHz) δ | MS/FAB found | calc. |
|---|---|---|---|
| 1 | δ = 8.17 (d, 2H), 7.99-7.97 (m, 2H), 7.94-7.89 (m, 2H), 7.86 (d, 2H), 7.79-7.73 (m, 2H), 7.62-7.58 (m, 2H), 7.56-7.51 (m, 1H), 7.36-7.31 (m, 2H), 7.15 (t, 2H) | 508.12 | 508.10 |
| 20 | δ = 8.12-8.09 (m, 2H), 8.03-7.96 (m, 4H), 7.81-7.70 (m, 4H), 7.65-7.47 (m, 13H), 7.45-7.39 (m, 2H), 7.33-7.26 (m, 2H) | 658.20 | 658.19 |
| 32 | δ = 8.67 (d, 2H), 8.50 (d, 2H), 8.41-8.39 (m, 2H), 8.15 (d, 2H), 8.10-8.08 (m, 2H), 7.83-7.80 (m, 2H), 7.69-7.60 (m, 8H), 7.52-7.48 (m, 1H), 7.45-7.37 (m, 4H) | 660.19 | 660.18 |
| 34 | δ = 8.94 (dd, 2H), 8.66-8.63 (m, 2H), 8.06-8.03 (m, 2H), 7.72-7.54 (m, 12H), 7.52-7.39 (m, 5H), 7.25 (t, 2H), 1.51 (s, 12H) | 664.27 | 664.26 |
| 56 | δ = 8.52-8.50 (m, 2H), 8.31-8.29 (m, 2H), 8.09 (d, 2H), 8.05 (d, 2H), 7.92-7.90 (m, 2H), 7.82-7.75 (m, 6H), 7.70 (d, 2H), 7.64-7.51 (m, 5H), 7.42-7.31 (m, 4H) | 658.18 | 658.17 |
| 60 | δ = 8.98-8.96 (m, 2H), 8.74-8.72 (m, 2H), 8.21 (s, 2H), 8.17-8.15 (m, 2H), 8.09 (d, 2H), 7.94-7.92 (m, 2H), 7.82-7.74 (m, 4H), 7.56-7.30 (m, 11H) | 658.17 | 658.17 |
| 61 | δ = 8.93 (d, 2H), 8.50 (s, 2H), 8.48-8.45 (m, 2H), 8.34 (dd, 2H), 8.13 (dd, 2H), 7.83-7.79 (m, 2H), 7.65-7.58 (m, 6H), 7.56-7.37 (m, 7H) | 580.18 | 580.17 |
| 62 | δ = 9.05-8.03 (m, 2H), 8.87-8.85 (m, 2H), 8.78-8.74 (m, 2H), 8.27-8.21 (m, 4H), 7.86-7.79 (m, 6H), 7.75-7.51 (m, 13H), 7.42-7.37 (m, 2H), 7.31-7.27 (m, 2H) | 732.25 | 732.23 |
| 63 | δ = 8.89-8.86 (m, 2H), 8.59-8.57 (m, 2H), 8.38-8.32 (m, 4H), 7.94-7.86 (m, 6H), 7.78-7.70 (m, 4H), 7.65-7.59 (m, 6H), 7.52-7.39 (m, 9H) | 732.22 | 732.23 |

2. Manufacture and Evaluation of Organic Electroluminescence Devices Including Condensed Cyclic Compounds (Manufacture of Organic Electroluminescence Device)

An organic electroluminescence device according to an embodiment, including a condensed cyclic compound according to an embodiment in an electron transport region was manufactured by the following method. For example, the electron transport region of the organic electroluminescence device according to an embodiment includes an electron injection layer and an electron transport layer, and a case of including a condensed cyclic compound according to an embodiment in the electron transport layer will be explained for illustration.

A first electrode was formed using an ITO substrate having a thickness of about 1,200 Å. The ITO substrate was prepared by cleaning by an ultrasonic method using isopropyl alcohol and pure water for 5 minutes for each and then by irradiating ultraviolet light for 30 minutes and being exposed to ozone. The ITO substrate thus cleansed was installed in a vacuum deposition apparatus.

On the cleansed and prepared ITO substrate, a hole injection layer was formed by depositing 2-TNATA in vacuum. The hole injection layer was formed to a thickness of about 600 Å. On the hole injection layer, 4,4'-bis[N-(1-naphthyl)-N-phenylamino]biphenyl (NPB) was deposited in vacuum to form a hole transport layer. The hole transport layer was formed to a thickness of about 300 Å.

Then, 9,10-naphthalene-2-yl-anthracene (ADN) as a blue fluorescent host and 4,4'-bis[2-(4-(N,N-diphenylamino)phenyOvinyl]biphenyl (DPAVBi) as a blue fluorescent dopant were co-deposited in a weight ratio of 98:2 on the hole transport layer to form an emission layer with a thickness of about 300 Å.

The electron transport layer on the emission layer was formed to include the condensed cyclic compound according to an embodiment. The electron transport layer was formed to a thickness of about 300 Å. The condensed cyclic compounds according to exemplary embodiments, which were included in the electron transport layer, are shown in Table 1. On the electron transport layer, LiF, which is an alkali metal halide, was deposited to a thickness of about 10 Å to form an electron injection layer. Then, Al was deposited to a thickness of about 3,000 Å to form a second electrode.

In Comparative Example 1, an organic electroluminescence device was manufactured by performing the same manufacturing method of the organic electroluminescence device of the example except for using Comparative Compound c1 in the electron transport layer. Compounds used for forming the electron transport layers according to Examples 1 to 10 and Comparative Example 1 are shown in Table 2 below.

TABLE 2
Compound 1
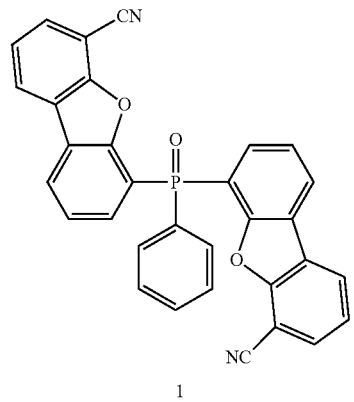 [SMILES: N#Cc1cccc2c1oc1c(P(=O)(c3ccccc3)c3cccc4c3oc3c(C#N)cccc34)cccc12]
1
Compound 20
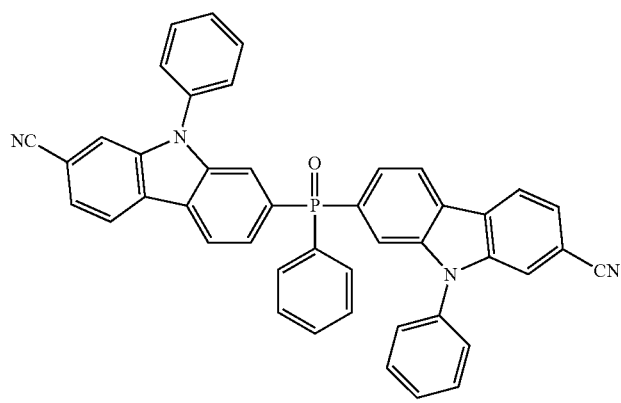
20
Compound 32
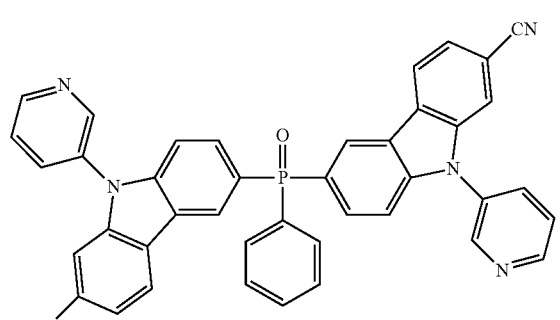
32
Compound 34
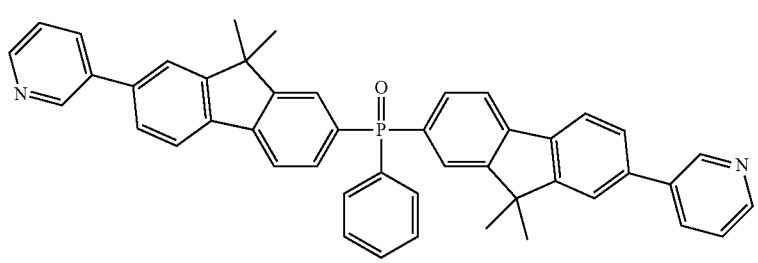
34

TABLE 2-continued
Compound 56
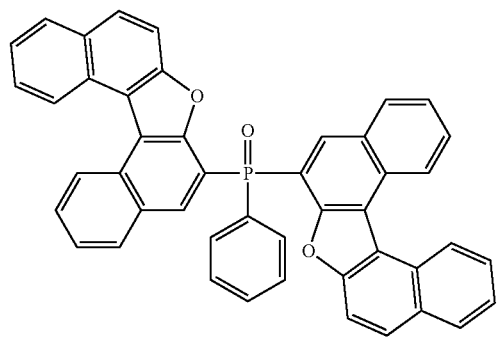
56
Compound 60
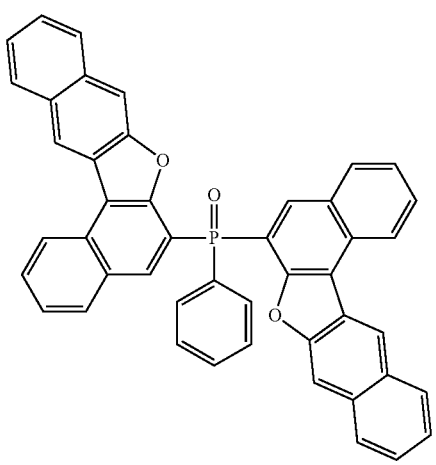
60
Compound 61
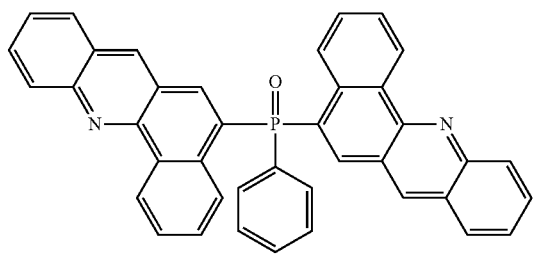
61
Compound 62
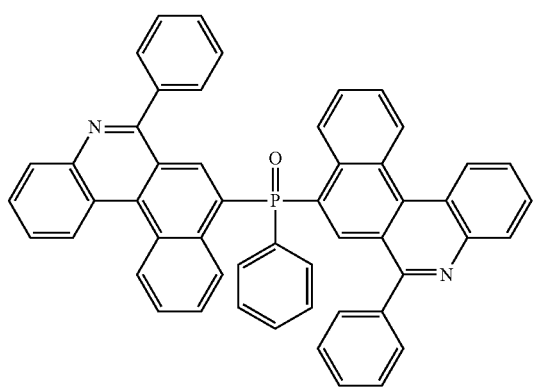
62

TABLE 2-continued

Compound 63

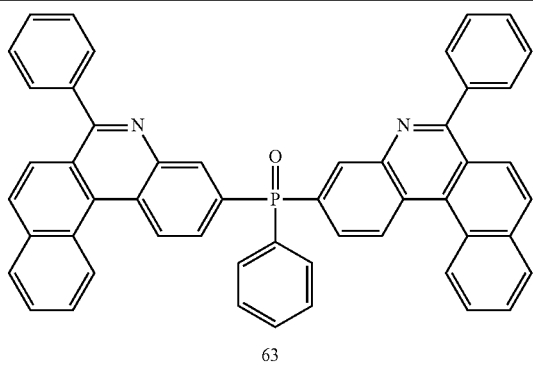

63

Comparative Compound C1

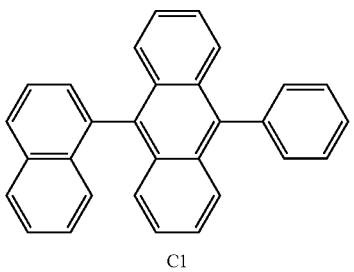

C1

(Evaluation of Properties of Organic Electroluminescence Device)

In order to evaluate the properties of the organic electroluminescence devices according to the examples and the comparative example, a driving voltage, emission efficiency and half life were measured. The emission efficiency corresponds to a value on a current density of about 50 mA/cm$^2$. In addition, the initial current density of the half life was about 50 mA/cm$^2$. The luminescence devices used in the examples and the comparative example were blue emitting organic electroluminescence devices. The evaluation results on the properties of the organic electroluminescence devices are shown in Table 3 below.

Examples 1 to 9 correspond to organic electroluminescence devices including Compound 1, Compound 20, Compound 32, Compound 34, Compound 56, Compound 60, Compound 61, Compound 62 and Compound 63, respectively, in an electron transport layer. Comparative Example 1 corresponds to an organic electroluminescence device including Comparative Compound C1 in an electron transport layer. Example 10 corresponds to an organic electroluminescence device including Compound 62 in an electron transport layer and Compound H-1 in a hole transport layer.

Referring to Table 3, it may be confirmed that the organic electroluminescence devices of Examples 1 to 10 have longer life-time and higher efficiency than the organic elec-

TABLE 3

| Division | Electron transport layer | Hole transport layer | Voltage (V) | Luminance (cd/m$^2$) | Emission efficiency (cd/A) | Half life (hrs) |
|---|---|---|---|---|---|---|
| Example 1 | Compound 1 | NPB | 3.56 | 3,560 | 7.12 | 705 |
| Example 2 | Compound 20 | NPB | 3.30 | 3,800 | 7.60 | 700 |
| Example 3 | Compound 32 | NPB | 3.36 | 3,775 | 7.55 | 711 |
| Example 4 | Compound 34 | NPB | 3.22 | 3,860 | 7.72 | 756 |
| Example 5 | Compound 56 | NPB | 3.31 | 3,950 | 7.90 | 715 |
| Example 6 | Compound 60 | NPB | 3.29 | 3,935 | 7.87 | 721 |
| Example 7 | Compound 61 | NPB | 3.32 | 3,785 | 7.57 | 713 |
| Example 8 | Compound 62 | NPB | 3.30 | 3,885 | 7.77 | 725 |
| Example 9 | Compound 63 | NPB | 3.36 | 3,870 | 7.74 | 736 |
| Example 10 | Compound 62 | H-1 | 3.20 | 4,020 | 8.04 | 757 |
| Comparative Example 1 | Comparative Compound C1 | NPB | 4.28 | 3,250 | 6.50 | 485 | troluminescence device of Comparative Example 1. In addition, the organic electroluminescence devices of Examples 1 to 10 have lower driving voltage and higher luminance than the organic electroluminescence device of Comparative Example 1.

In addition, Example 10 was found to have a lower driving voltage and a higher luminance value when compared to Comparative Example 1, because the condensed cyclic compound according to an embodiment was included in the electron transport layer, and an amine compound according to an embodiment was included in the hole transport layer. In particular, Example 10 was found to have a lower driving voltage and a higher luminance value, and good emission efficiency and half life when compared to Examples 1 to 9, because an organic electroluminescence device was attained by including the condensed cyclic compound according to an embodiment in the electron transport layer, and an amine compound according to an embodiment in the hole transport layer.

That is, the organic electroluminescence devices including the condensed cyclic compound according to an embodiment in the electron transport layer exhibited better efficiency and longer life-time when compared to an organic electroluminescence device including a known electron transport material in the electron transport layer. In addition, the organic electroluminescence devices including the condensed cyclic compound according to an embodiment in the electron transport layer has a decreased driving voltage by about 1 V or more and good I-V-L properties when compared to the organic electroluminescence device including a known electron transport material in the electron transport layer.

Since the condensed cyclic compound according to an embodiment has a high glass transition temperature and good charge transport properties, an organic electroluminescence device using the compound as a material for an organic electroluminescence device may have improved electrical properties and emission properties.

In addition, the condensed cyclic compound according to an embodiment may be included as a material for an electron transport region. An organic electroluminescence device including the condensed cyclic compound in the electron transport region may have high efficiency, long life-time, a low driving voltage, and high luminance. In particular, an organic electroluminescence device according to an embodiment, including the condensed cyclic compound according to an embodiment in an electron transport region, including a luminescence device emitting various colors such as red, green and white as well as a blue luminescence device, may exhibit high efficiency and long life.

A condensed cyclic compound according to an embodiment may improve the life and efficiency of an organic electroluminescence device.

An organic electroluminescence device according to an embodiment includes a condensed cyclic compound according to an embodiment in an electron transport region and may attain high efficiency and long life-time.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A condensed cyclic compound represented by the following Formula 1:

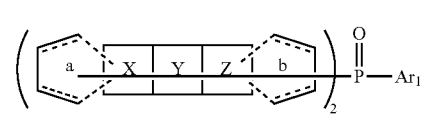

where X and Z are each independently a substituted or unsubstituted pentagonal hydrocarbon ring, a substituted or unsubstituted hexagonal hydrocarbon ring, a substituted or unsubstituted pentagonal heterocycle, or a substituted or unsubstituted hexagonal heterocycle, Y is a substituted or unsubstituted pentagonal heterocycle, the pentagonal heterocycle and the hexagonal heterocycle each independently includes one heteroatom, a and b are each independently 0 or 1, Y is not a pentagonal heterocycle with an N, a quinolinyl group or

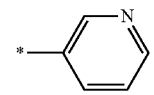

is bonded to X if Y is a pentagonal heterocycle with an oxygen atom or a sulfur atom, and $Ar_1$ is an unsubstituted phenyl group.

2. The condensed cyclic compound of claim 1, wherein Formula 1 is represented by the following Formula 2:

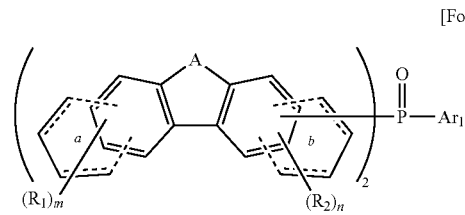

where A is O or S, $R_1$ and $R_2$ are each independently a hydrogen atom, a deuterium atom, a halogen atom, a nitro group, a cyano group, a substituted or unsubstituted silyl group, a substituted or unsubstituted boron group, a substituted or unsubstituted alkyl group having 1 to 50 carbon atoms, a substituted or unsubstituted alkenyl group having 2 to 20 carbon atoms, a substituted or unsubstituted arylamine group, a substituted or unsubstituted aryl group having 6 to 40 carbon atoms for forming a ring, a substituted or unsubstituted heteroaryl having 3 to 40 carbon atoms for forming a ring, or a substituted or unsubstituted condensed polycyclic group having 6 to 60 carbon atoms for forming a ring, $R_1$ is a quinolinyl group or

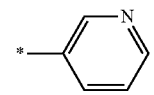

if A is O or S, m is an integer of 1 to 4, n is an integer of 0 to 4, and a, b, and $Ar_1$ are the same as defined in formula 1.

3. The condensed cyclic compound of claim 2, wherein Formula 2 is represented by the following Formula 3:

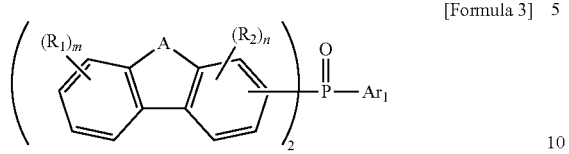

[Formula 3]

where A, $R_1$, $R_2$, m, n and $Ar_1$ are the same as defined in Formula 2.

4. The condensed cyclic compound of claim 2, wherein Formula 2 is represented by the following Formula 4:

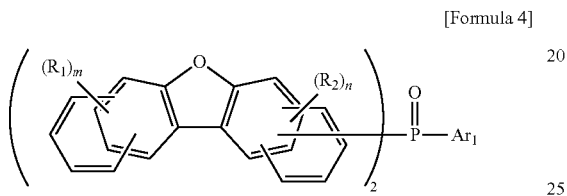

[Formula 4]

where $R_1$, $R_2$, m, n and $Ar_1$ are the same as defined in Formula 2.

5. The condensed cyclic compound of claim 4, wherein Formula 4 is represented by the following Formula 4-1 or Formula 4-2:

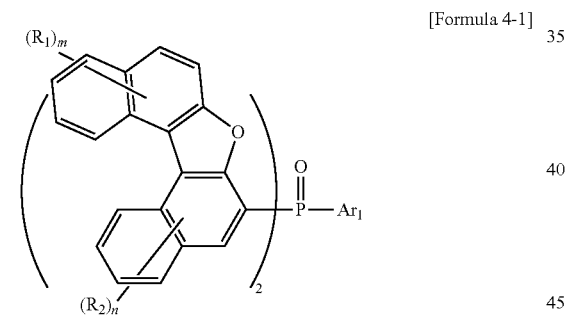

[Formula 4-1]

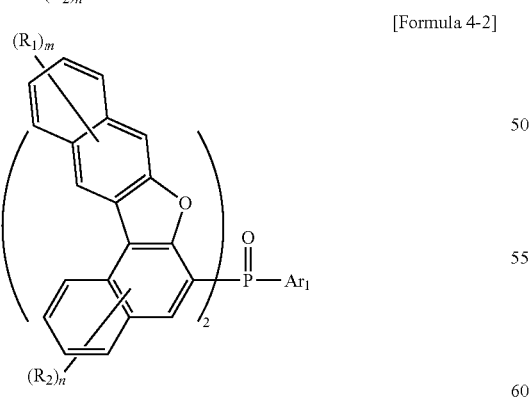

[Formula 4-2]

where $R_1$, $R_2$, m, n and $Ar_1$ are the same as defined in Formula 2.

6. The condensed cyclic compound of claim 3, wherein the condensed cyclic compound represented by Formula 3 is one selected from compounds represented in the following Compound Group 1:

[Compound Group 1]

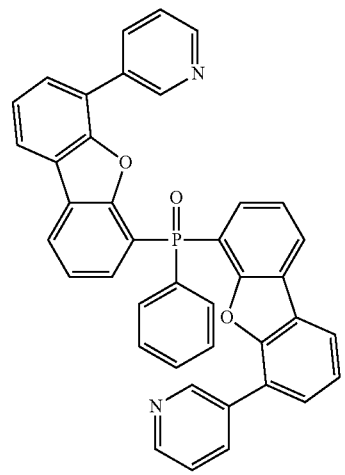

2

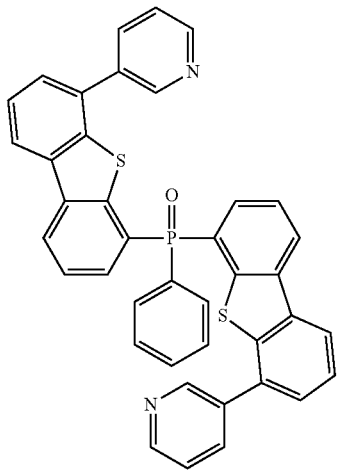

10

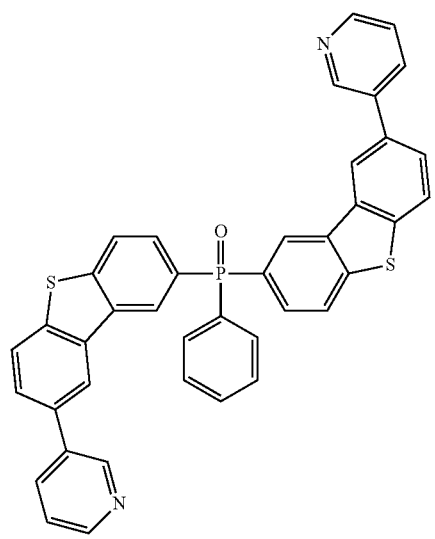

14

7. The condensed cyclic compound of claim 4, wherein the condensed cyclic compound represented by Formula 4 is one selected from compounds represented in the following Compound Group 3:

[Compound Group 3]

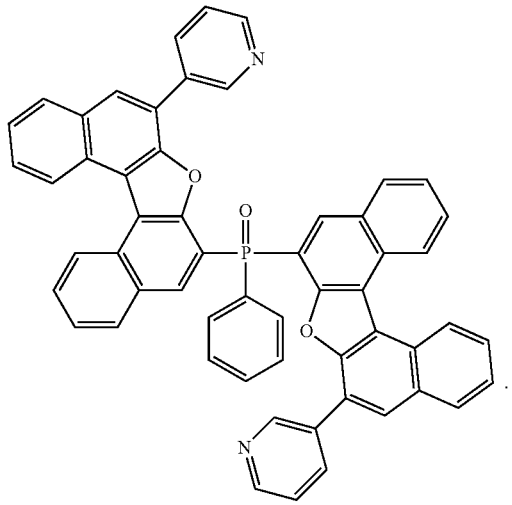

58

8. An organic electroluminescence device, comprising:
a first electrode;
a hole transport region disposed on the first electrode;
an emission layer disposed on the hole transport region;
an electron transport region disposed on the emission layer; and
a second electrode disposed on the electron transport region, wherein
the electron transport region comprises a condensed cyclic compound represented by the following Formula 1:

[Formula 1]

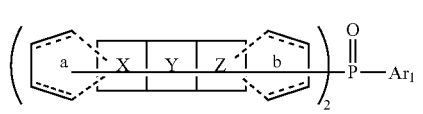

where X and Z are each independently a substituted or unsubstituted pentagonal hydrocarbon ring, a substituted or unsubstituted hexagonal hydrocarbon ring, a substituted or unsubstituted pentagonal heterocycle, or a substituted or unsubstituted hexagonal heterocycle,
Y is a substituted or unsubstituted pentagonal heterocycle,
the pentagonal heterocycle and the hexagonal heterocycle each independently includes one heteroatom,
a and b are each independently 0 or 1,
Y is not a pentagonal heterocycle with an N,
a quinolinyl group or

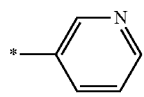 [SMILES: *c1cccnc1]

is bonded to X if Y is a pentagonal heterocycle with an oxygen atom or a sulfur atom, and
$Ar_1$ is an unsubstituted phenyl group.
9. The organic electroluminescence device of claim 8, wherein Formula 1 is represented by the following Formula 3:

[Formula 3]

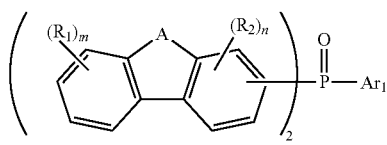

where A is O or S,
$R_1$ and $R_2$ are each independently a hydrogen atom, a deuterium atom, a halogen atom, a nitro group, a cyano group, a substituted or unsubstituted silyl group, a substituted or unsubstituted boron group, a substituted or unsubstituted alkyl group having 1 to 50 carbon atoms, a substituted or unsubstituted alkenyl group having 2 to 20 carbon atoms, a substituted or unsubstituted arylamine group, a substituted or unsubstituted aryl group having 6 to 40 carbon atoms for forming a ring, a substituted or unsubstituted heteroaryl group having 3 to 40 carbon atoms for forming a ring, or a substituted or unsubstituted condensed polycyclic group having 6 to 60 carbon atoms for forming a ring,
m is an integer of 1 to 4,
n is an integer of 0 to 4,
$R_1$ is a quinolinyl group or

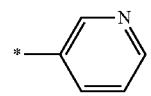

if A is O or S, and
$Ar_1$ is the same as defined in Formula 1.
10. The organic electroluminescence device of claim 8, wherein Formula 1 is represented by the following Formula 4:

[Formula 4]

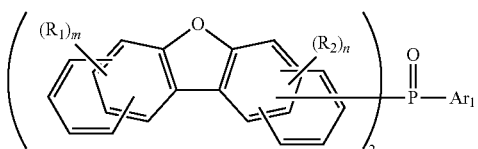

where $R_1$ and $R_2$ are each independently a hydrogen atom, a deuterium atom, a halogen atom, a nitro group, a cyano group, a substituted or unsubstituted silyl group, a substituted or unsubstituted boron group, a substituted or unsubstituted alkyl group having 1 to 50 carbon atoms, a substituted or unsubstituted alkenyl group having 2 to 20 carbon atoms, a substituted or unsubstituted arylamine group, a substituted or unsubstituted aryl group having 6 to 40 carbon atoms for forming a ring, a substituted or unsubstituted heteroaryl group having 3 to 40 carbon atoms for forming a ring, or a substituted or unsubstituted condensed polycyclic group having 6 to 60 carbon atoms for forming a ring,
m and n are each independently an integer of 0 to 4, and
$Ar_1$ is the same as defined in Formula 1.
11. The organic electroluminescence device of claim 8, wherein the hole transport region comprises an amine compound represented by the following Formula 6:

[Formula 6]

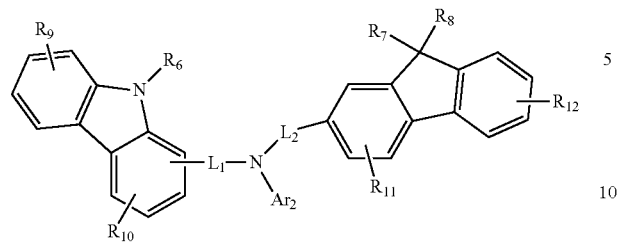

where Ar₂ is a substituted or unsubstituted aryl group having 6 to 30 carbon atoms for forming a ring,
R₆ to R₈ are each independently a hydrogen atom, a deuterium atom, a halogen atom, a substituted or unsubstituted alkyl group having 1 to 30 carbon atoms, a substituted or unsubstituted aryl group having 6 to 30 carbon atoms for forming a ring, a substituted or unsubstituted heteroaryl group having 4 to 30 carbon atoms for forming a ring, a substituted or unsubstituted condensed polycyclic group having 6 to 30 carbon atoms for forming a ring, or may combine with an adjacent group to form a ring,
R₉ to R₁₂ are each independently a hydrogen atom, a deuterium atom, a halogen atom, a hydroxyl group, a substituted or unsubstituted alkyl group having 1 to 30 carbon atoms, a substituted or unsubstituted aryl group having 6 to 30 carbon atoms for forming a ring, or a substituted or unsubstituted heteroaryl group having 4 to 30 carbon atoms for forming a ring, and
L₁ and L₂ are each independently a direct linkage, a substituted or unsubstituted alkylene group having 2 to 30 carbon atoms, a substituted or unsubstituted arylene group having 6 to 30 carbon atoms for forming a ring, or a substituted or unsubstituted heteroarylene group having 4 to 30 carbon atoms for forming a ring.

12. The organic electroluminescence device of claim 8, wherein the electron transport region comprises at least one of compounds represented in the following Compound Group 5:

[Compound Group 5]

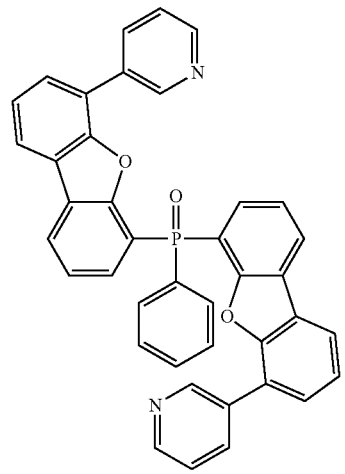

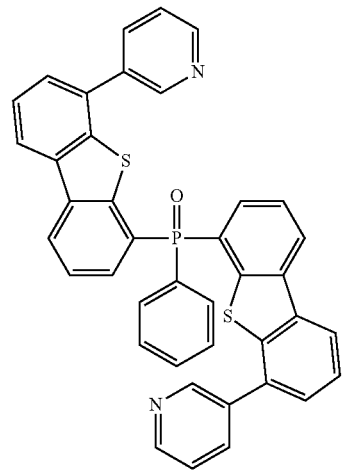

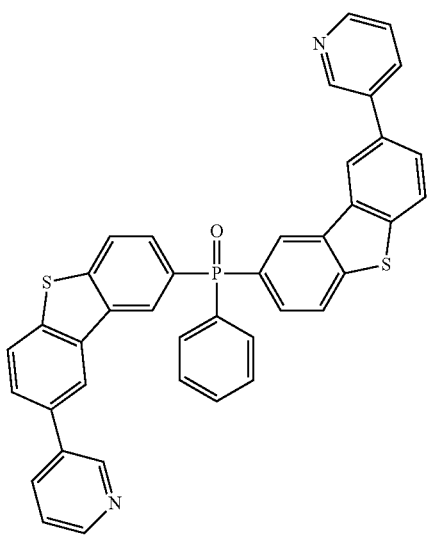

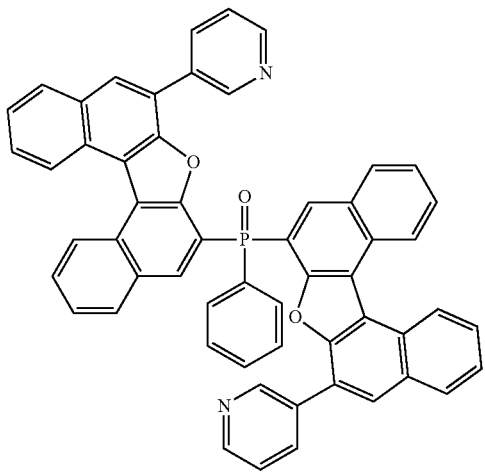

* * * * *